United States Patent
Sung et al.

(10) Patent No.: US 12,317,514 B2
(45) Date of Patent: May 27, 2025

(54) RESISTIVE RANDOM-ACCESS MEMORY STRUCTURES WITH STACKED TRANSISTORS

(71) Applicant: International Business Machines Corporation, Armonk, NY (US)

(72) Inventors: Min Gyu Sung, Latham, NY (US); Kangguo Cheng, Schenectady, NY (US); Julien Frougier, Albany, NY (US); Ruilong Xie, Niskayuna, NY (US); Chanro Park, Clifton Park, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 17/967,114

(22) Filed: Oct. 17, 2022

(65) Prior Publication Data

US 2024/0130142 A1    Apr. 18, 2024

(51) Int. Cl.
  *H10B 63/00*    (2023.01)
(52) U.S. Cl.
  CPC .............. *H10B 63/30* (2023.02); *H10B 63/80* (2023.02)

(58) Field of Classification Search
  None
  See application file for complete search history.

(56) References Cited

U.S. PATENT DOCUMENTS

| | | |
|---|---|---|
| 9,178,000 B1 | 11/2015 | Nardi et al. |
| 9,659,963 B2 | 5/2017 | Cheng et al. |
| 9,837,414 B1 | 12/2017 | Balakrishnan et al. |
| 10,192,867 B1 | 1/2019 | Frougier et al. |
| 10,269,869 B1 | 4/2019 | Ando et al. |
| 10,374,039 B1 | 8/2019 | Hashemi et al. |
| 10,522,594 B2 | 12/2019 | Xu et al. |
| 11,264,285 B2 | 3/2022 | Gardner et al. |
| 12,119,264 B2 * | 10/2024 | Mochizuki ............. H10D 84/83 |
| 2022/0181388 A1 | 6/2022 | Reznicek et al. |
| 2022/0199629 A1 | 6/2022 | Chhabra et al. |
| 2024/0130142 A1* | 4/2024 | Sung ..................... H10B 63/80 |

* cited by examiner

*Primary Examiner* — Jack S Chen
(74) *Attorney, Agent, or Firm* — Matt Zehrer; Ryan, Mason & Lewis, LLP

(57) ABSTRACT

A semiconductor structure comprises a first transistor, a second transistor vertically stacked over the first transistor, a source/drain region shared between the first transistor and the second transistor, and a resistive random-access memory device connected to the shared source/drain region.

20 Claims, 54 Drawing Sheets

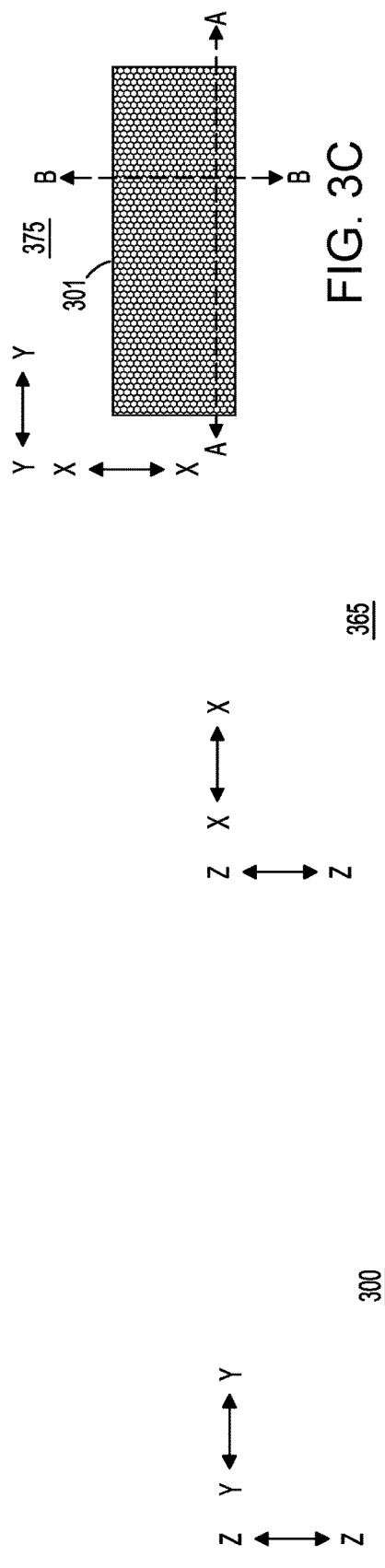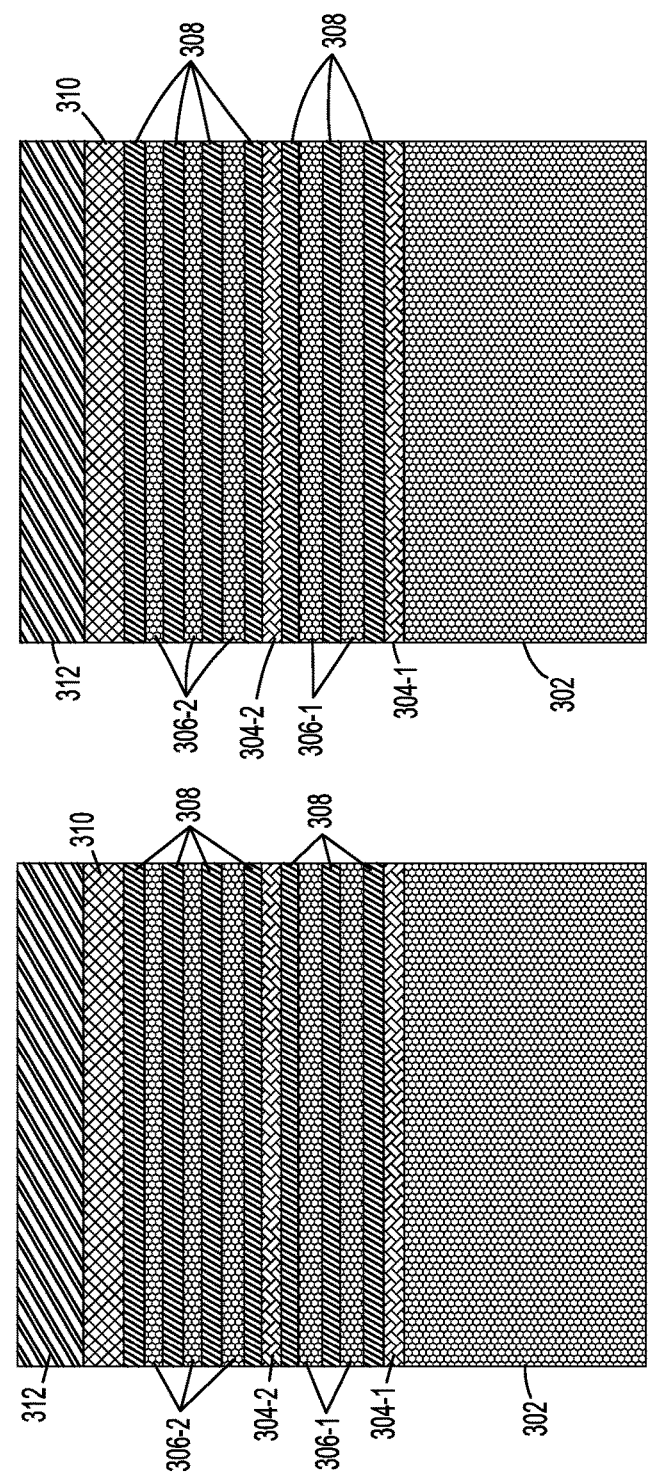

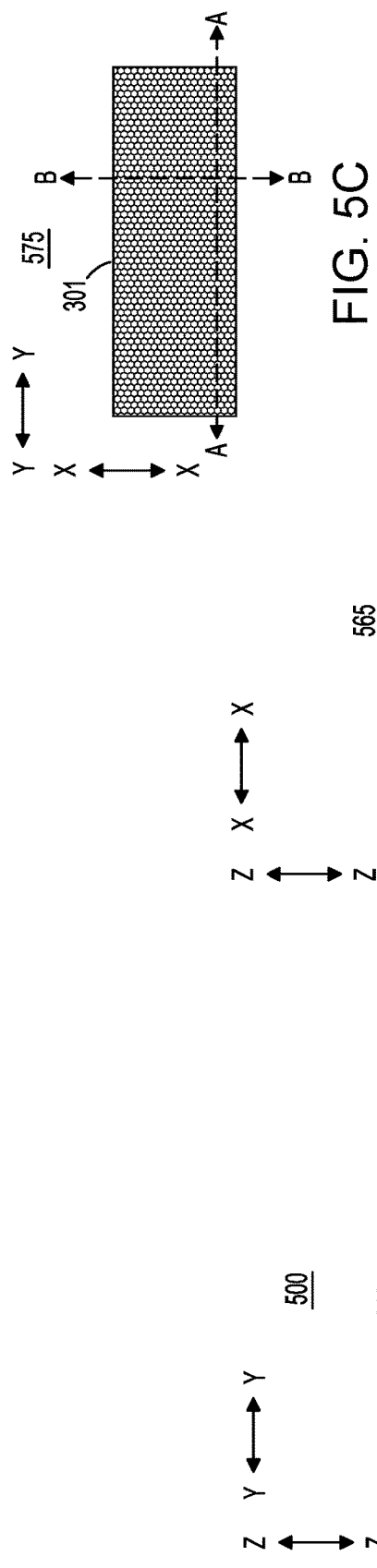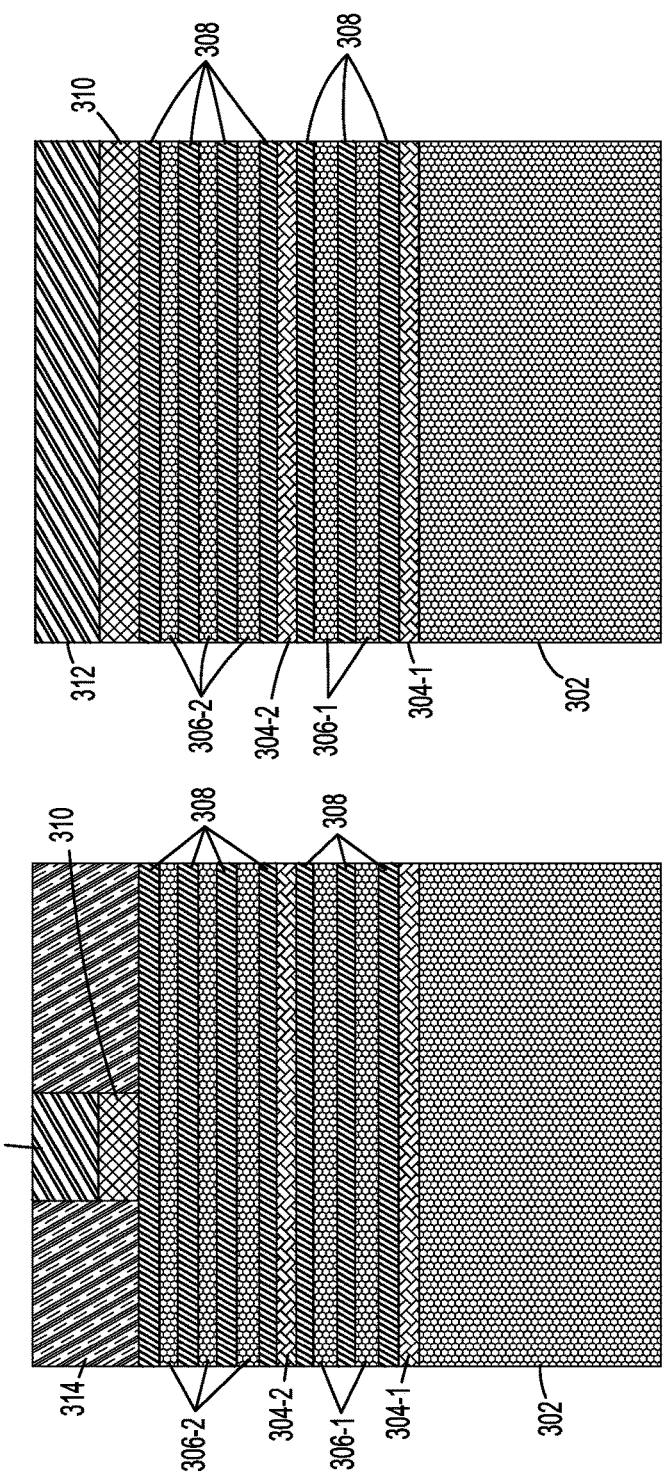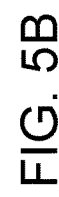

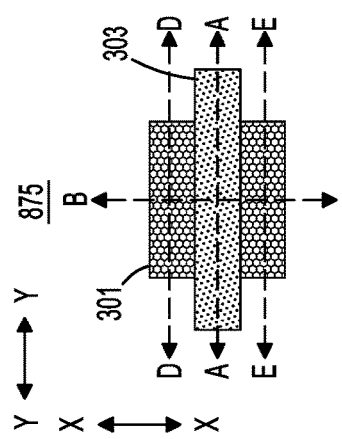
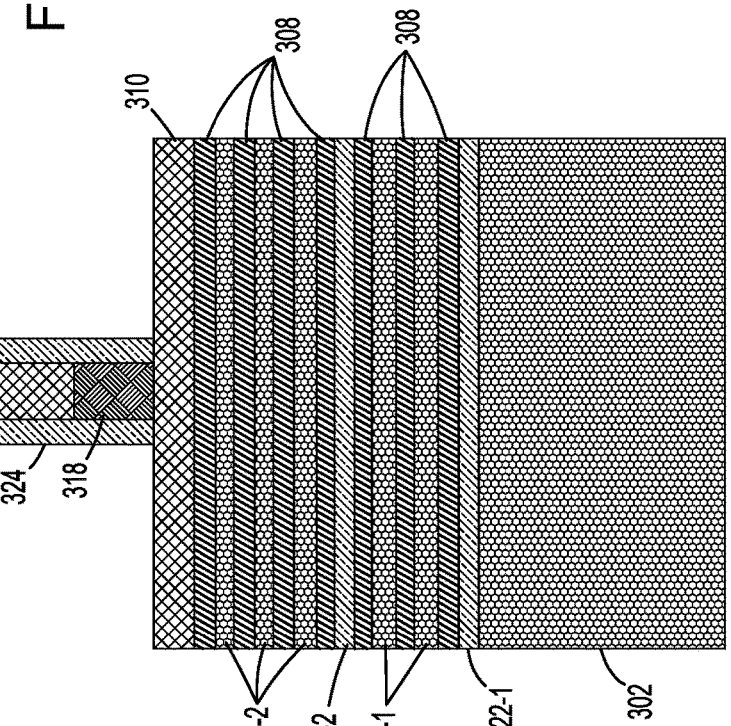
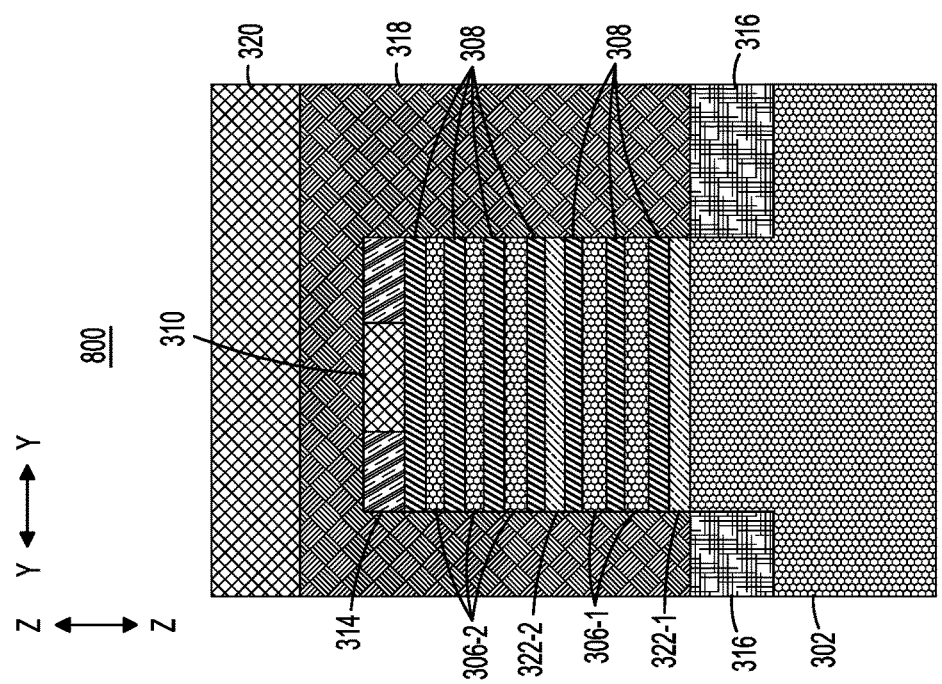
FIG. 8C
FIG. 8B
FIG. 8A

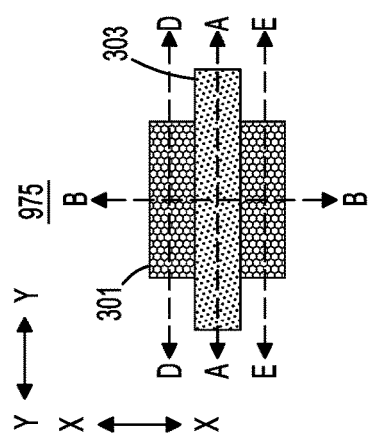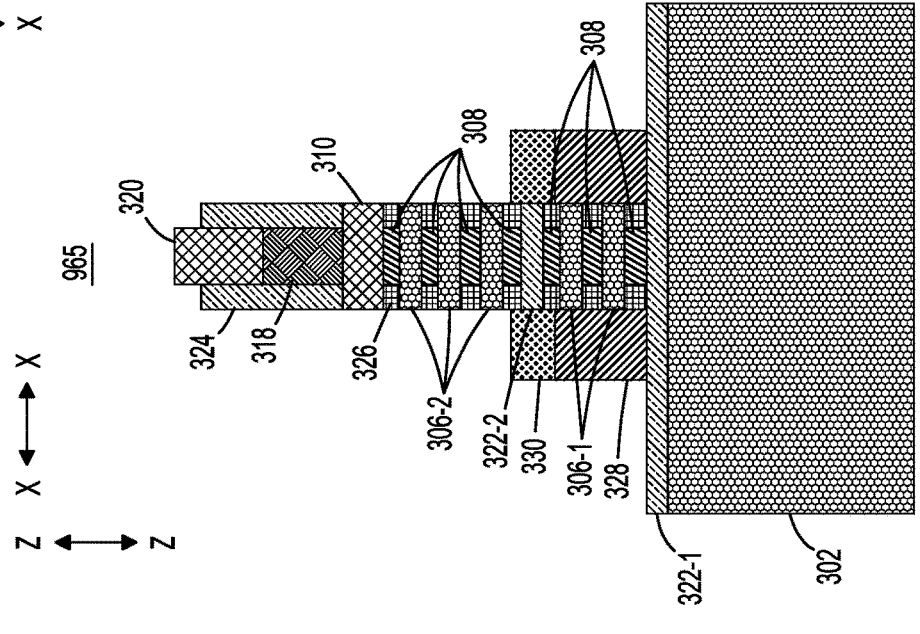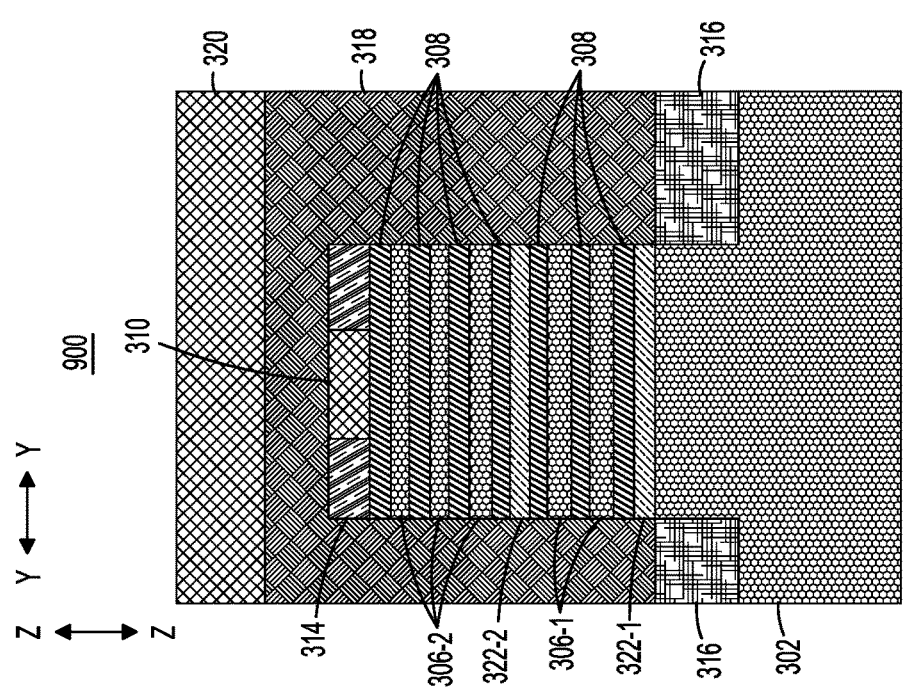

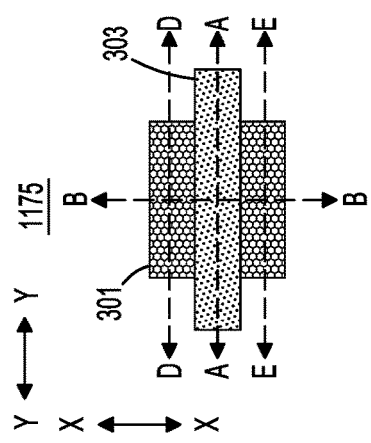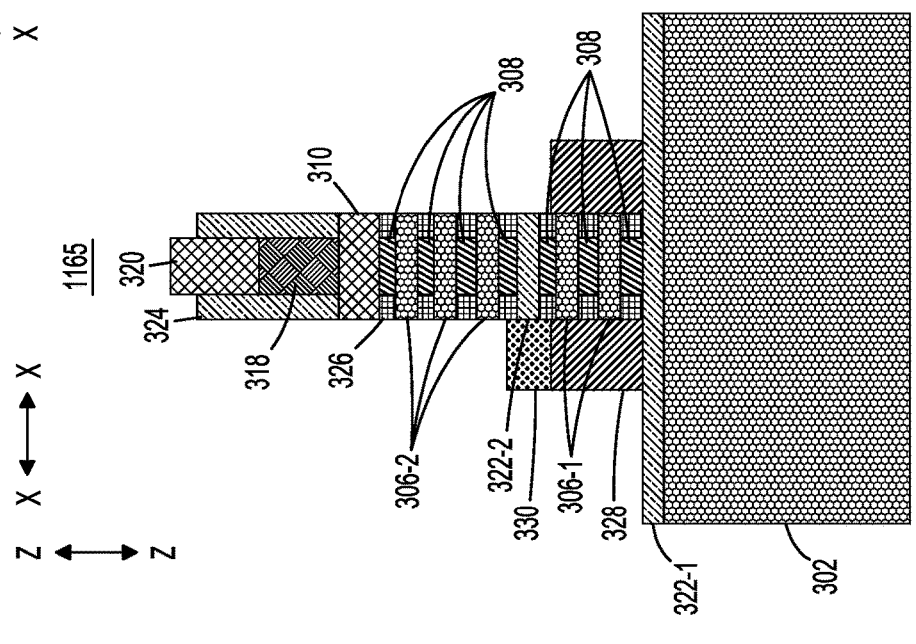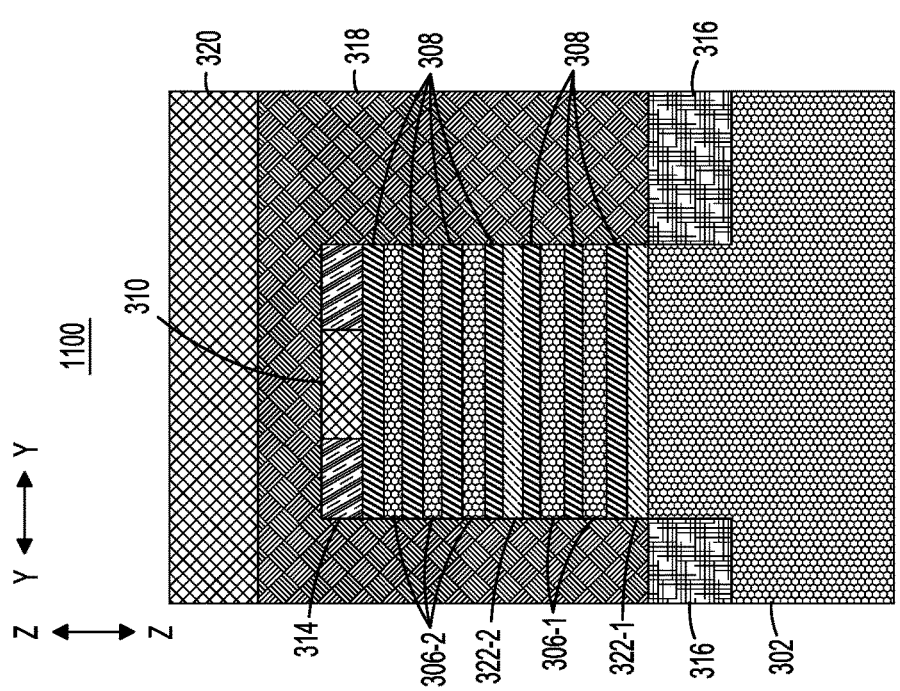
FIG. 11C
FIG. 11B
FIG. 11A

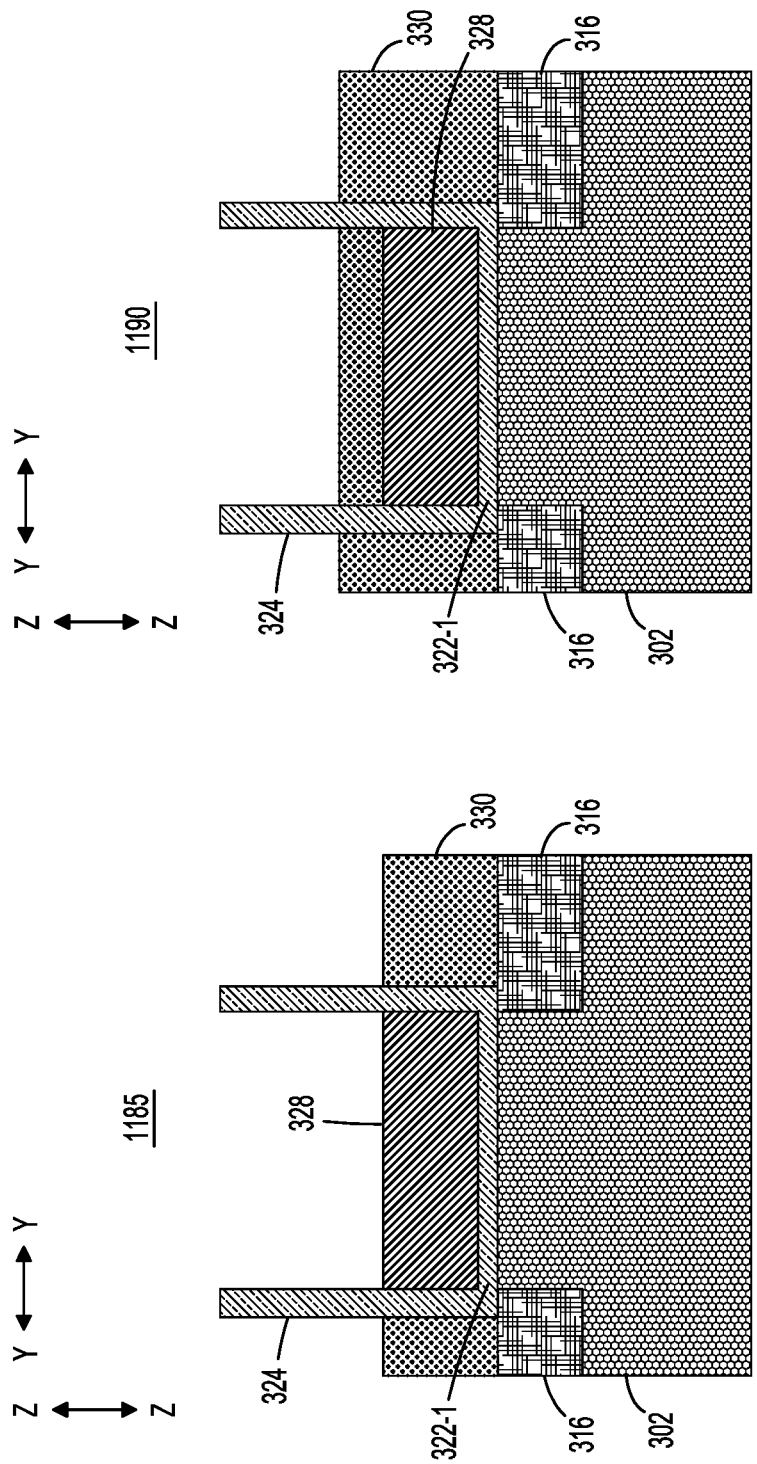

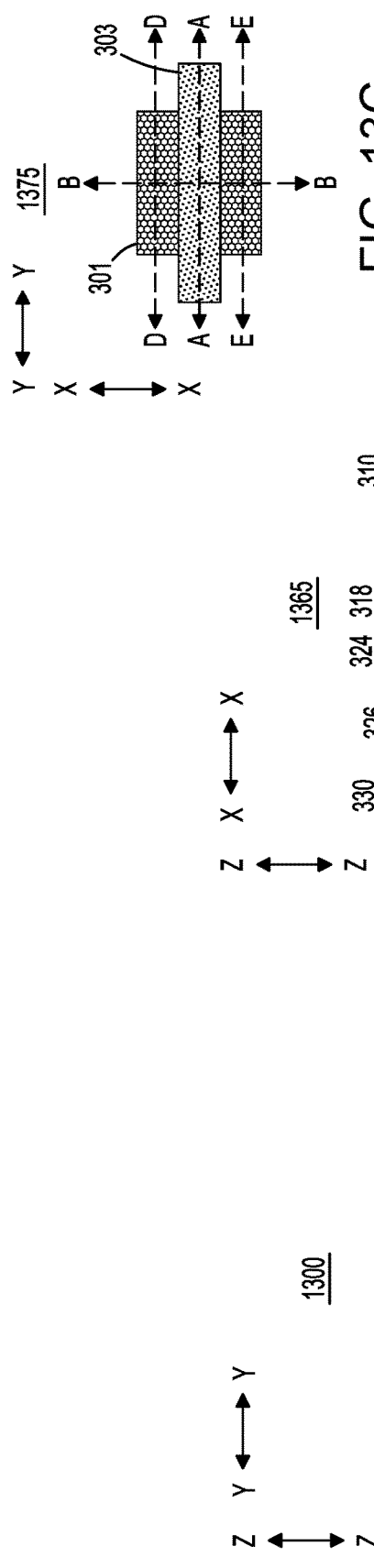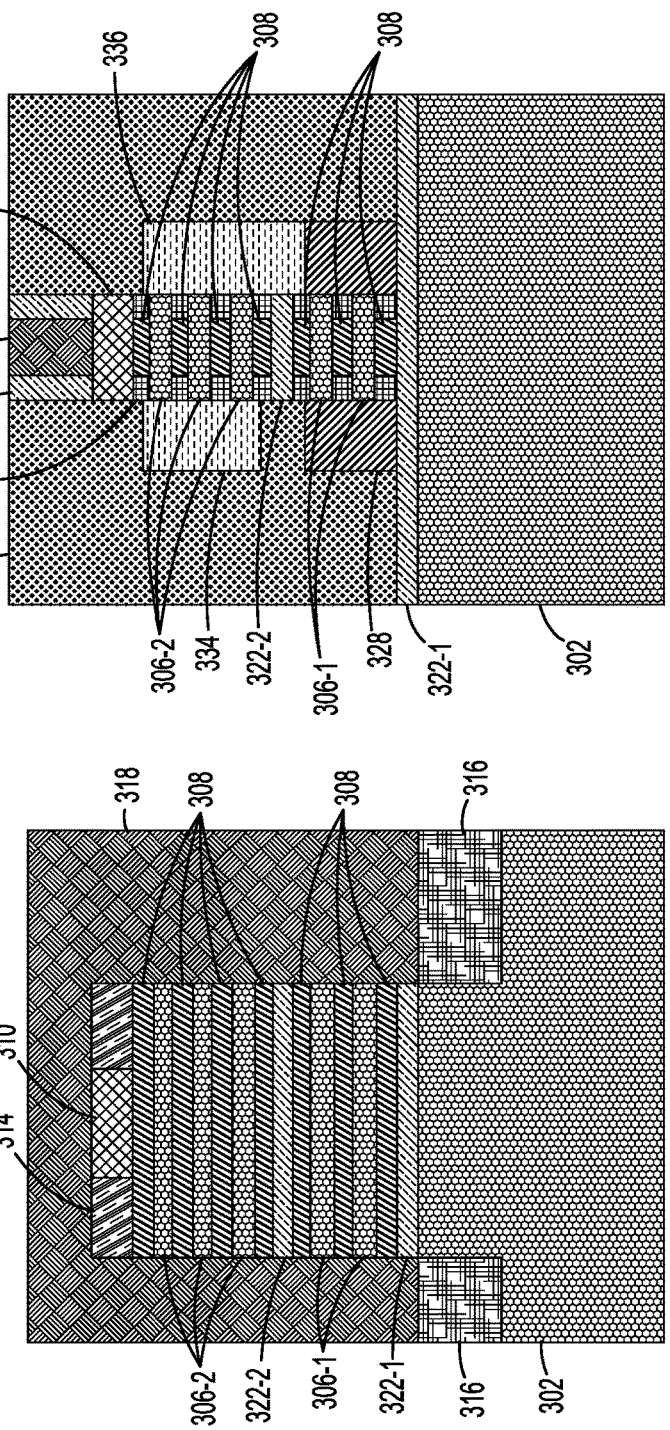
FIG. 13C
FIG. 13B
FIG. 13A

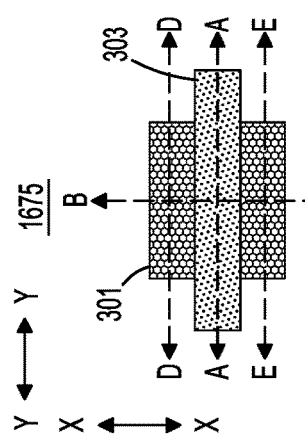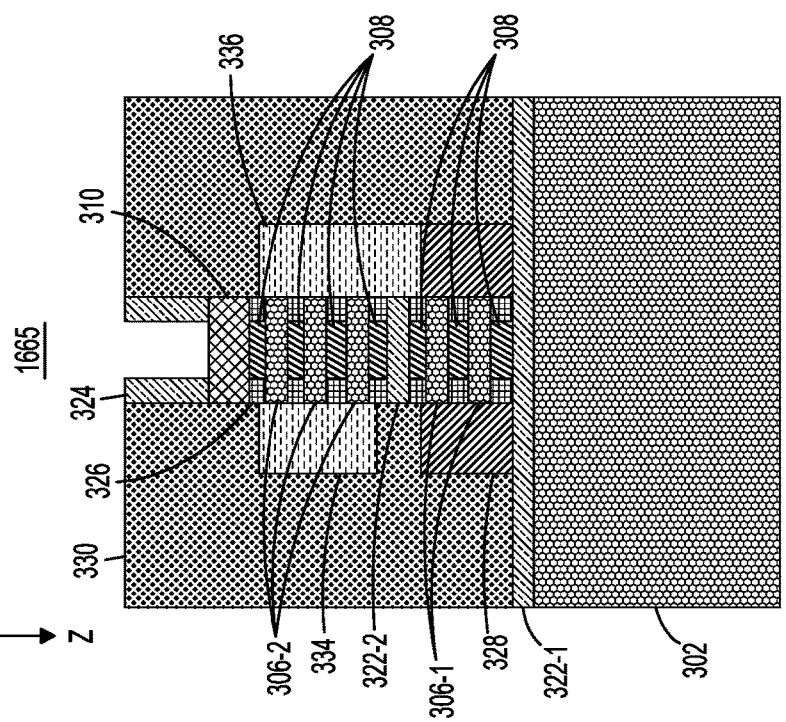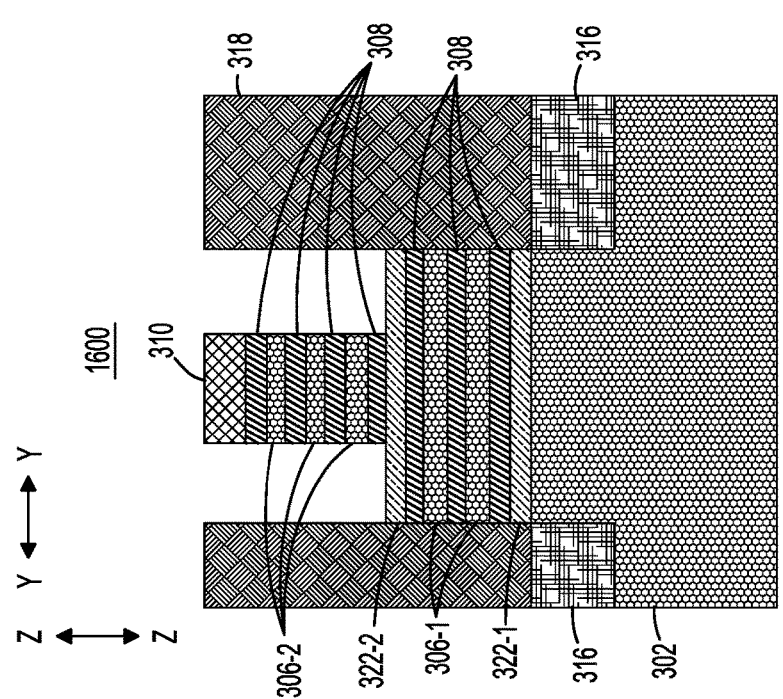

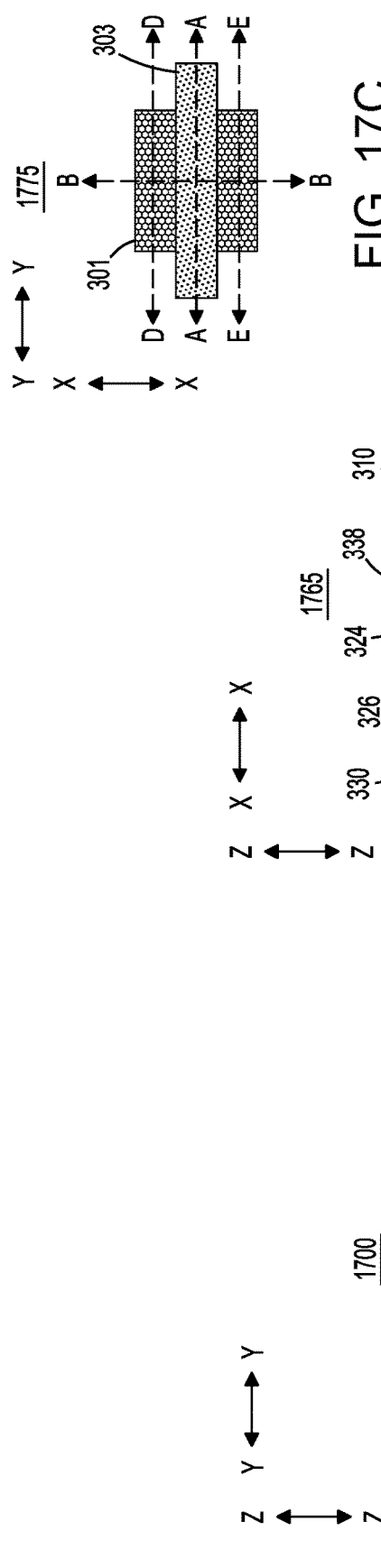
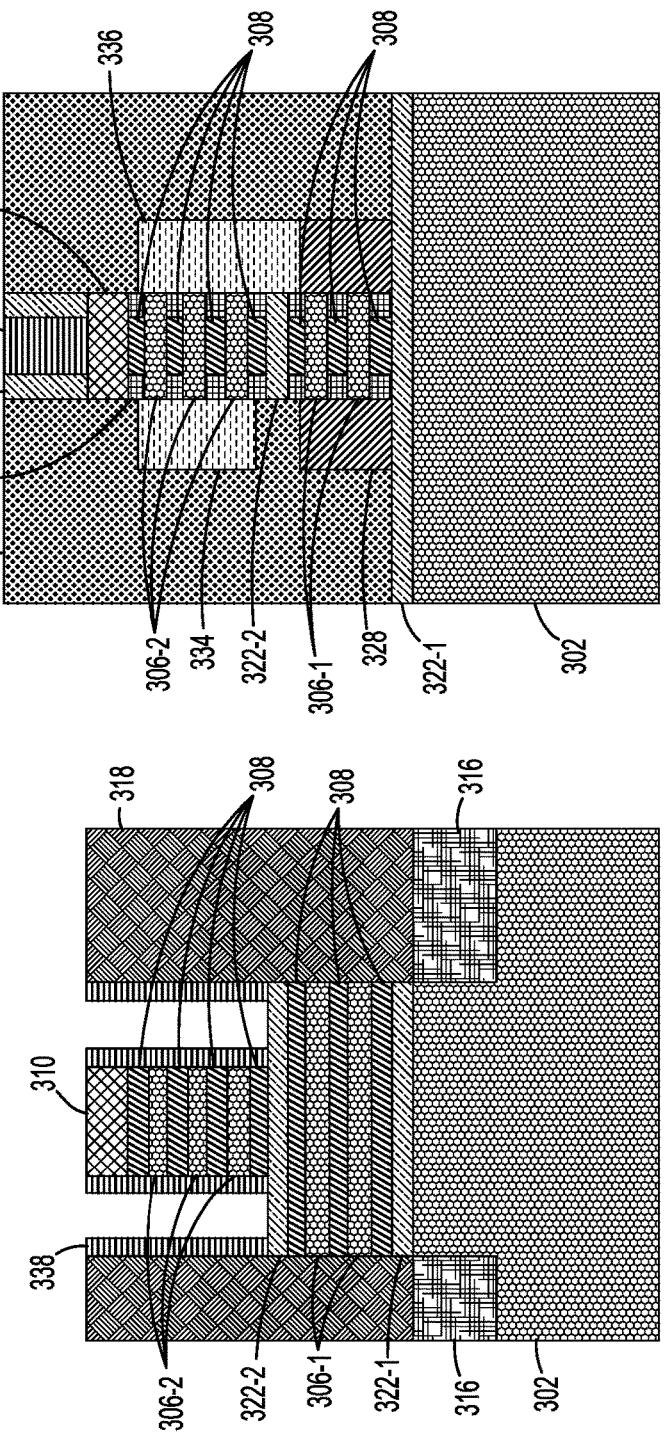
FIG. 17C
FIG. 17B
FIG. 17A

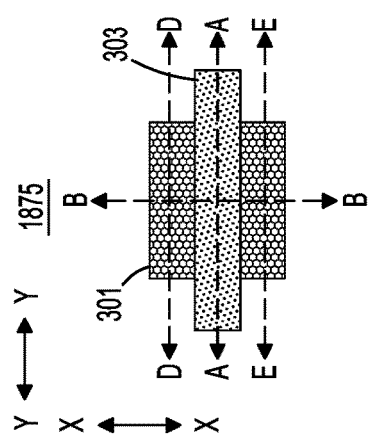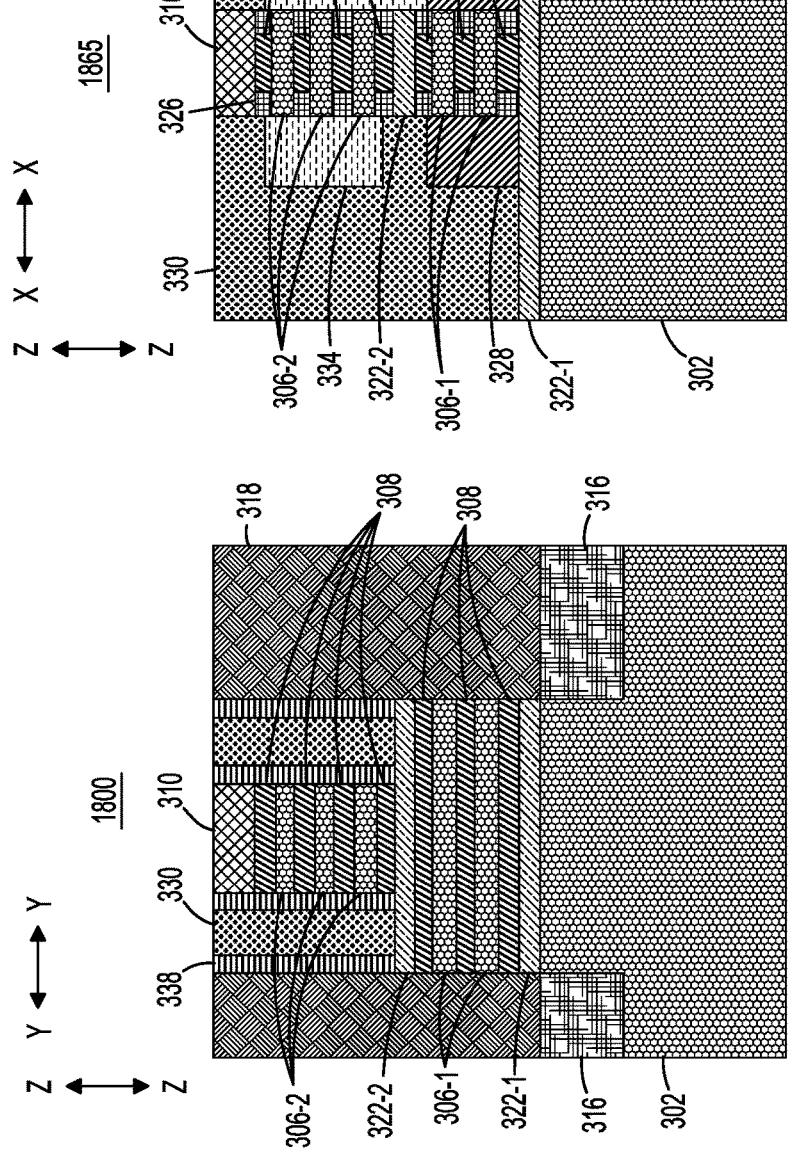
FIG. 18C
FIG. 18B
FIG. 18A

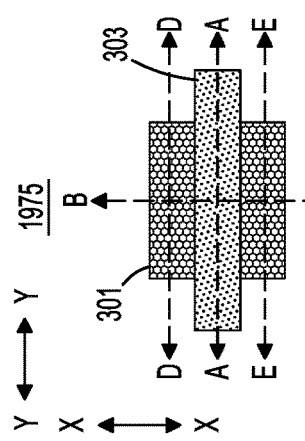
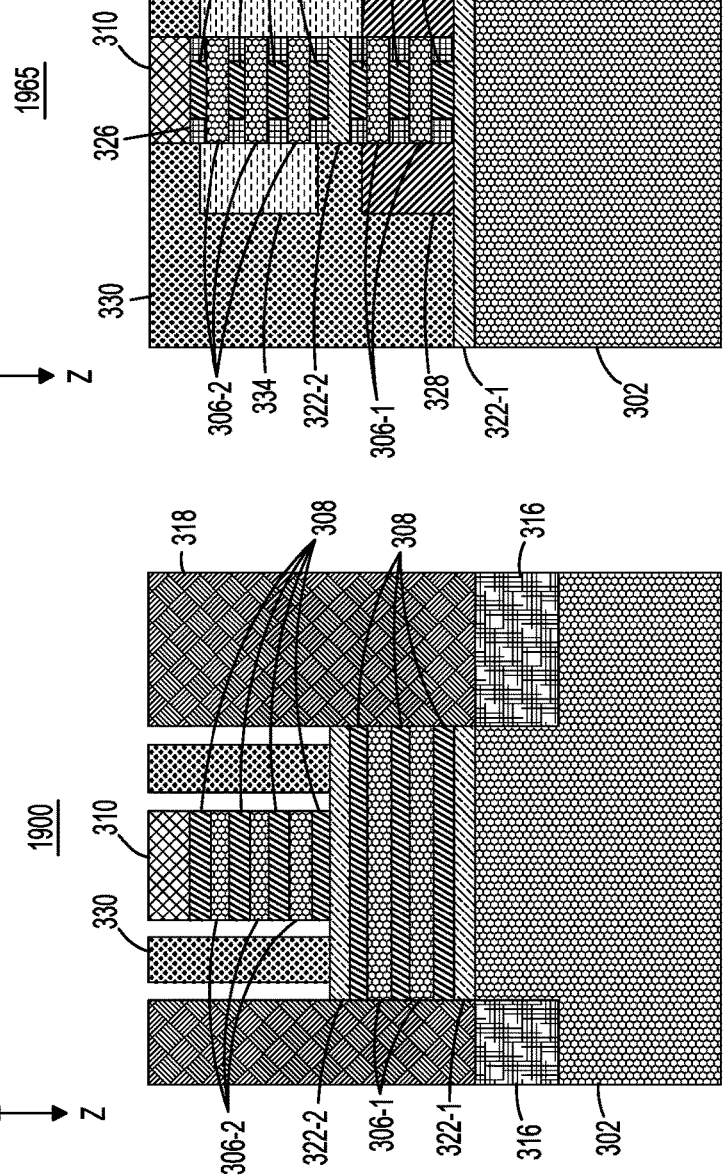
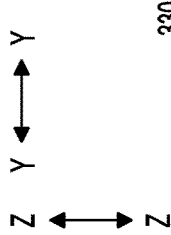
FIG. 19C
FIG. 19B
FIG. 19A

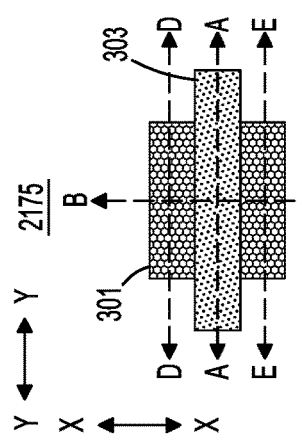
FIG. 21C
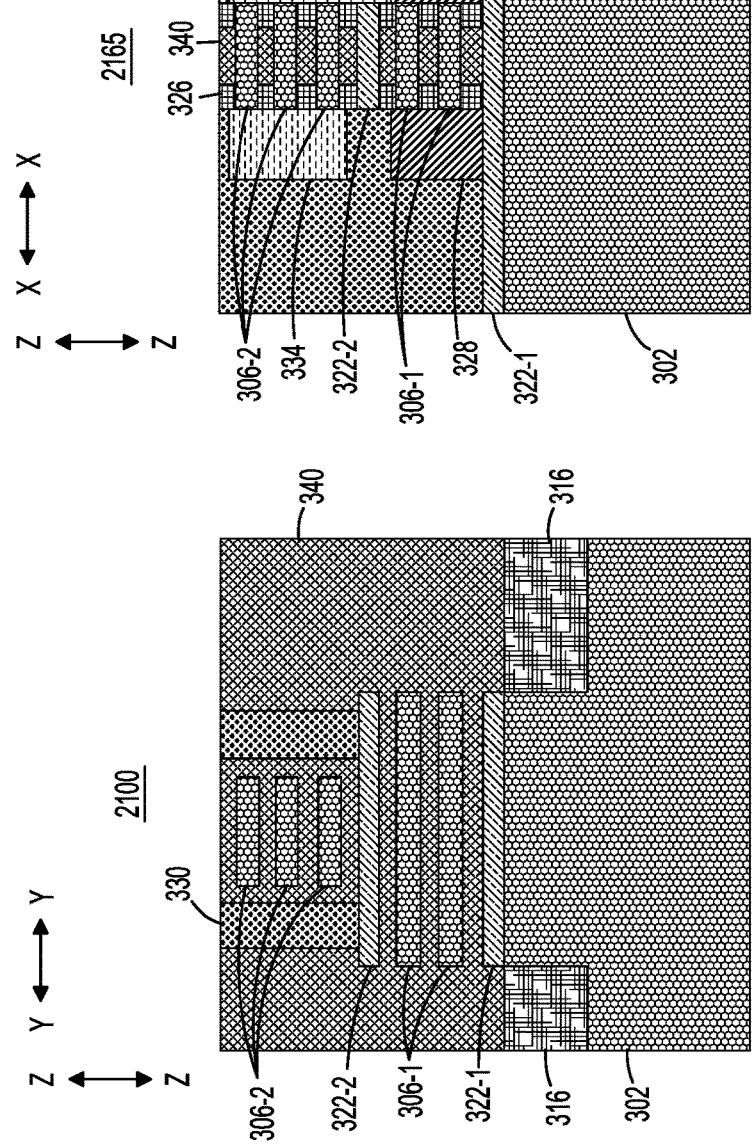
FIG. 21B
FIG. 21A

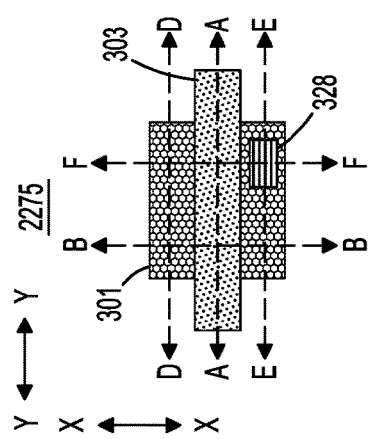
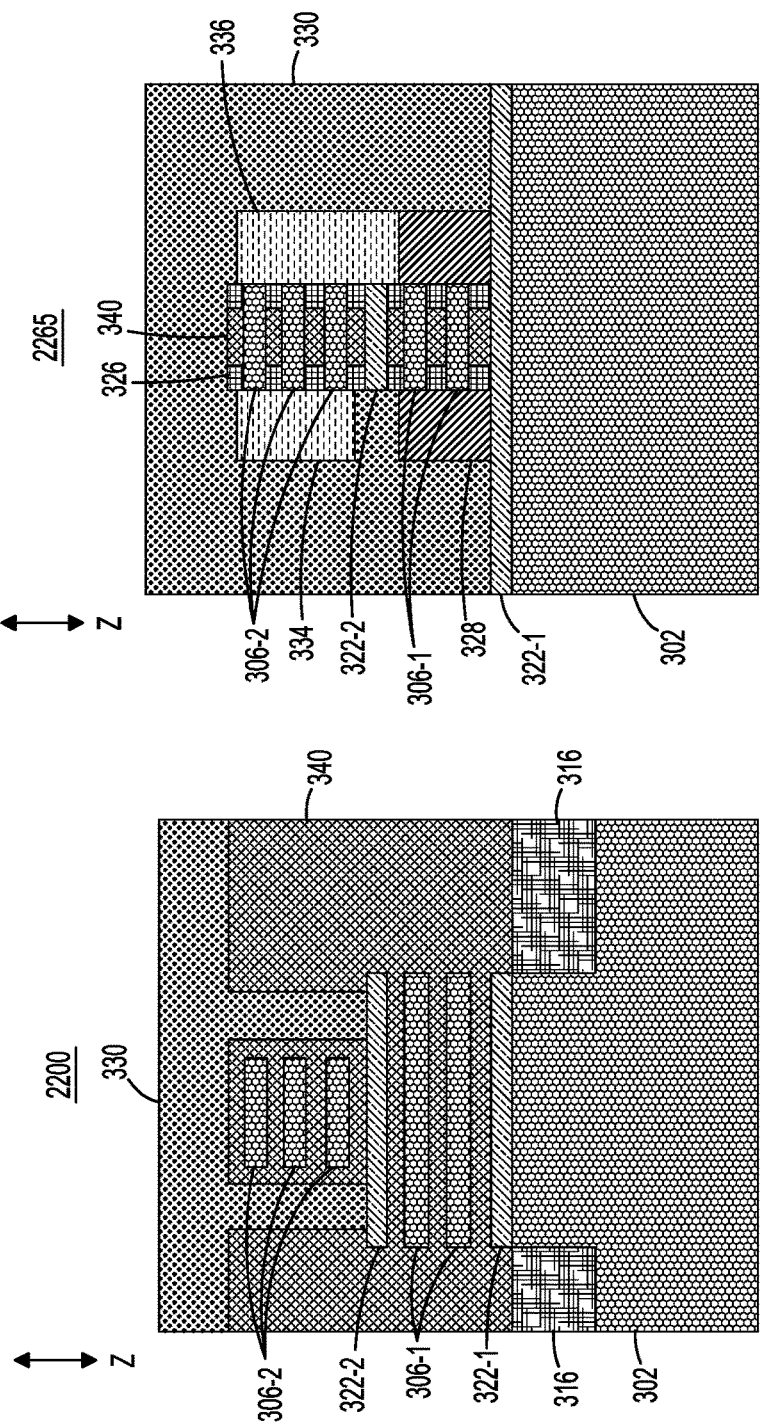
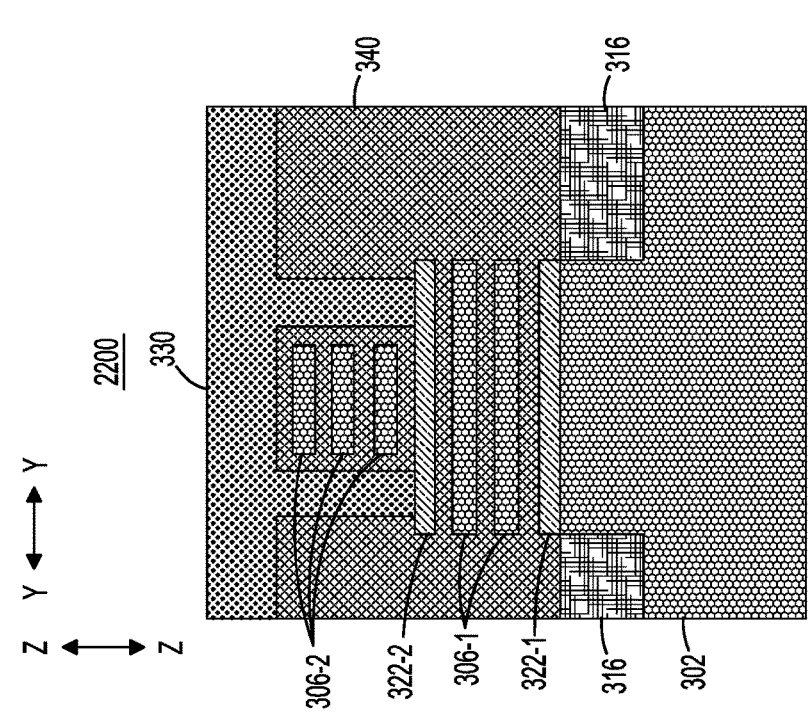
FIG. 22C
FIG. 22B
FIG. 22A

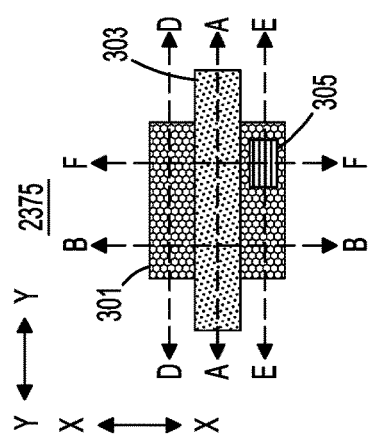
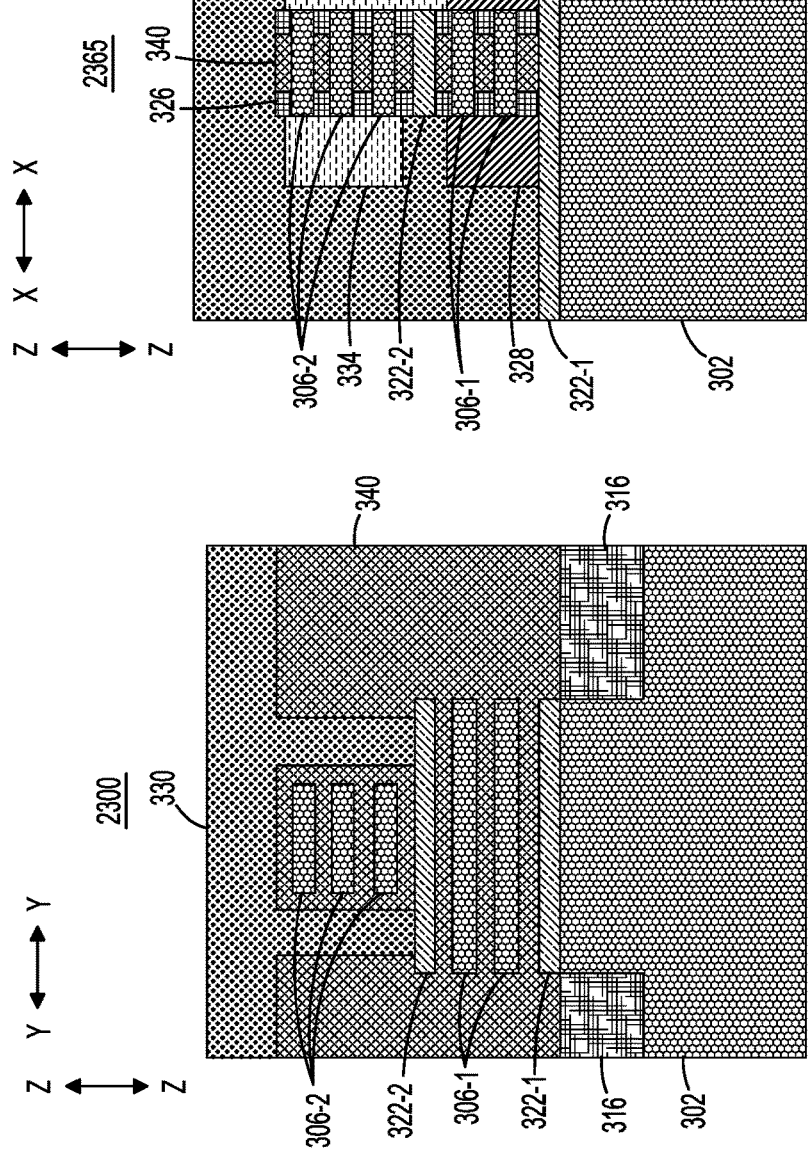
FIG. 23C
FIG. 23B
FIG. 23A

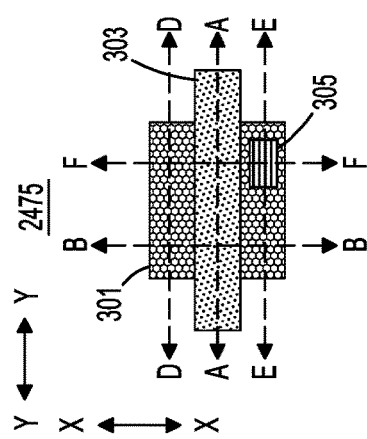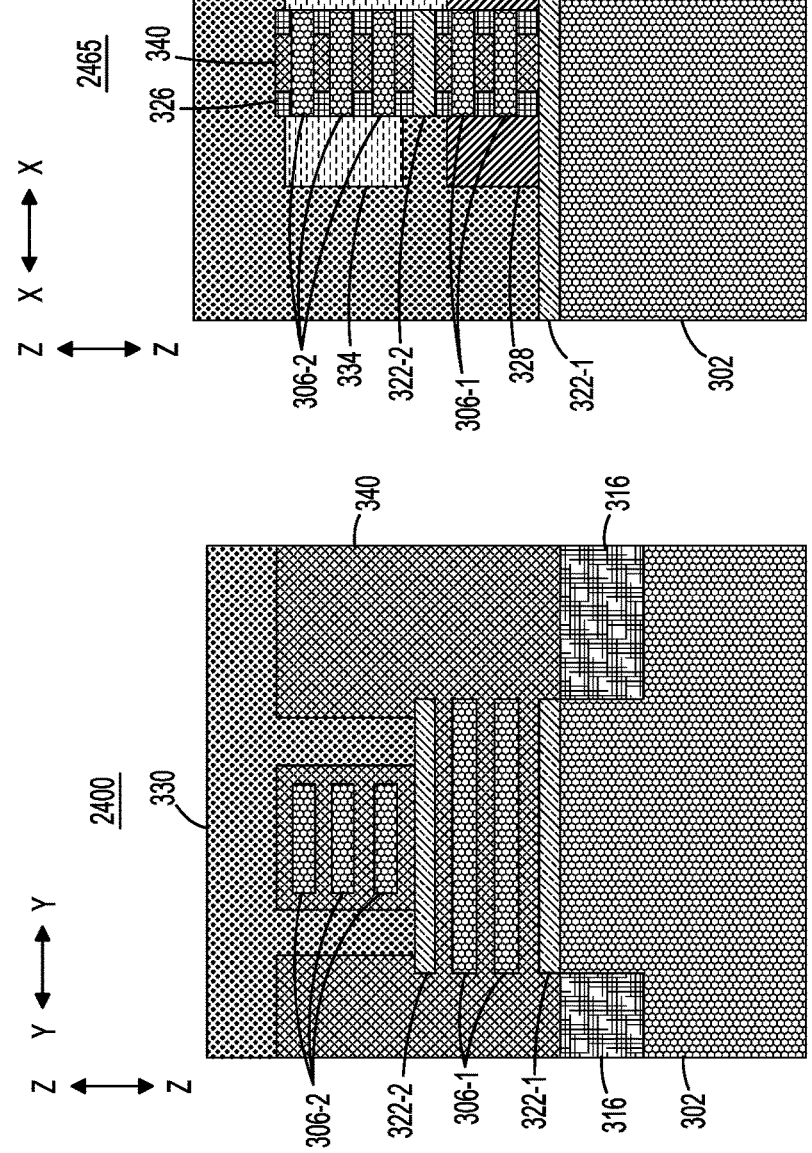

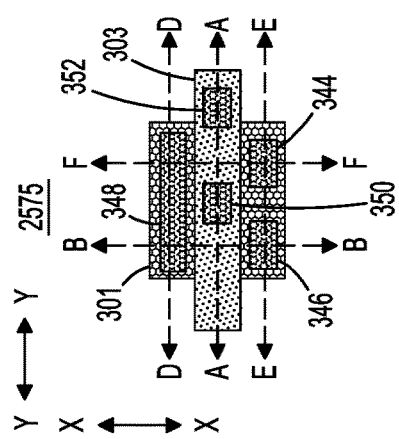
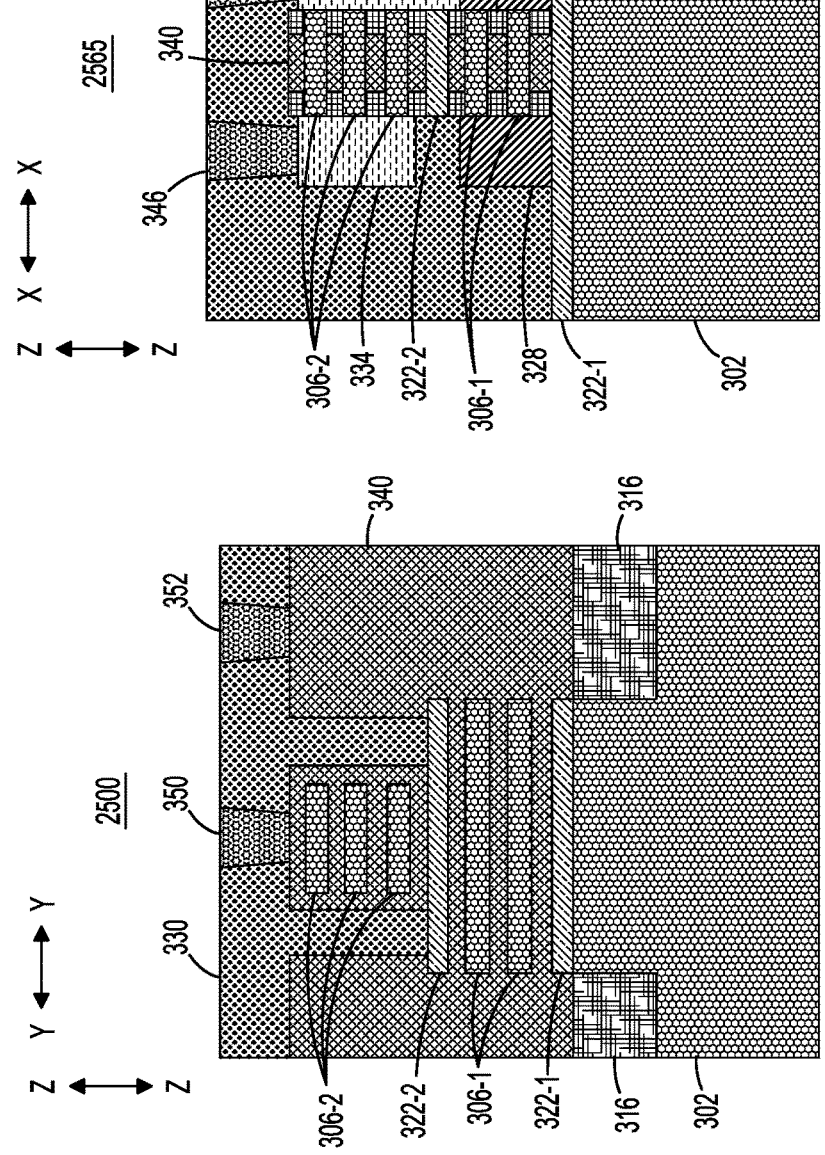
FIG. 25C
FIG. 25B
FIG. 25A

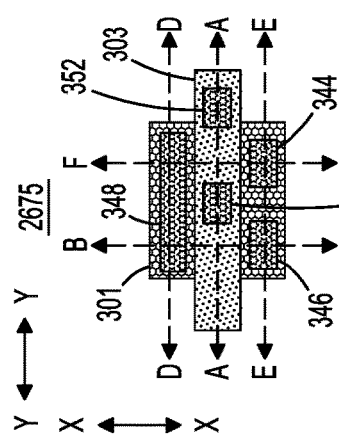
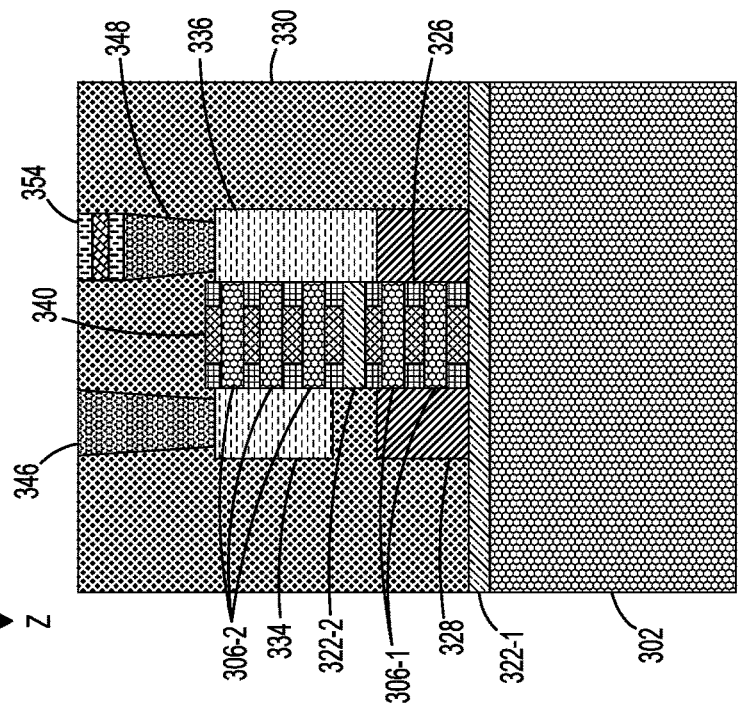
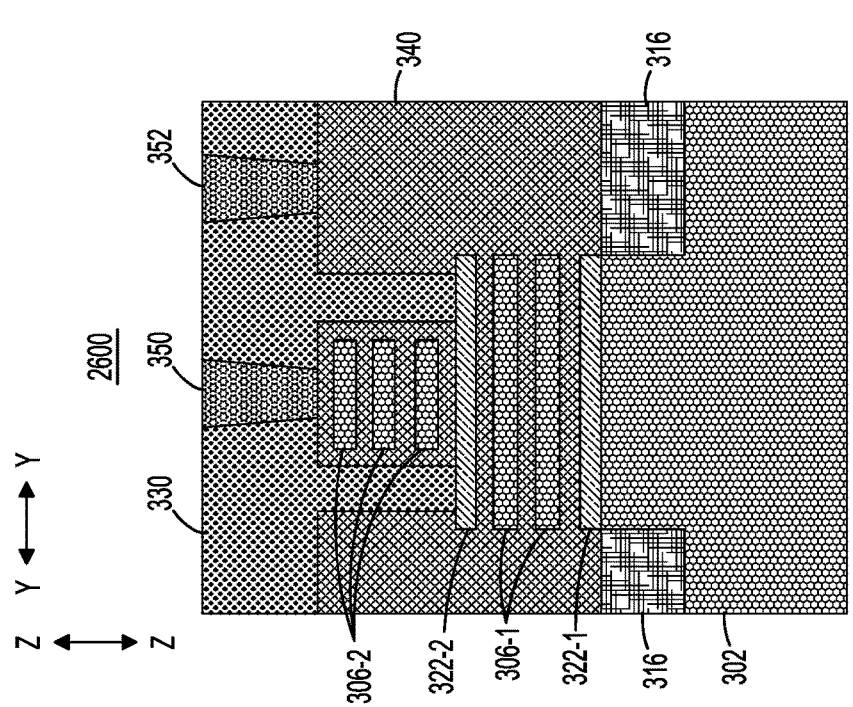
FIG. 26C
FIG. 26B
FIG. 26A

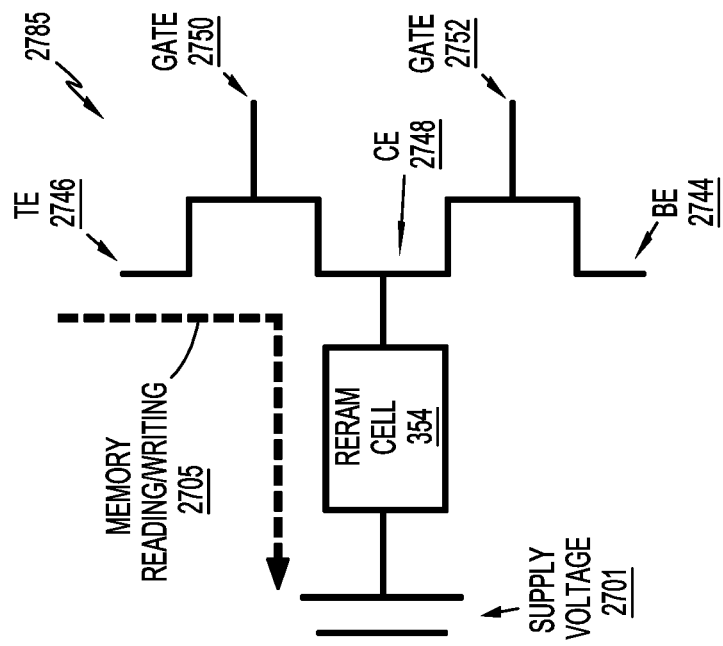
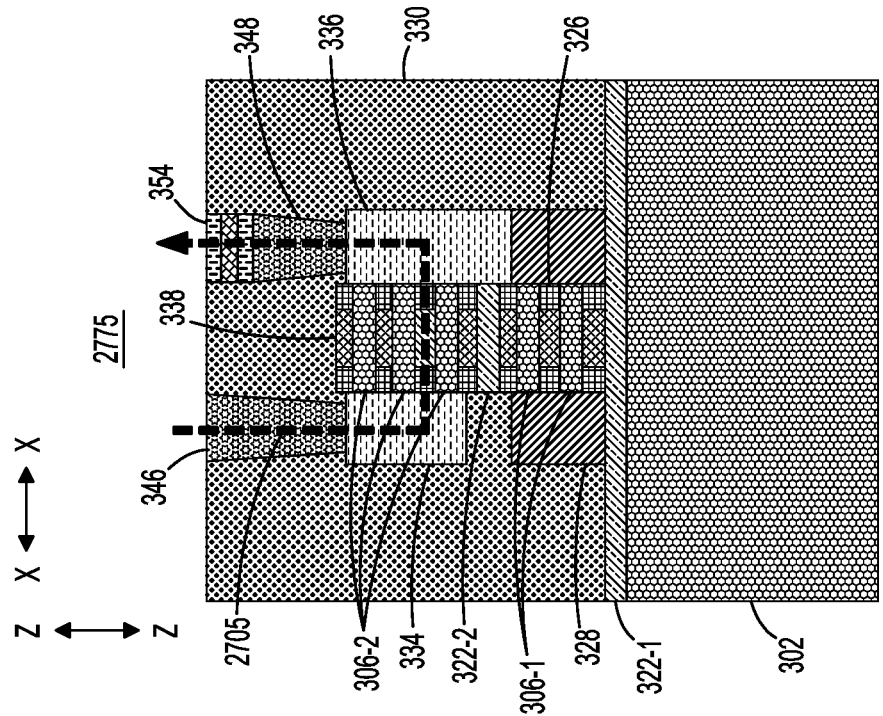
FIG. 27D
FIG. 27C

RESISTIVE RANDOM-ACCESS MEMORY STRUCTURES WITH STACKED TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. As memory density increases, the need for new memory technology other than dynamic random-access memory (DRAM) is needed. DRAM technology scaling is facing a wall due to various problems such as retention time. Emerging memory devices store data as resistance values. For example, phase change memory (PCM), magnetic random-access memory (MRAM), spin-torque-transfer magnetic random-access memory (STT-MRAM), and resistive random-access memory (ReRAM or RRAM) use variations of resistance values to store data.

SUMMARY

Embodiments of the invention provide techniques for forming resistive random-access memory structures with stacked transistors.

In one embodiment, a semiconductor structure comprises a first transistor, a second transistor vertically stacked over the first transistor, a source/drain region shared between the first transistor and the second transistor, and a resistive random-access memory device connected to the shared source/drain region.

In another embodiment, a memory device comprises an array of resistive random-access memory devices. At least one of the resistive random-access memory devices is disposed over a shared source/drain region of a stacked transistor structure comprising a first transistor and a second transistor vertically stacked over the first transistor. The first and second transistors have different threshold voltages.

In another embodiment, an integrated circuit comprises a resistive random-access memory structure comprising a first transistor, a second transistor vertically stacked over the first transistor, and a resistive random-access memory device connected to a shared source/drain region of the first and second transistors.

These and other features and advantages of embodiments described herein will become more apparent from the accompanying drawings and the following detailed description.

BRIEF DESCRIPTION OF THE DRAWINGS

FIGS. 3A-3C show views of a structure following formation of a nanosheet stack and a first hard mask over a substrate, according to an embodiment of the invention.

FIGS. 5A-5C show views of the structure of FIGS. 4A-4C following formation of a second hard mask, according to an embodiment of the invention.

FIGS. 8A-8E show views of the structure of FIG. 7A-7C following dummy gate patterning and formation of isolation layers, according to an embodiment of the invention.

FIGS. 9A-9E show views of the structure of FIG. 8A-8E following recess of the nanosheet stack and formation of inner spacers, a bottom epitaxial layer and an interlayer dielectric, according to an embodiment of the invention.

FIGS. 11A-11E show views of the structure of FIG. 10A-10E following removal of the organic planarization layer, according to an embodiment of the invention.

FIGS. 13A-13E show views of the structure of FIG. 12A-12E following deposition and planarization of interlayer dielectric material, according to an embodiment of the invention.

FIGS. 16A-16E show views of the structure of FIG. 15A-15E following a cut of top channel portions of the nanosheet stack, according to an embodiment of the invention.

FIGS. 17A-17E show views of the structure of FIG. 16A-16E following deposition and etch back of a liner, according to an embodiment of the invention.

FIGS. 18A-18E show views of the structure of FIG. 17A-17E following fill and planarization of an interlayer dielectric material, according to an embodiment of the invention.

FIGS. 19A-19E show views of the structure of FIG. 18A-18E following etch back of the liner, according to an embodiment of the invention.

FIGS. 21A-21E show views of the structure of FIG. 20A-20E following formation of a gate stack, according to an embodiment of the invention.

FIGS. 22A-22F show views of the structure of FIG. 21A-21E following patterning of an opening for a contact to the bottom epitaxial layer, according to an embodiment of the invention.

FIGS. 23A-23F show views of the structure of FIG. 22A-22F following a lateral recess of the opening for the contact to the bottom epitaxial layer, according to an embodiment of the invention.

FIGS. 24A-24F show views of the structure of FIG. 23A-23F following formation of a dielectric isolation layer in the lateral recess region and further etching of the opening for the contact to the bottom epitaxial layer, according to an embodiment of the invention.

FIGS. 25A-25F show views of the structure of FIG. 24A-24F following formation of top epitaxial, bottom epitaxial, common epitaxial and gate contacts, according to an embodiment of the invention.

FIGS. 26A-26F show views of the structure of FIG. 25A-25F following formation of a resistive random-access memory cell over the contact to the common epitaxial layer, according to an embodiment of the invention.

FIG. 27C shows a side cross-sectional view of the structure of FIGS. 26A-26F illustrating a memory read/write operation for the resistive random-access memory cell, according to an embodiment of the invention.

FIG. 27D shows a circuit diagram of the memory read/write operation for the resistive random-access memory cell, according to an embodiment of the invention.

DETAILED DESCRIPTION

Figure 1B:
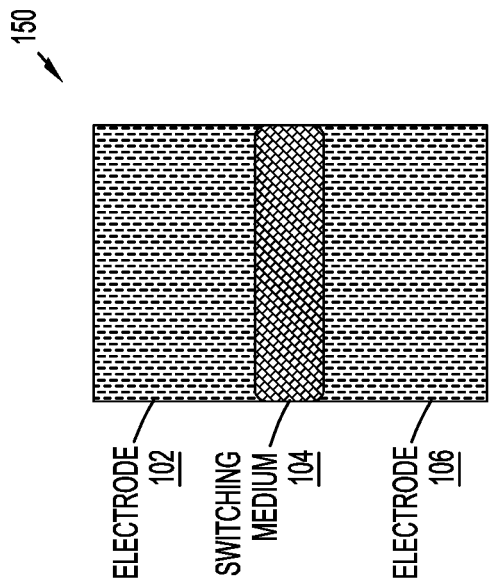
FIG. 1B shows a resistive random-access memory structure, according to an embodiment of the invention.

Illustrative embodiments of the invention may be described herein in the context of illustrative methods for forming resistive random-access memory structures with stacked transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

Resistive random-access memory (ReRAM or RRAM) is a type of non-volatile (NV) random-access memory (RAM), which works by changing the resistance across a dielectric solid-state material. On-chip NV memory such as ReRAM is becoming important for a variety of applications, such as system-on-chip (SoC) applications. Illustrative embodiments provide techniques which enable scaled ReRAM formation on a stacked transistor structure (e.g., a stacked nanosheet transistor structure).

Figure 1A:
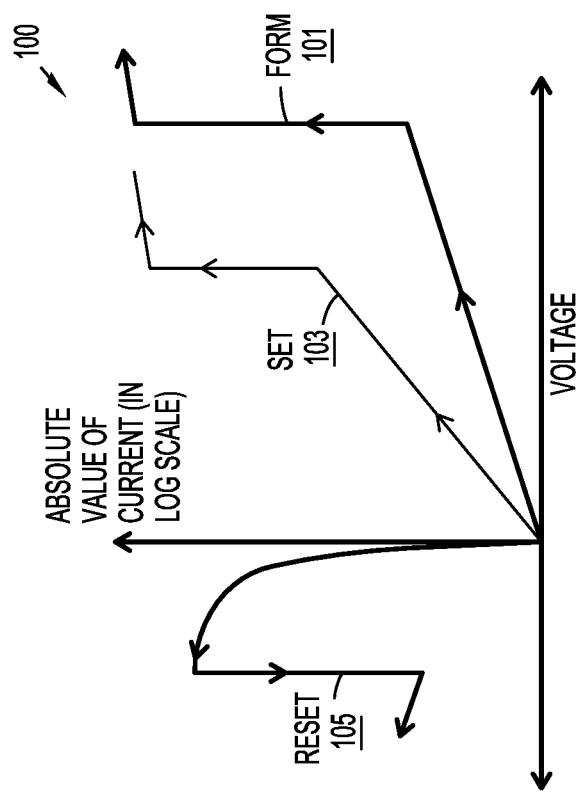
FIG. 1A shows a plot of operation of a resistive random-access memory structure, according to an embodiment of the invention.

ReRAM operation requires a forming event that creates a conductive filament across a top and bottom electrode of a ReRAM cell. This is illustrated in FIGS. 1A and 1B. FIG. 1A shows a plot 100 of operation of a ReRAM structure 150 shown in FIG. 1B. The ReRAM structure 150 includes two electrodes 102 and 106 which are separated by a switching medium 104. The electrode 102 may be referred to as a top electrode, and the electrode 106 may be referred to as a bottom electrode. The plot 100 shows an absolute value of current, in a log scale, as a function of voltage for different operations of the ReRAM structure 150. Such operations include a form operation 101, a set operation 103, and a reset operation 105. As illustrated in the plot 100, the form operation 101 requires a higher voltage then subsequent ReRAM functions including the set operation 103 and the reset operation 105. A first transistor may be used for the form operation 101, while a second separate transistor may be used for the set operation 103 and the reset operation 105. The use of separate transistors, however, leads to an area penalty in integration of ReRAM device structures. This area penalty is illustrated in FIGS. 2A and 2B.

Figure 2B:
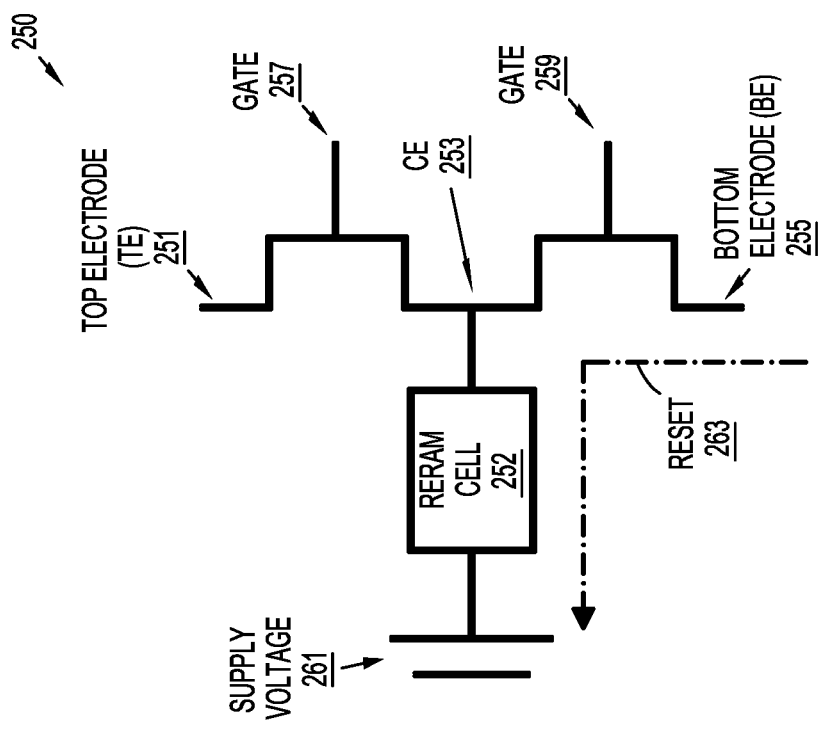
FIG. 2B shows a circuit diagram of a resistive random-access memory structure with stacked transistors, according to an embodiment of the invention.
Figure 2A:
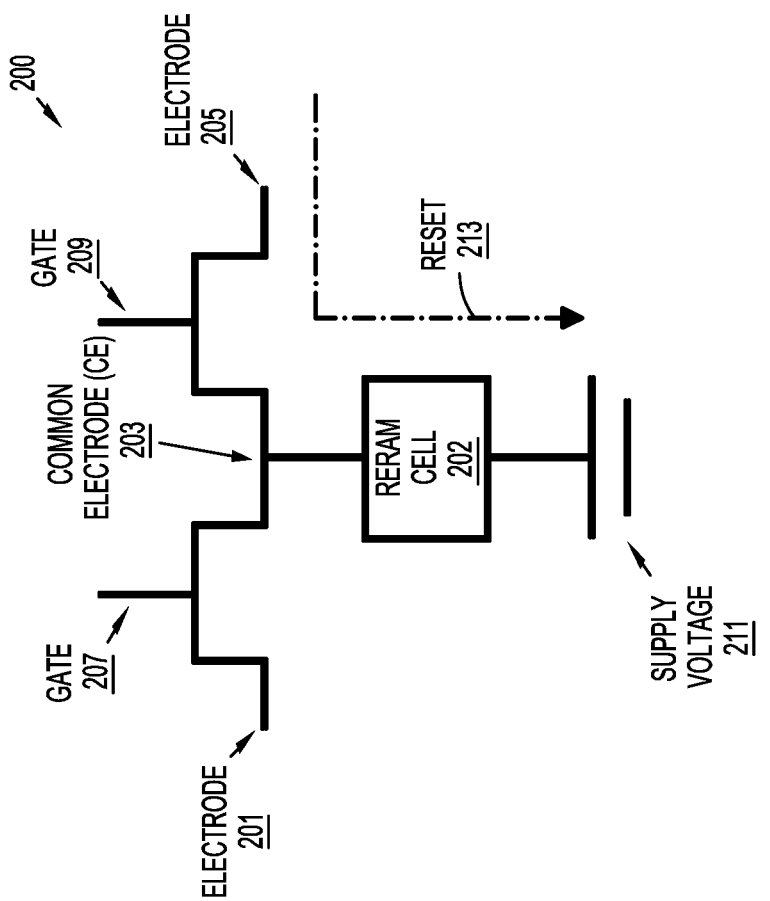
FIG. 2A shows a circuit diagram of a resistive random-access memory structure with planar transistors, according to an embodiment of the invention.

FIG. 2A shows a circuit diagram 200 of a ReRAM structure with planar transistors, while FIG. 2B shows a circuit diagram 250 of a ReRAM structure with stacked transistors. The circuit diagram 200 shows a ReRAM cell 202 along with electrode 201, common electrode (CE) 203, electrode 205, gate 207, gate 209 and supply voltage 211. The ReRAM cell 202 is coupled between the CE 203 and the supply voltage 211. The circuit diagram 200 of FIG. 2A also shows a reset operation 213 for the ReRAM cell 202. The circuit diagram 250 shows a ReRAM cell 252 along with a top electrode (TE) 251, CE 253, bottom electrode (BE) 255, gate 257, gate 259 and supply voltage 261. Again, the ReRAM cell 252 is coupled between the CE 253 and the supply voltage 261, though in the circuit diagram 250 of FIG. 2B the transistors are vertically stacked thus saving area. The circuit diagram 250 of FIG. 2B further shows a reset operation 263 for the ReRAM cell 252.

An integration flow for forming a stacked nanosheet transistor structure may include forming a tall nanosheet stack of epitaxial layers (e.g., alternating layers of sacrificial and non-sacrificial material, such as SiGe/Si). Shallow trench isolation (STI) regions are then formed, followed by formation of a dummy gate and a spacer for a top nanosheet transistor. Recess of the substrate is then performed, followed by epitaxial growth of source/drain regions and a spacer for the bottom nanosheet transistor. An n/p isolation layer is then formed, followed by epitaxial growth of source/drain regions for the top nanosheet transistor. The dummy gate may then be removed followed by formation of a gate stack (e.g., using replacement metal gate (RMG) processing). Middle-of-line (MOL) contacts are then formed, followed by back-end-of-line (BEOL) interconnects.

A process flow for forming a ReRAM structure with stacked transistors may utilize a stacked transistor integration scheme up to dummy gate patterning and bottom epitaxial layer formation steps. Following such steps, recess of an interlayer dielectric (ILD) is performed on a common area. This may be facilitated through patterning of an organic planarization layer (OPL). A top epitaxial layer is then formed, which is directly over the bottom epitaxial layer on one "side" of a nanosheet stack (e.g., for forming a common epitaxial layer) and which is over the ILD on the other "side" of the nanosheet stack. Next, a hard mask is selectively removed followed by a channel cut for the upper transistor of the stacked transistors. ILD fill is then performed, followed by removal of sacrificial layers and a nitride liner. A gate stack is then deposited, which may include a work function metal (WFM) formed using replacement metal gate (RMG) processing. A bottom epitaxial contact is then patterned, including formation of an isolation layer, as well as top and common epitaxial contacts and ReRAM cell formation of the common epitaxial contact.

In some embodiments, a device structure includes a ReRAM memory cell and two stacked transistors. The top transistor is used for ReRAM memory operation (e.g., reading/writing) and the bottom transistor is used for a forming event. The stacked transistors may be nanosheet transistors. The top and bottom transistors may share one source/drain region via a common epitaxial layer, with the ReRAM memory cell contacting the common epitaxial layer providing the shared source/drain region for the top and bottom transistors. The top transistor may have a lower threshold voltage (Vt) for high performance, and the bottom transistor may have a high Vt which has lower performance but accommodates the higher voltage needed for the forming event.

In some embodiments, a two transistor (2T) one ReRAM memory cell (1R) device includes a bottom transistor that is used for a forming event under high drain voltage, with a top transistor being used for ReRAM memory operation. Area scaling is improved by using vertically stacked transistors.

A process flow for forming ReRAM structures with stacked transistors will now be described with respect to FIG. 3A-26F.

FIG. 3A shows a first side cross-sectional view 300 of a structure following formation of a nanosheet stack over a substrate 302. FIG. 3B shows a second side cross-sectional view 365 of the structure following the formation of the nanosheet stack over the substrate 302. FIG. 3C shows a top-down view 375 illustrating where the first and second side cross-sectional views 300 and 365 of FIGS. 3A and 3B are taken. The top-down view 375 shows an active region 301. The first side cross-sectional view 300 of FIG. 3A is taken along the line A-A (e.g., along where a gate region 303 will be formed as shown in FIG. 8C and subsequent figures) in the top-down view 375 of FIG. 3C, and the second side cross-sectional view 365 of FIG. 3B is taken along the line B-B (e.g., across where the gate region 303 will be formed as shown in FIG. 8C and subsequent figures) in the top-down view 375 of FIG. 3C.

The substrate 302 may be formed of any suitable semiconductor structure, including various silicon-containing materials including but not limited to Si, SiGe, silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

A nanosheet stack is formed over the substrate 302, where the nanosheets include sacrificial layers 304-1 and 304-2 (collectively, sacrificial layers 304), nanosheet channel layers 306-1 and 306-2 (collectively, nanosheet channel layers 306), and sacrificial layers 308. The nanosheet channel layers 306-1 are used for a "bottom" or lower transistor in the stacked transistor structure, and the nanosheet channel layers 306-2 are used for a "top" or upper transistor in the stacked transistor structure.

The sacrificial layers 304 are illustratively formed of a first sacrificial material and the sacrificial layers 308 are illustratively formed of a second sacrificial material different than the first sacrificial material, such that the sacrificial layers 304 may be etched or otherwise removed selective to the sacrificial layers 308. In some embodiments, both the sacrificial layers 304 and the sacrificial layers 308 are formed of SiGe, but with different percentages of Ge. For example, the sacrificial layers 304 may have a relatively higher percentage of Ge (e.g., 55% Ge), and the sacrificial layers 308 may have a relatively lower percentage of Ge (e.g., 30% Ge). Other combinations of different sacrificial materials may be used in other embodiments. The sacrificial layers 304 and 308 may each have a thickness (in direction Z) in the range of 6-15 nm.

The nanosheet channel layers 306 may be formed of Si or another suitable material (e.g., a material similar to that used for the substrate 302). Each of the nanosheet channel layers 306 may have a thickness (in direction Z) in the range of 4-10 nm.

A first hard mask (HM) layer 310 is formed over a top of the nanosheet stack, and a nitride layer 312 is formed over the first HM layer 310. The first HM layer 310 may be formed of silicon dioxide ($SiO_2$) or another suitable material. The first HM layer 310 may have a thickness (in direction Z) in the range of 10-50 nm. The nitride layer 312 may be formed of silicon nitride (SiN) or another suitable material. The nitride layer 312 may have a thickness (in direction Z) in the range of 10-50 nm.

Figures 4A, 4B, 4C:
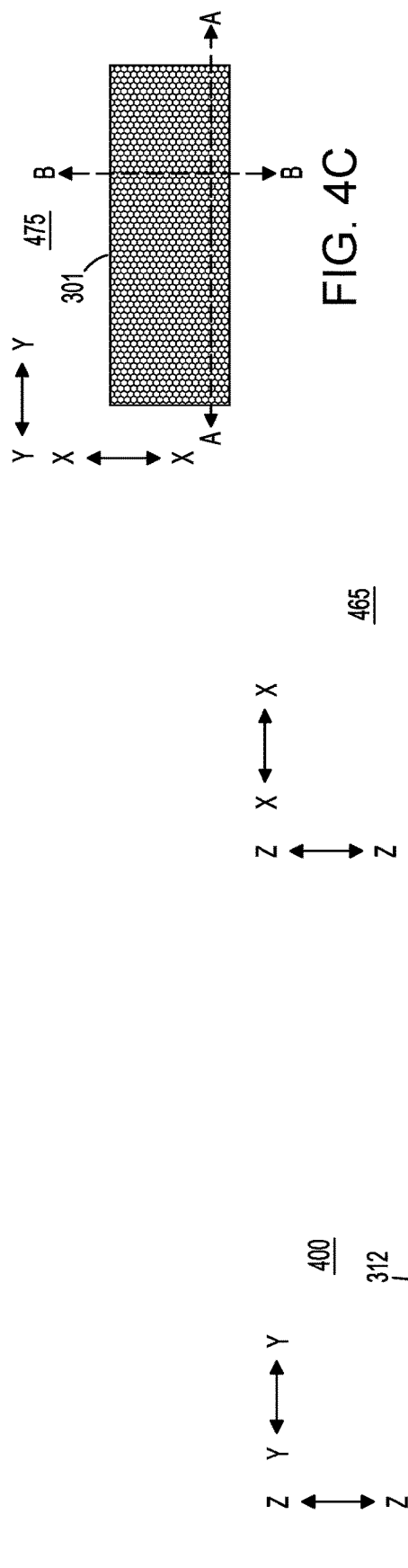
FIGS. 4A-4C show views of the structure of FIGS. 3A-3C following patterning of the first hard mask, according to an embodiment of the invention.

FIG. 4A shows a first side cross-sectional view 400 of the structure of FIGS. 3A-3C following patterning of the first HM layer 310 and the nitride layer 312. FIG. 4B shows a second side cross-sectional view 465 of the structure of FIGS. 3A-3C following the patterning of the first HM layer 310 and the nitride layer 312. FIG. 4C shows a top-down view 475 illustrating where the first and second side cross-sectional views 400 and 465 of FIGS. 4A and 4B are taken. The first side cross-sectional view 400 of FIG. 4A is taken along the line A-A (e.g., along where the gate region 303 will be formed as shown in FIG. 8C and subsequent figures) in the top-down view 475 of FIG. 4C, and the second side cross-sectional view 465 of FIG. 4B is taken along the line B-B (e.g., across where the gate region 303 will be formed as shown in FIG. 8C and subsequent figures) in the top-down view 475 of FIG. 4C.

The first HM layer 310 and the nitride layer 312 may be patterned, for example, using lithographic processing. Following patterning, the first HM layer 310 and the nitride layer 312 may each have a width (in direction Y) in the range of 20-200 nm.

FIG. 5A shows a first side cross-sectional view 500 of the structure of FIGS. 4A-4C following formation of a second HM layer 314. FIG. 5B shows a second side cross-sectional view 565 of the structure of FIGS. 4A-4C following the formation of the second HM layer 314. FIG. 5C shows a top-down view 575 illustrating where the first and second side cross-sectional views 500 and 565 of FIGS. 5A and 5B are taken. The first side cross-sectional view 500 of FIG. 5A is taken along the line A-A (e.g., along where the gate region 303 will be formed as shown in FIG. 8C and subsequent figures) in the top-down view 575 of FIG. 5C, and the second side cross-sectional view 565 of FIG. 5B is taken along the line B-B (e.g., across where the gate region 303 will be formed as shown in FIG. 8C and subsequent figures) in the top-down view 575 of FIG. 5C.

Material for the second HM layer 314 may be filled over the structure and then planarized (e.g., using chemical mechanical planarization (CMP) or other suitable processing). The second HM layer 314 may be formed of silicon carbide (SiC), a silicon-carbon-oxygen (SiCO) material, or another suitable material.

Figure 6C:
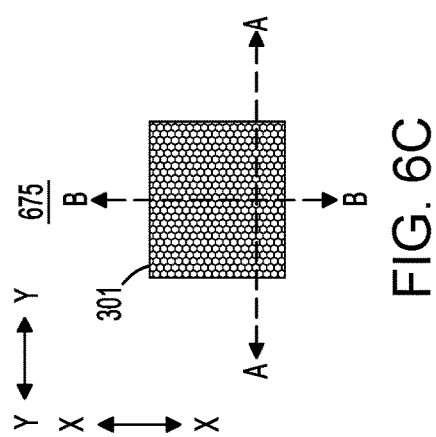
FIGS. 6A-6C show views of the structure of FIGS. 5A-5C following patterning of the second hard mask and etching through the nanosheet stack and a portion of the substrate, according to an embodiment of the invention.
Figure 6B:
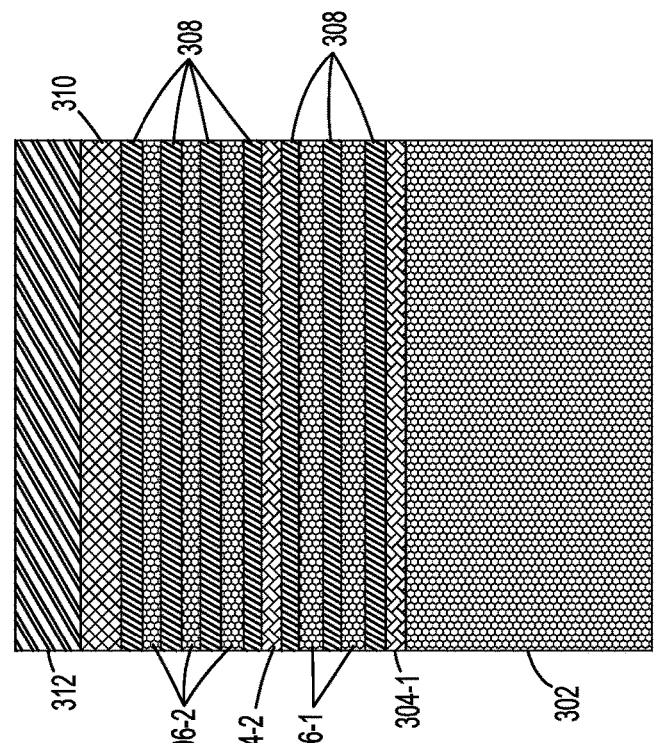
Figure 6A:
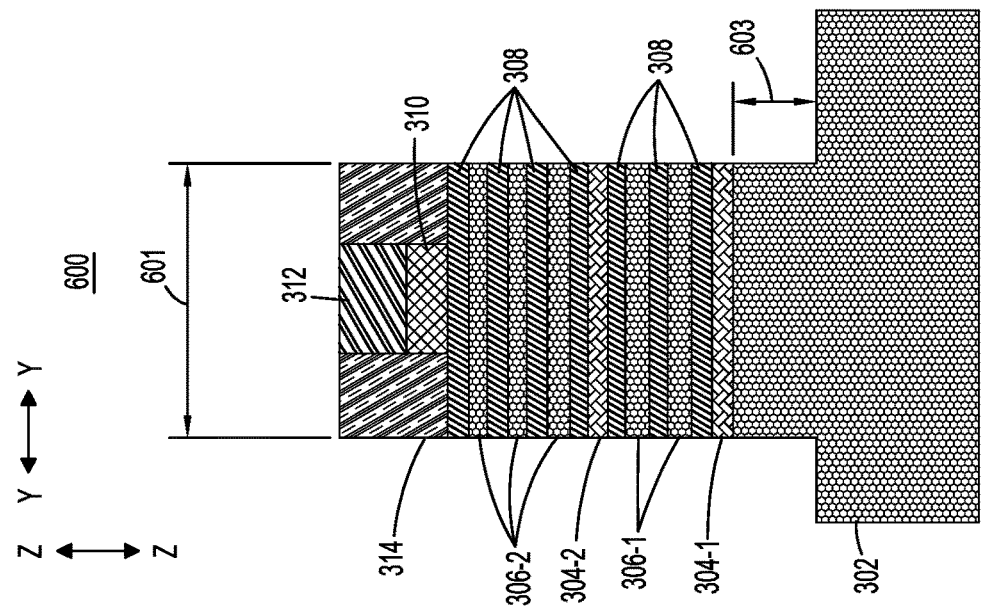

FIG. 6A shows a first side cross-sectional view 600 of the structure of FIGS. 5A-5C following patterning of the second HM layer 314 and etching through the nanosheet stack and a portion of the substrate 302. FIG. 6B shows a second side cross-sectional view 665 of the structure of FIGS. 5A-5C following the patterning of the second HM layer 314 and the etching through the nanosheet stack and the portion of the substrate 302. FIG. 6C shows a top-down view 675 illustrating where the first and second side cross-sectional views 600 and 665 of FIGS. 6A and 6B are taken. As shown in FIG. 6C, the active region 301 is smaller as a result of the etch through the nanosheet stack. The first side cross-sectional view 600 of FIG. 6A is taken along the line A-A (e.g., along where the gate region 303 will be formed as shown in FIG. 8C and subsequent figures) in the top-down view 675 of FIG. 6C, and the second side cross-sectional view 665 of FIG. 6B is taken along the line B-B (e.g., across where the gate region 303 will be formed as shown in FIG. 8C and subsequent figures) in the top-down view 675 of FIG. 6C.

The second HM layer 314 may be patterned using lithographic or other suitable processing, such that the width 601 (in direction Y) is in the range of 50 nm or larger. Once the second HM layer 314 is patterned, exposed portions of the nanosheet stack may be etched (e.g., using reactive-ion etching (ME) or other suitable processing). The etching proceeds through the entire nanosheet stack and down into a portion of the substrate 302, such as to a depth 603 (in direction Z) in the range of 30 nm or larger.

Figures 7A, 7B, 7C:
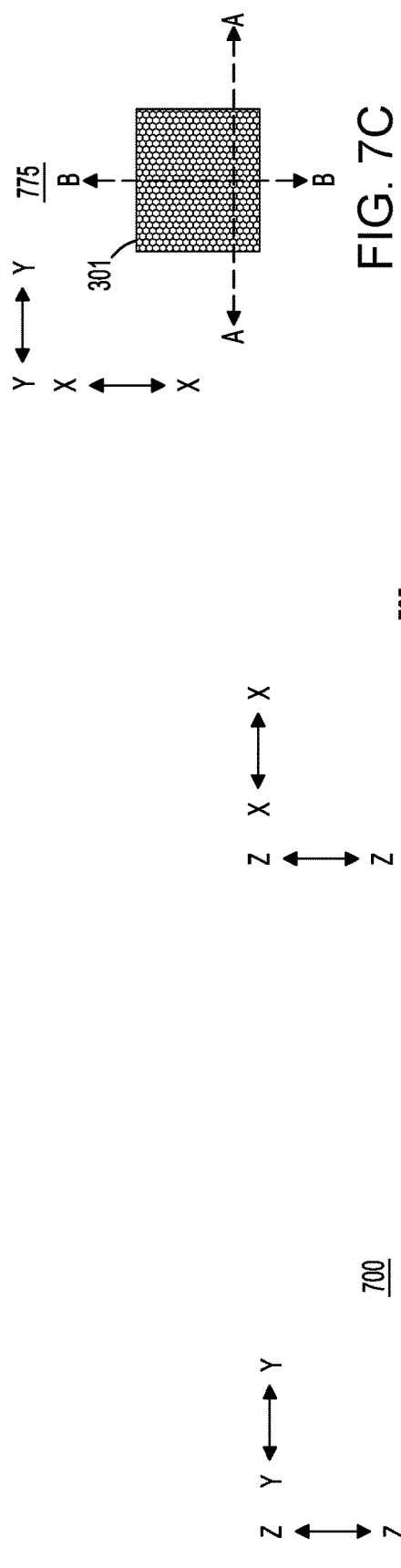
FIGS. 7A-7C show views of the structure of FIGS. 6A-6C following formation of shallow trench isolation regions, according to an embodiment of the invention.

FIG. 7A shows a first side cross-sectional view 700 of the structure of FIGS. 6A-6C following formation of STI regions 316. FIG. 7B shows a second side cross-sectional view 765 of the structure of FIGS. 6A-6C following the formation of the STI regions 316. FIG. 7C shows a top-down view 775 illustrating where the first and second side cross-sectional views 700 and 765 of FIGS. 7A and 7B are taken. The first side cross-sectional view 700 of FIG. 7A is taken along the line A-A (e.g., along where the gate region 303 will be formed as shown in FIG. 8C and subsequent figures) in the top-down view 775 of FIG. 7C, and the second side cross-sectional view 765 of FIG. 7B is taken along the line B-B (e.g., across where the gate region 303 will be formed as shown in FIG. 8C and subsequent figures) in the top-down view 775 of FIG. 7C.

Once the second HM layer 314 is patterned, an etching is performed to remove exposed portions of the sacrificial layers 304 and 308, the nanosheet channel layers 306, and a portion of the substrate 302. The STI regions 316 are then formed. The STI regions 316 may be formed of a dielectric material such as silicon dioxide ($SiO_2$), silicon oxycarbide (SiOC), silicon oxynitride (SiON), etc. The STI regions 316 may have a height (in direction Z) in the range of 20 to 100 nm.

Figure 8E:
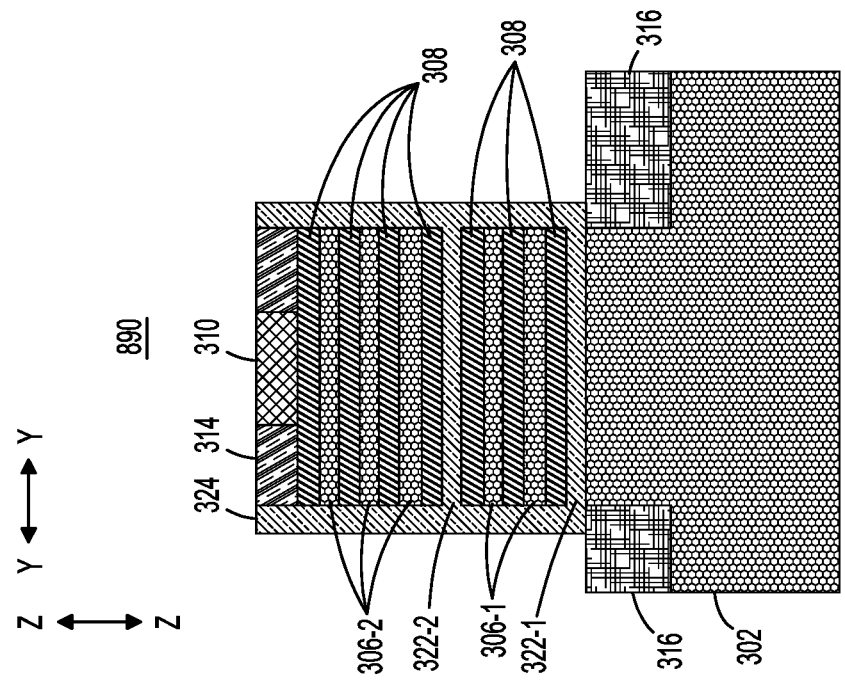
Figure 8D:
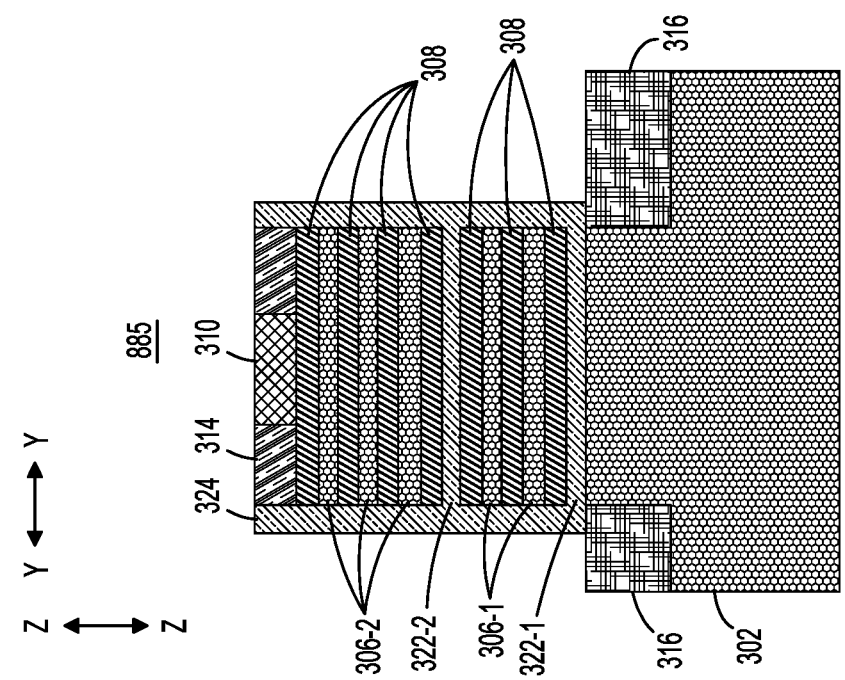

FIG. 8A shows a first side cross-sectional view 800 of the structure of FIGS. 7A-7C following patterning of a dummy gate 318 and formation of isolation layers. FIGS. 8B, 8D and 8E show respective second, third and fourth side cross-sectional views 865, 885 and 890 of the structure of FIGS. 7A-7C following the patterning of the dummy gate 318 and the formation of the isolation layers. FIG. 8C shows a top-down view 875 illustrating where the first, second, third and fourth side cross-sectional views 800, 865, 885 and 890 of FIGS. 8A, 8B, 8D and 8E are taken. The first side cross-sectional view 800 of FIG. 8A is taken along the line A-A (e.g., along the gate region 303) in the top-down view 875 of FIG. 8C, while the third and fourth side cross-sectional views 885 and 890 of FIGS. 8D and 8E are taken along the lines D-D and E-E respectively (e.g., in the same direction as A-A, but on opposite sides of the gate region 303). The second side cross-sectional view 865 of FIG. 8B is taken along the line B-B (e.g., across the gate region 303) in the top-down view 875 of FIG. 8C.

Material of the dummy gate 318 (e.g., amorphous silicon (a-Si) or amorphous silicon germanium (a-SiGe) over a thin $SiO_2$ or titanium nitride (TiN) layer, or another suitable material) may be blanket deposited over the structure, followed by formation and patterning of a gate hard mask (HM) layer 320 (e.g., formed of silicon nitride (SiN), a multi-layer of SiN and SiO$_2$, or another suitable material), followed by lithographic processing to result in the patterned dummy gate 318 and gate HM layer 320 as shown in FIGS. 8A-8E. The dummy gate 318 may have a height (in direction Z) above the first HM layer 310 in the range of 20 nm or larger. The dummy gate 318 may have a width (in direction X) in the range of 10-100 nm. The gate HM layer 320 may have a height (in direction Z) in the range of 10 nm or larger, and a width (in direction X) that matches that of the underlying dummy gate 318.

Following formation and patterning of the dummy gate 318 and the gate HM layer 320, the sacrificial layers 304-1 and 304-2 may be removed. An isolation material may be then be filled in the structure. The isolation material which fills the gaps formed by removal of the sacrificial layers 304-1 and 304-2 provides a bottom dielectric isolation (BDI) layer 322-1 and a middle dielectric isolation (MDI) layer 322-2, respectively. Portions of the isolation layer formed on sidewalls of the nanosheet stack, and on sidewalls of the dummy gate 318 and the gate HM layer 320 provide spacers 324. The isolation material forming the BDI layer 322-1, the MDI layer 322-2 and the spacers 324 may be formed of any suitable insulator, such as SiN, silicon boron carbide nitride (SiBCN), silicon oxycarbonitride (SiOCN), etc. The isolation material may be blanket deposited, filling the regions exposed by removal of the sacrificial layers 304. The portions of the isolation material that overfill the structure may be etched (e.g., using RIE or other suitable etch processing) to result in the spacers 324.

Figure 9E:
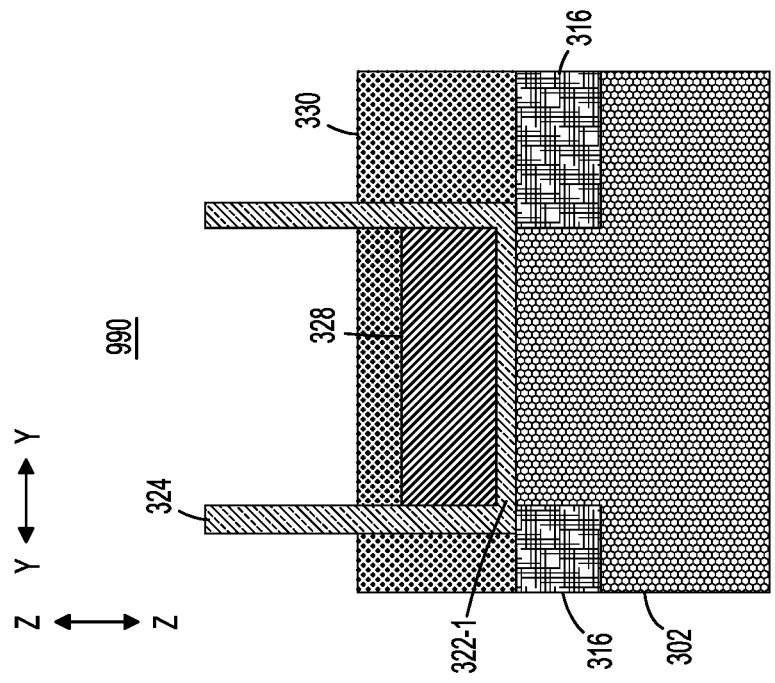
Figure 9D:
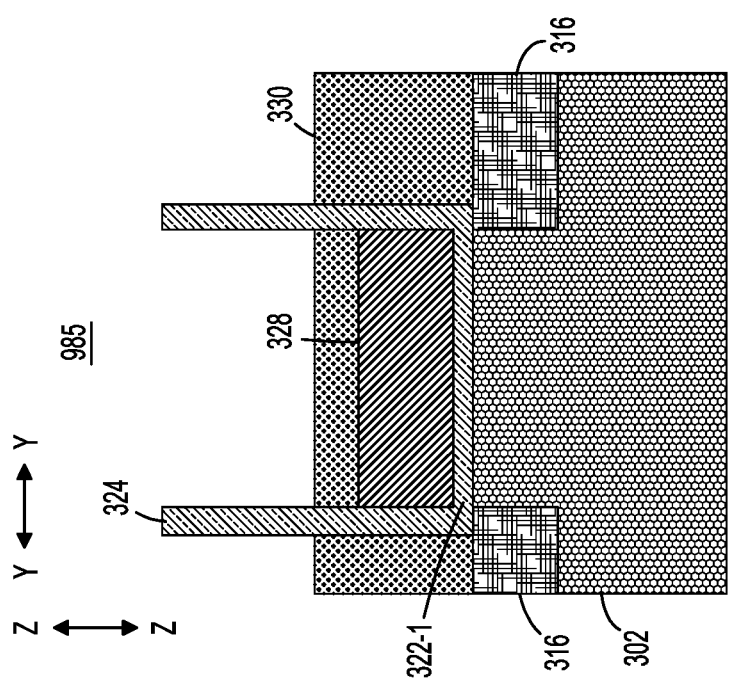

FIG. 9A shows a first side cross-sectional view 900 of the structure of FIGS. 8A-8E following recess of the nanosheet stack and formation of inner spacers 326, a bottom epitaxial layer 328 and an interlayer dielectric (ILD) layer 330. FIGS. 9B, 9D and 9E show respective second, third and fourth side cross-sectional views 965, 985 and 990 of the structure of FIGS. 8A-8E following the recess of the nanosheet stack and the formation of the inner spacers 326, the bottom epitaxial layer 328 and the ILD layer 330. FIG. 9C shows a top-down view 975 illustrating where the first, second, third and fourth side cross-sectional views 900, 965, 985 and 990 of FIGS. 9A, 9B, 9D and 9E are taken. The first side cross-sectional view 900 of FIG. 9A is taken along the line A-A (e.g., along the gate region 303) in the top-down view 975 of FIG. 9C, while the third and fourth side cross-sectional views 985 and 990 of FIGS. 9D and 9E are taken along the lines D-D and E-E respectively (e.g., in the same direction as A-A, but on opposite sides of the gate region 303). The second side cross-sectional view 965 of FIG. 9B is taken along the line B-B (e.g., across the gate region 303) in the top-down view 975 of FIG. 9C.

The sacrificial layers 308 may be recessed or indented, followed by formation of the inner spacers 326 in the indent regions formed by the recess of the sacrificial layers 308. Next, portions of the nanosheet stacks which are not covered by the dummy gate 318, the gate HM layer 320 and the spacers 324 are etched through to the BDI layer 322-1. This etching, which may be a directional etch, removes part of the spacers 324 below a top surface of the gate HM layer 320 as shown in FIG. 9B. The bottom epitaxial layer 328 is then formed (e.g., providing a source/drain region for the stacked transistors). The ILD layer 330 is then filled over the structure.

The inner spacers 326 may be formed to fill indent spaces (e.g., resulting from indent etches of the sacrificial layers 308). The inner spacers 326 may be formed of SiN or another suitable material such as SiBCN, SiCO, SiOCN, etc. The inner spacers 326 may have widths (in direction X) in the range of 5 to 15 nm, and may have heights (in direction Z) matching that of the sacrificial layers 308.

The bottom epitaxial layer 328 may be formed using an epitaxial growth process. The bottom epitaxial layer 328 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RT-CVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$. The bottom epitaxial layer 328 may have a width (in direction X) in the range of 10 to 30 nm.

The ILD layer 330 is formed over the top of the bottom epitaxial layer 328 and STI regions 316 as illustrated. The ILD layer 330 may be formed of any suitable isolating material, such as SiO$_2$, SiOC, SiON, etc. The ILD layer 330 may then be planarized (e.g., using CMP or other suitable processing).

Figure 10C:
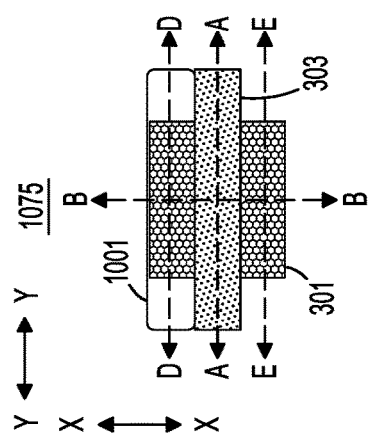
FIGS. 10A-10E show views of the structure of FIG. 9A-9E following patterning of an organic planarization layer and recess of the interlayer dielectric, according to an embodiment of the invention.
Figure 10B:
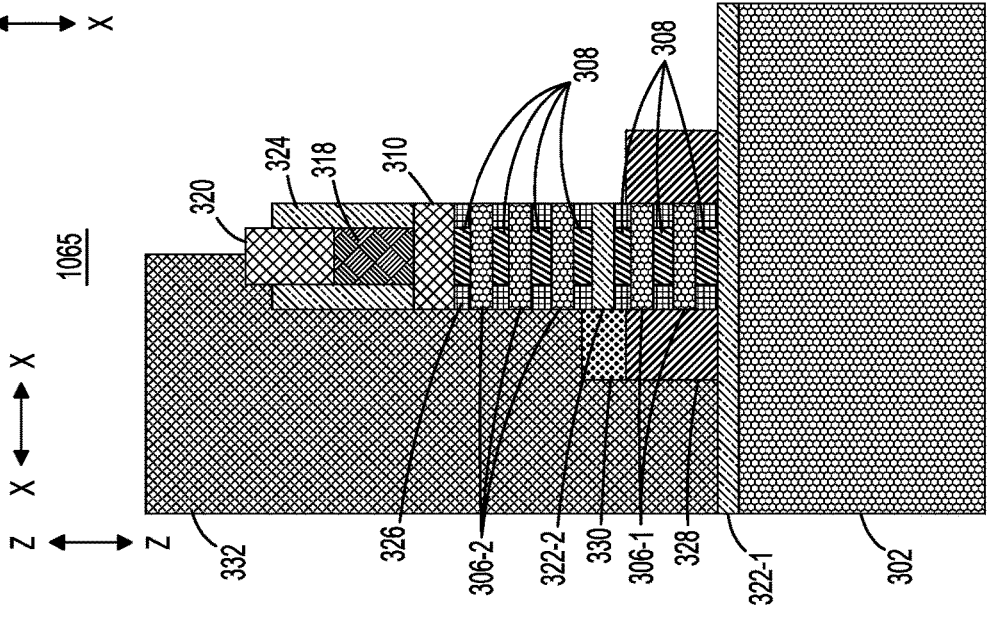
Figure 10A:
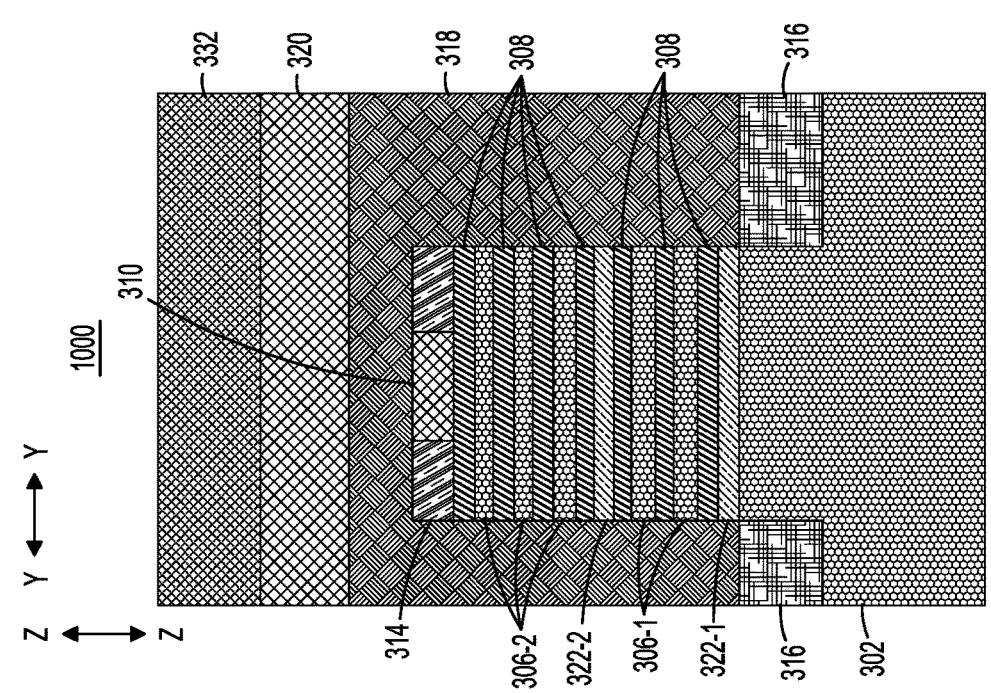
Figure 10E:
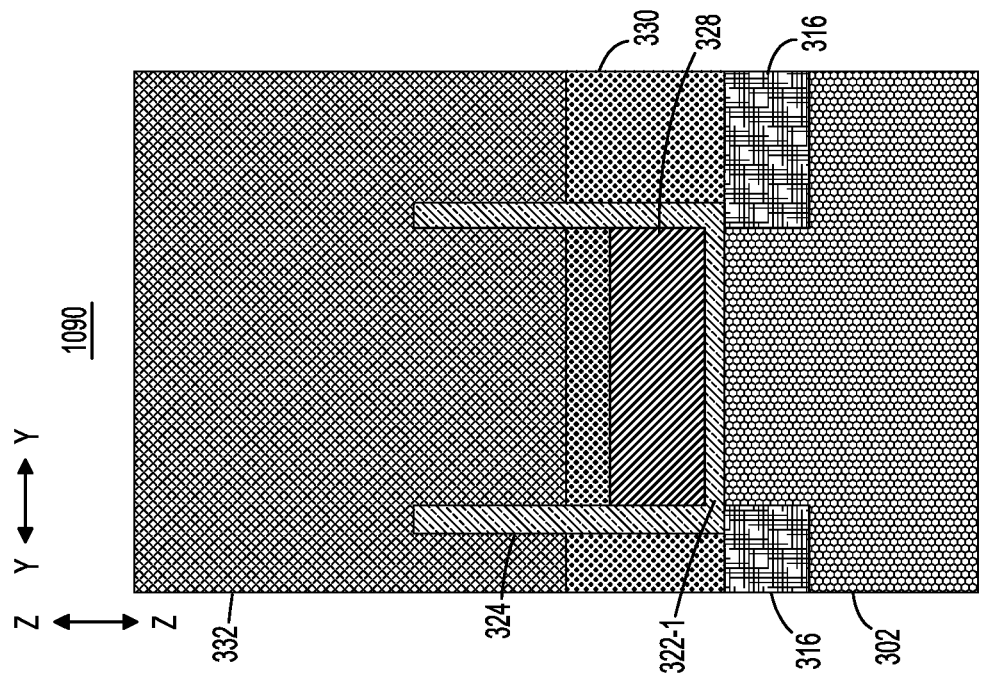
Figure 10D:
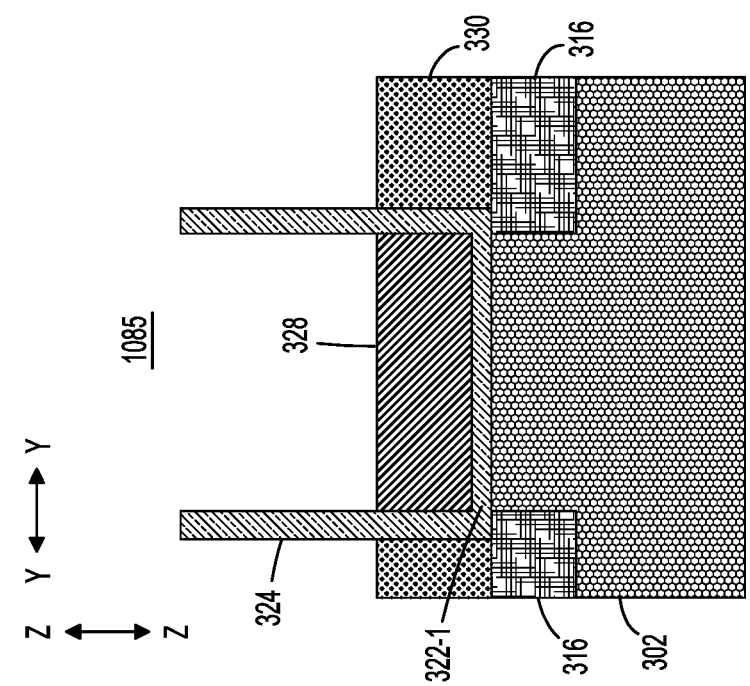

FIG. 10A shows a first side cross-sectional view 1000 of the structure of FIGS. 9A-9E following patterning of an organic planarization layer (OPL) 332 and recess of the ILD layer 330. FIGS. 10B, 10D and 10E show respective second, third and fourth side cross-sectional views 1065, 1085 and 1090 of the structure of FIGS. 9A-9E following the patterning of the OPL 332 and the recess of the ILD layer 330. FIG. 10C shows a top-down view 1075 illustrating where the first, second, third and fourth side cross-sectional views 1000, 1065, 1085 and 1090 of FIGS. 10A, 10B, 10D and 10E are taken. The first side cross-sectional view 1000 of FIG. 10A is taken along the line A-A (e.g., along the gate region 303) in the top-down view 1075 of FIG. 10C, while the third and fourth side cross-sectional views 1085 and 1090 of FIGS. 10D and 10E are taken along the lines D-D and E-E respectively (e.g., in the same direction as A-A, but on opposite sides of the gate region 303). The second side cross-sectional view 1065 of FIG. 10B is taken along the line B-B (e.g., across the gate region 303) in the top-down view 1075 of FIG. 10C. FIG. 10C also highlights a region 1001 where the OPL 332 is not formed (e.g., a lithographic "open" area) discussed in further detail below.

The OPL 332 is patterned over the structure so as to cover one "side" of the gate region 303 (e.g., as shown in the Y direction first, second and third side cross-sectional views 1000, 1085 and 1090 of FIGS. 10A, 10D and 10E, where the OPL covers the structure in the region shown in the side cross-sectional view 1085 of FIG. 10D but not in the region 1001 shown in the cross-sectional view 1090 of FIG. 10E).

Once the OPL 332 is patterned, exposed portions of the ILD layer 330 are recessed (e.g., in the region shown in the side cross-sectional view 1085 of FIG. 10D). The ILD layer 330 is recessed so as to form a "common" electrode for the upper and lower transistor in the transistor stack as will be discussed in further detail below.

FIG. 11A shows a first side cross-sectional view 1100 of the structure of FIGS. 10A-10E following removal of the OPL 332. The OPL 332 may be removed using dry RIE processing. FIGS. 11B, 11D and 11E show respective second, third and fourth side cross-sectional views 1165, 1185 and 1190 of the structure of FIGS. 10A-10E following the removal of the OPL 332. FIG. 11C shows a top-down view 1175 illustrating where the side cross-sectional views 1100, 1165, 1185 and 1190 of FIGS. 11A, 11B, 11D and 11E are taken. The first side cross-sectional view 1100 of FIG. 11A is taken along the line A-A (e.g., along the gate region 303) in the top-down view 1175 of FIG. 11C, while the third and fourth side cross-sectional views 1185 and 1190 of FIGS. 11D and 11E are taken along the lines D-D and E-E respectively (e.g., in the same direction as A-A, but on opposite sides of the gate region 303). The second side cross-sectional view 1165 of FIG. 11B is taken along the line B-B (e.g., across the gate region 303) in the top-down view 1175 of FIG. 11C.

Figure 12C:
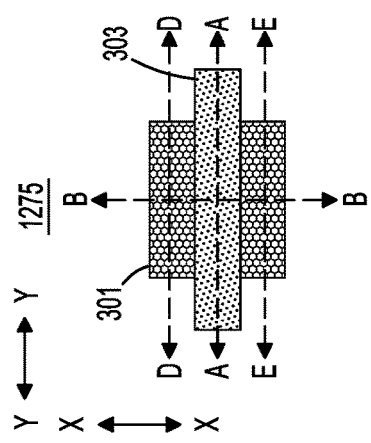
FIGS. 12A-12E show views of the structure of FIG. 11A-11E following formation of a top epitaxial layer, according to an embodiment of the invention.
Figure 12B:
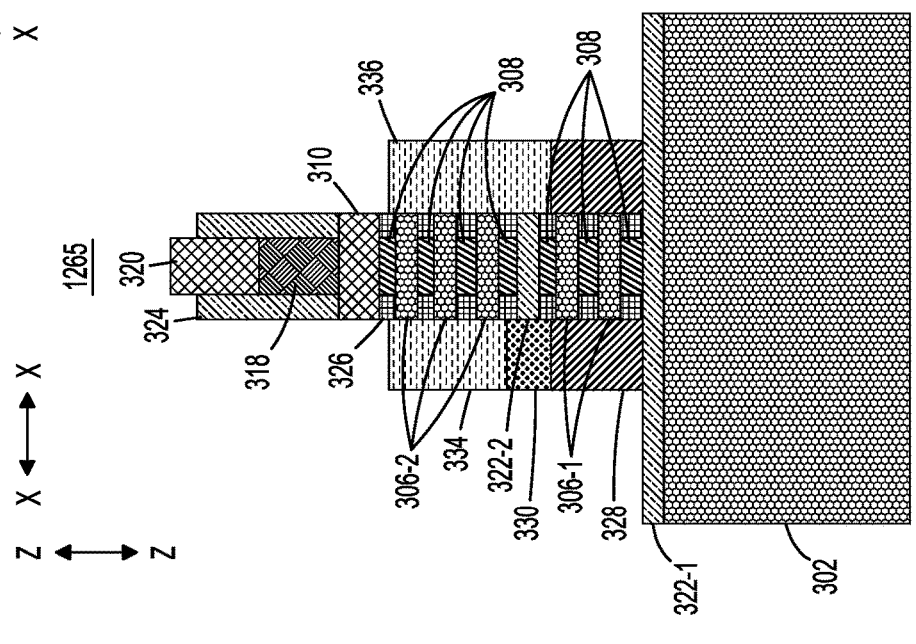
Figure 12A:
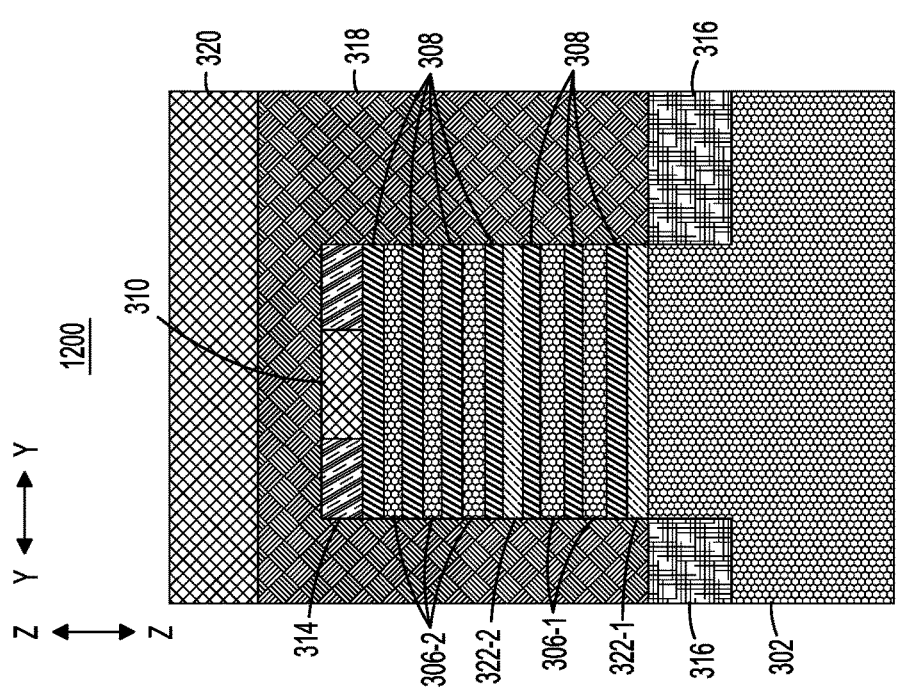
Figure 12E:
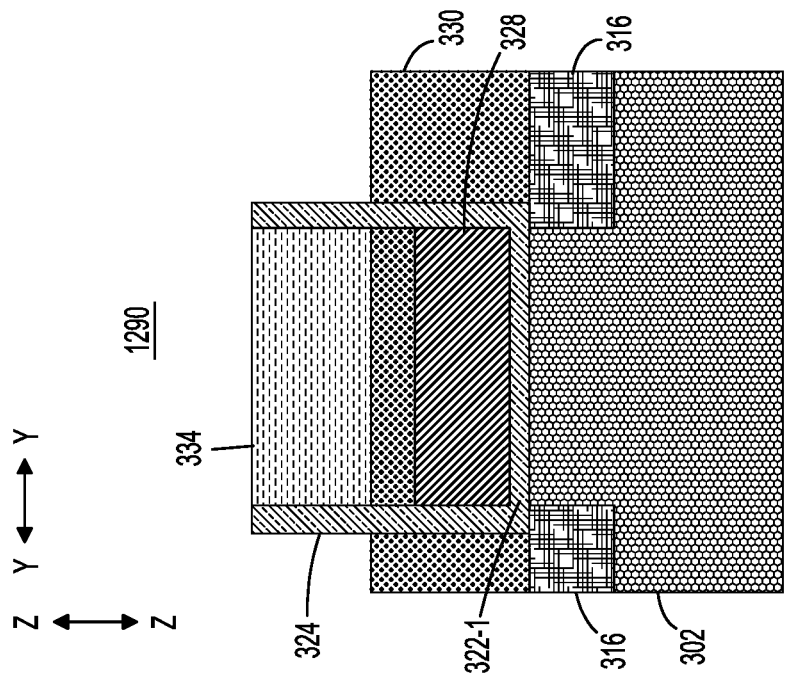
Figure 12D:
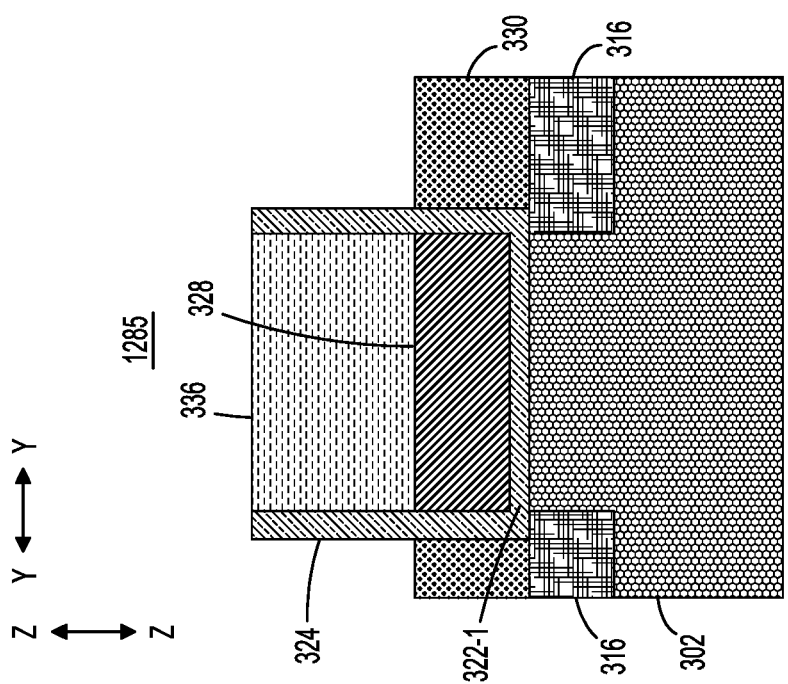

FIG. 12A shows a first side cross-sectional view 1200 of the structure of FIGS. 11A-11E following formation of a top epitaxial layer 334 and a common epitaxial layer 336. FIGS. 12B, 12D and 12E show respective second, third and fourth side cross-sectional views 1265, 1285 and 1290 of the structure of FIGS. 11A-11E following the formation of the top epitaxial layer 334 and the common epitaxial layer 336. FIG. 12C shows a top-down view 1275 illustrating where the side cross-sectional views 1200, 1265, 1285 and 1290 of FIGS. 12A, 12B, 12D and 12E are taken. The first side cross-sectional view 1200 of FIG. 12A is taken along the line A-A (e.g., along the gate region 303) in the top-down view 1275 of FIG. 12C, while the third and fourth side cross-sectional views 1285 and 1290 of FIGS. 12D and 12E are taken along the lines D-D and E-E respectively (e.g., in the same direction as A-A, but on opposite sides of the gate region 303). The second side cross-sectional view 1265 of FIG. 12B is taken along the line B-B (e.g., across the gate region 303) in the top-down view 1275 of FIG. 12C.

The top epitaxial layer 334 is formed over the ILD layer 330 on the "left" side of the nanosheet stack shown in the side cross-sectional view 1265 of FIG. 12B (e.g., in the region shown in the side cross-sectional view 1290 of FIG. 12E). The common epitaxial layer 336 is formed over the bottom epitaxial layer 328 on the "right" side of the nanosheet stack shown in the side cross-sectional view 1265 of FIG. 12B (e.g., in the region shown in the side cross-sectional view 1285 of FIG. 12D). The top epitaxial layer 334 and the common epitaxial layer 336 may be formed using similar processing as that described above with respect to the bottom epitaxial layer 328. The top epitaxial layer 334 may have a height (in direction Z) in the range of 50-80 nm, and the common epitaxial layer 336 may have a height (in direction Z) in the range of 60-90 nm. On the "left" side of the nanosheet stack, the top epitaxial layer 334 is separated from the bottom epitaxial layer 328 by the ILD layer 330. On the "right" side of the nanosheet stack, the common epitaxial layer 336 directly contacts the bottom epitaxial layer 328 (e.g., as the ILD layer 330 is removed from this side in the processing described above with respect to FIGS. 10A-10E).

Figure 13E:
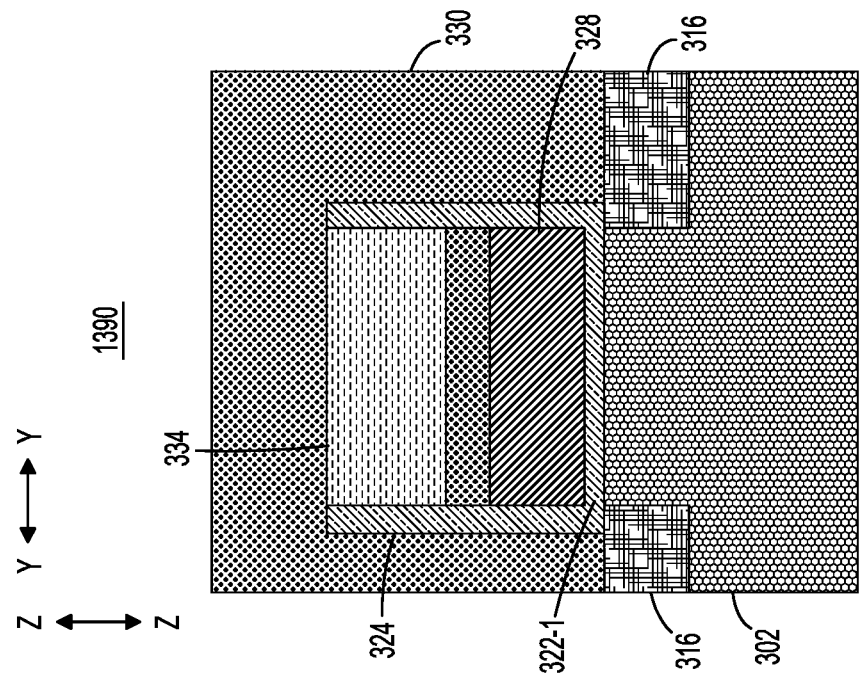
Figure 13D:
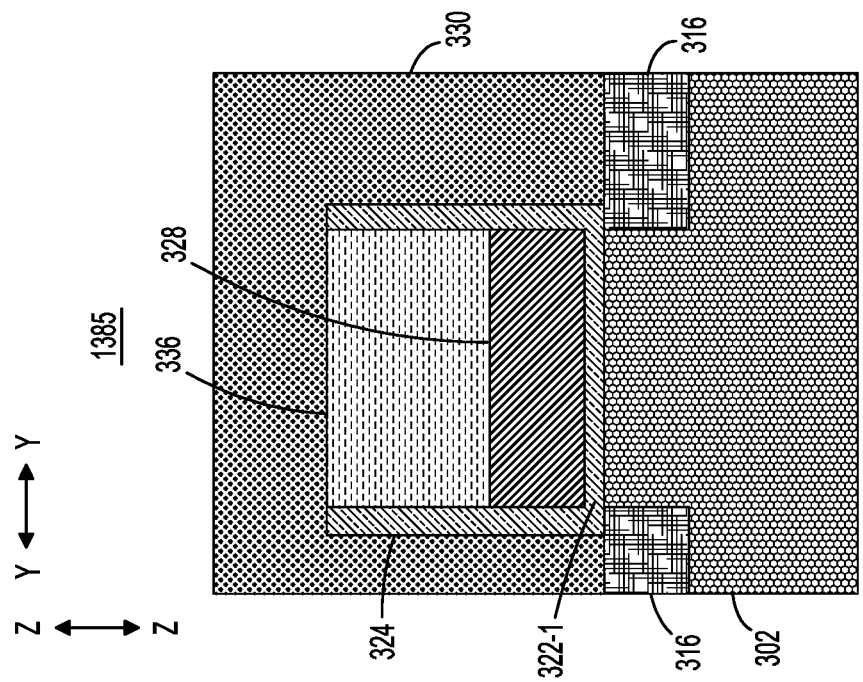

FIG. 13A shows a first side cross-sectional view 1300 of the structure of FIGS. 12A-12E following deposition and planarization of additional material for the ILD layer 330. FIGS. 13B, 13D and 13E show respective second, third and fourth side cross-sectional views 1365, 1385 and 1390 of the structure of FIGS. 12A-12E following the deposition and planarization of the additional material for the ILD layer 330. FIG. 13C shows a top-down view 1375 illustrating where the side cross-sectional views 1300, 1365, 1385 and 1390 of FIGS. 13A, 13B, 13D and 13E are taken. The first side cross-sectional view 1300 of FIG. 13A is taken along the line A-A (e.g., along the gate region 303) in the top-down view 1375 of FIG. 13C, while the third and fourth side cross-sectional views 1385 and 1390 of FIGS. 13D and 13E are taken along the lines D-D and E-E respectively (e.g., in the same direction as A-A, but on opposite sides of the gate region 303). The second side cross-sectional view 1365 of FIG. 13B is taken along the line B-B (e.g., across the gate region 303) in the top-down view 1375 of FIG. 13C.

The additional material of the ILD layer 330 is deposited to overfill the structure, followed by planarization (e.g., using CMP or other suitable processing) that removes the gate HM layer 320 and portions of the spacer 324.

Figure 14C:
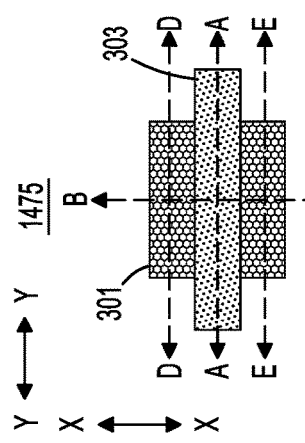
FIGS. 14A-14E show views of the structure of FIG. 13A-13E following a partial recess of the dummy gate, according to an embodiment of the invention.
Figure 14B:
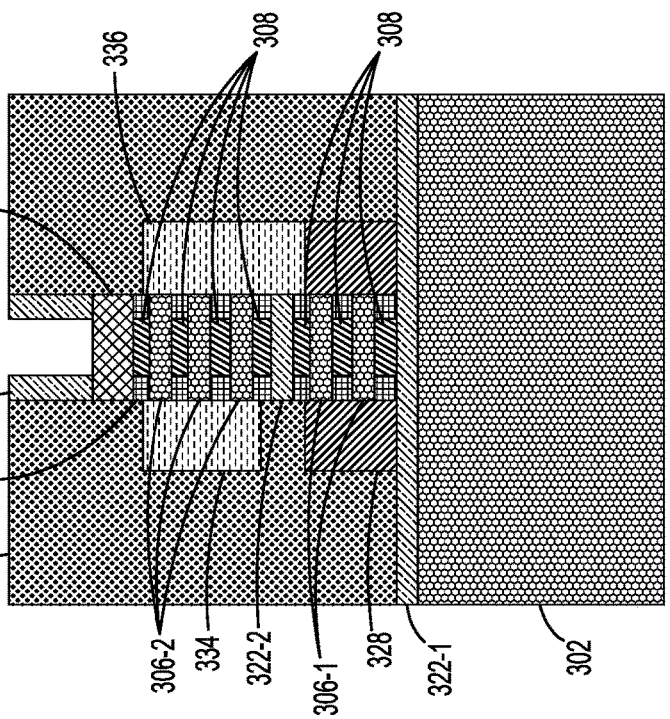
Figure 14A:
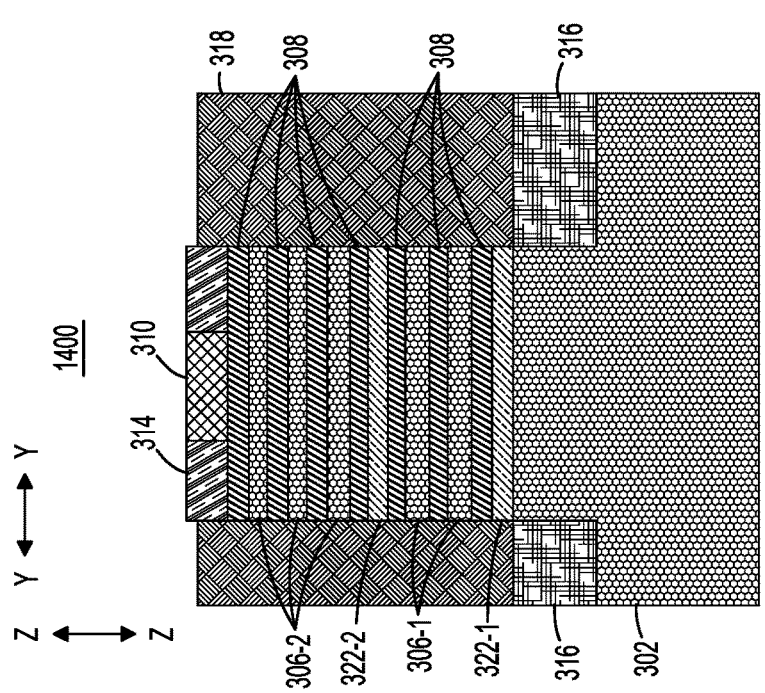
Figure 14E:
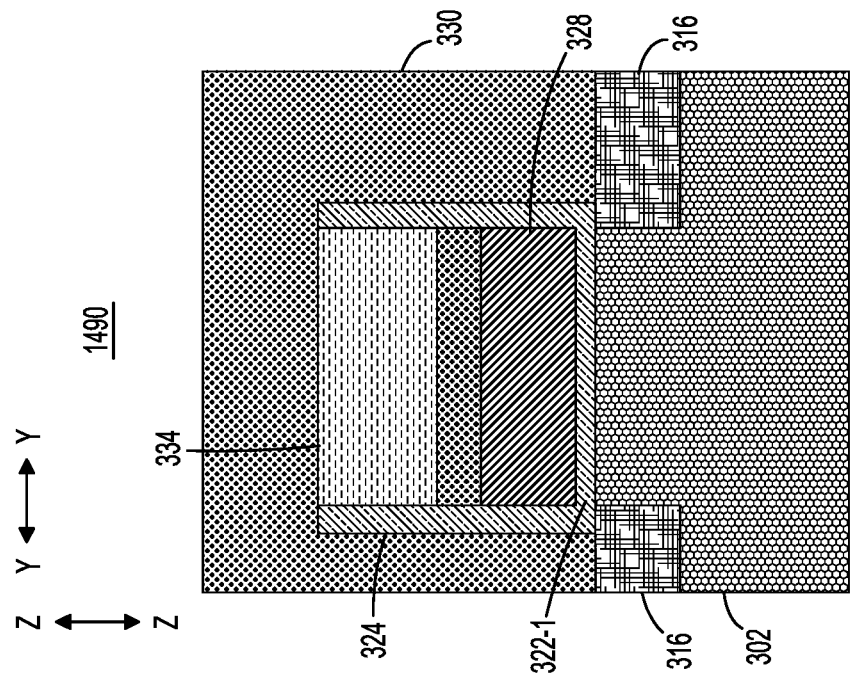
Figure 14D:
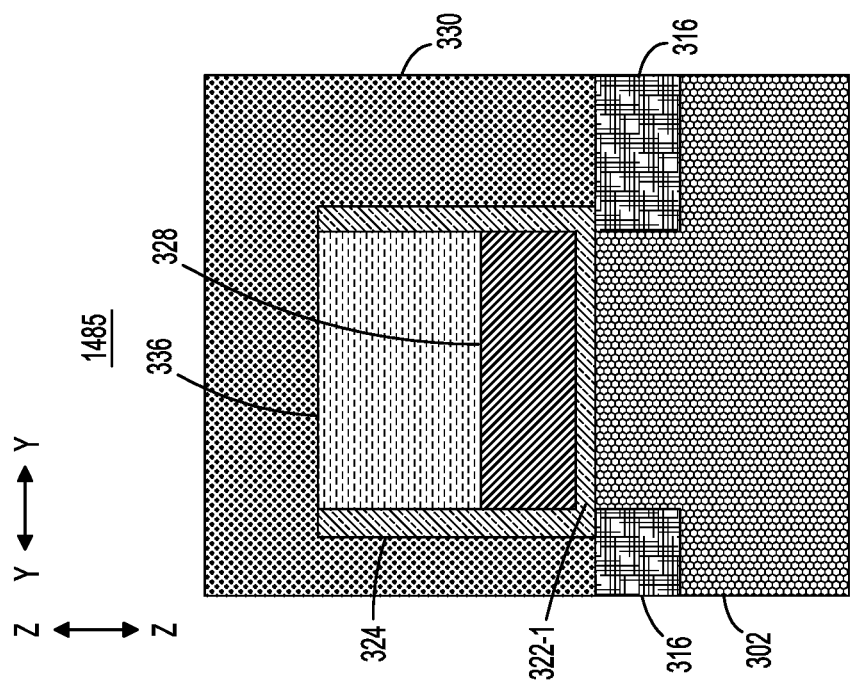

FIG. 14A shows a first side cross-sectional view 1400 of the structure of FIGS. 13A-13E following a partial recess of the dummy gate 318. FIGS. 14B, 14D and 14E show respective second, third and fourth side cross-sectional views 1465, 1485 and 1490 of the structure of FIGS. 13A-13E following the partial recess of the dummy gate 318. FIG. 14C shows a top-down view 1475 illustrating where the side cross-sectional views 1400, 1465, 1485 and 1490 of FIGS. 14A, 14B, 14D and 14E are taken. The first side cross-sectional view 1400 of FIG. 14A is taken along the line A-A (e.g., along the gate region 303) in the top-down view 1475 of FIG. 14C, while the third and fourth side cross-sectional views 1485 and 1490 of FIGS. 14D and 14E are taken along the lines D-D and E-E respectively (e.g., in the same direction as A-A, but on opposite sides of the gate region 303). The second side cross-sectional view 1465 of FIG. 14B is taken along the line B-B (e.g., across the gate region 303) in the top-down view 1475 of FIG. 14C.

The dummy gate 318 may be recessed to a depth (in direction Z) in the range of 10 nm or larger. The dummy gate 318 may be recessed using any suitable etch processing.

Figure 15C:
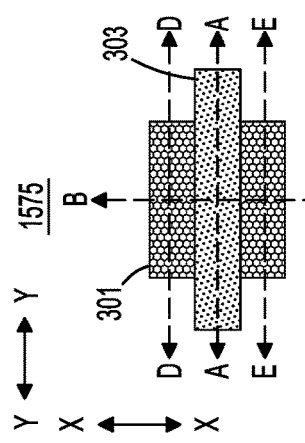
FIGS. 15A-15E show views of the structure of FIG. 14A-14E following selective removal of the second hard mask, according to an embodiment of the invention.
Figure 15B:
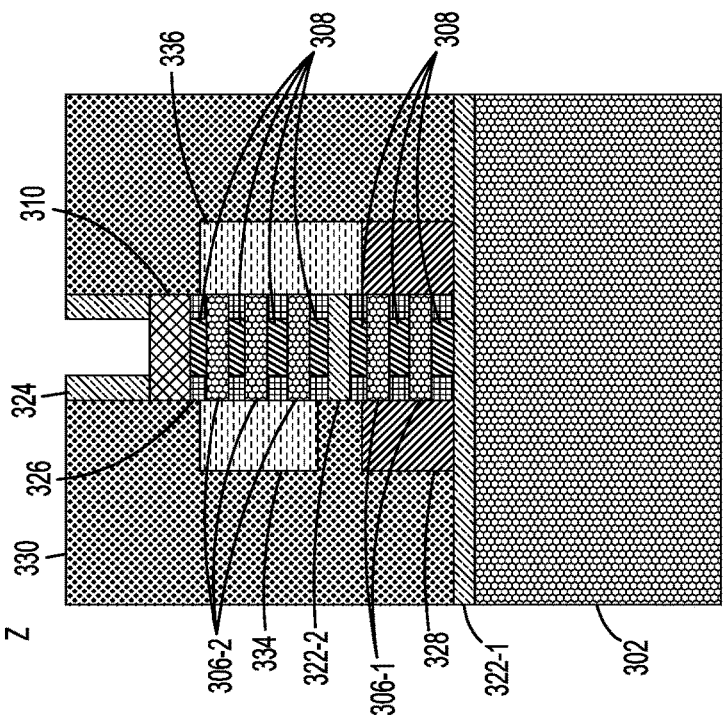
Figure 15A:
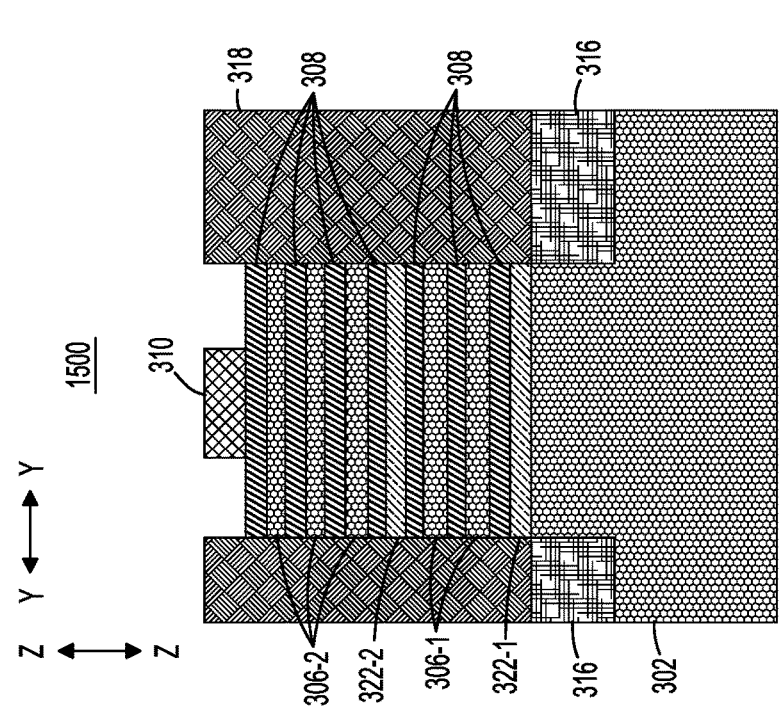
Figure 15E:
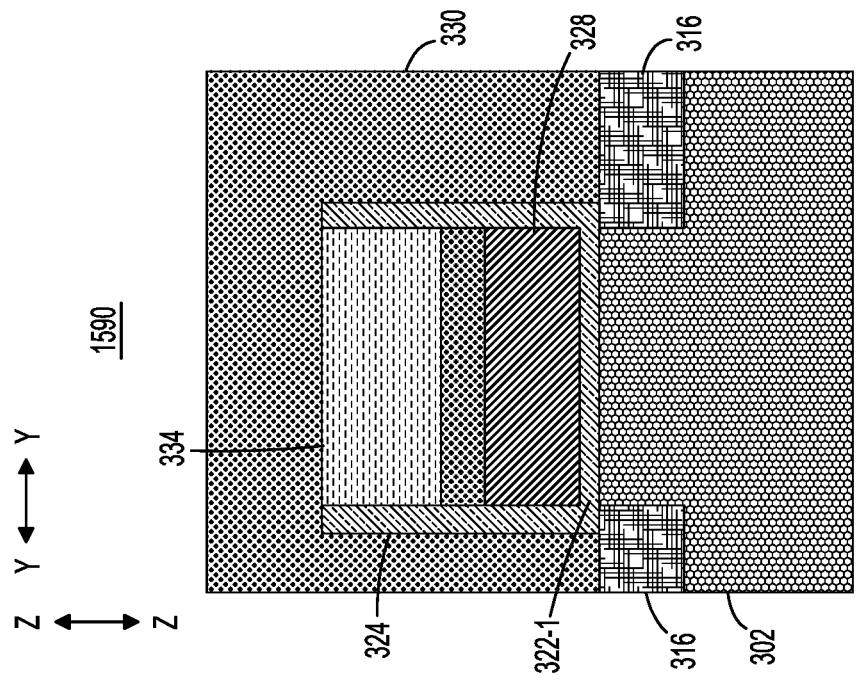
Figure 15D:
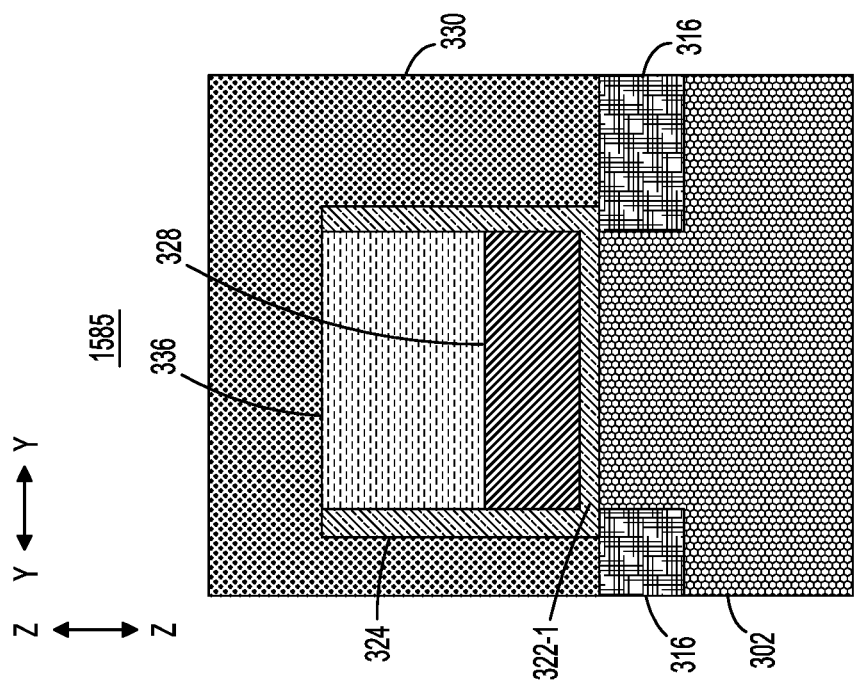

FIG. 15A shows a first side cross-sectional view 1500 of the structure of FIGS. 14A-14E following selective removal of the second HM layer 314. FIGS. 15B, 15D and 15E show respective second, third and fourth side cross-sectional views 1565, 1585 and 1590 of the structure of FIGS. 14A-14E following the selective removal of the second HM layer 314. FIG. 15C shows a top-down view 1575 illustrating where the side cross-sectional views 1500, 1565, 1585 and 1590 of FIGS. 15A, 15B, 15D and 15E are taken. The first side cross-sectional view 1500 of FIG. 15A is taken along the line A-A (e.g., along the gate region 303) in the top-down view 1575 of FIG. 15C, while the third and fourth side cross-sectional views 1585 and 1590 of FIGS. 15D and 15E are taken along the lines D-D and E-E respectively (e.g., in the same direction as A-A, but on opposite sides of the gate region 303). The second side cross-sectional view 1565 of FIG. 15B is taken along the line B-B (e.g., across the gate region 303) in the top-down view 1575 of FIG. 15C.

The second HM layer 314 may be removed using any suitable etch processing that removes the material of the second HM layer 314 selective to the material of the first HM layer 310.

Figure 16E:
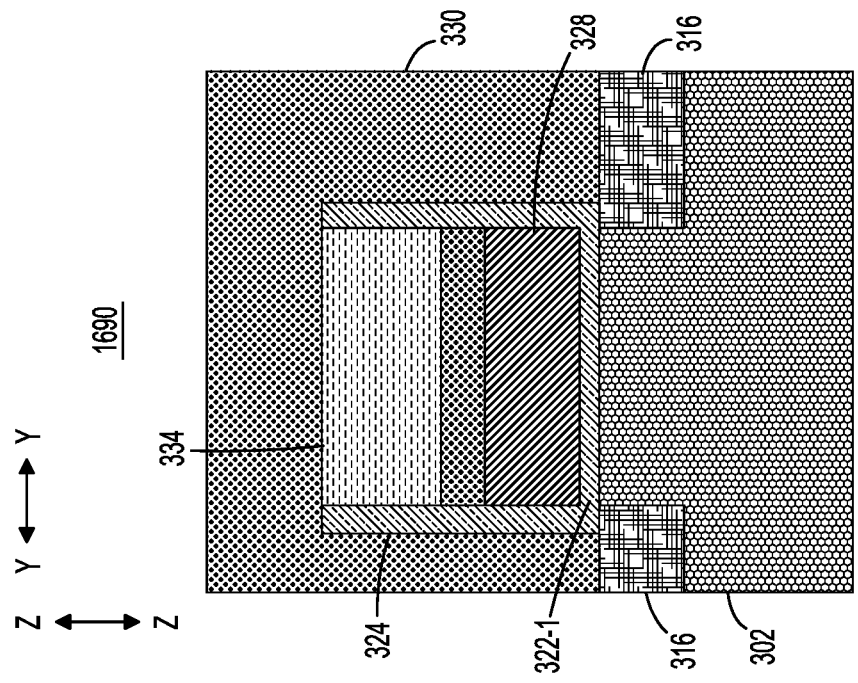
Figure 16D:
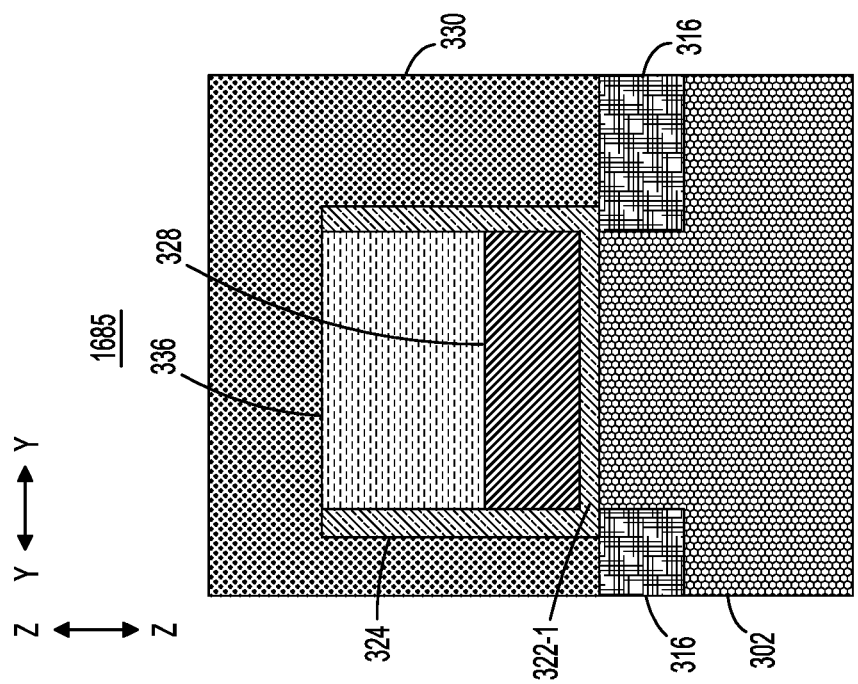

FIG. 16A shows a first side cross-sectional view 1600 of the structure of FIGS. 15A-15E following a cut of top channel portions of the nanosheet stack. FIGS. 16B, 16D and 16E show respective second, third and fourth side cross-sectional views 1665, 1685 and 1690 of the structure of FIGS. 15A-15E following the cut of the top channel portions of the nanosheet stack. FIG. 16C shows a top-down view 1675 illustrating where the side cross-sectional views 1600, 1665, 1685 and 1690 of FIGS. 16A, 16B, 16D and 16E are taken. The first side cross-sectional view 1600 of FIG. 16A is taken along the line A-A (e.g., along the gate region 303) in the top-down view 1675 of FIG. 16C, while the third and fourth side cross-sectional views 1685 and 1690 of FIGS. 16D and 16E are taken along the lines D-D and E-E respectively (e.g., in the same direction as A-A, but on opposite sides of the gate region 303). The second side cross-sectional view 1665 of FIG. 16B is taken along the line B-B (e.g., across the gate region 303) in the top-down view 1675 of FIG. 16C.

The cut of the top channel portions of the nanosheet stack includes etching (e.g., using RIE or other suitable processing) through exposed portions of the sacrificial layers 308 and nanosheet channel layers 306-2 for the top transistor. The etching stops on the MDI layer 322-2.

Figure 17E:
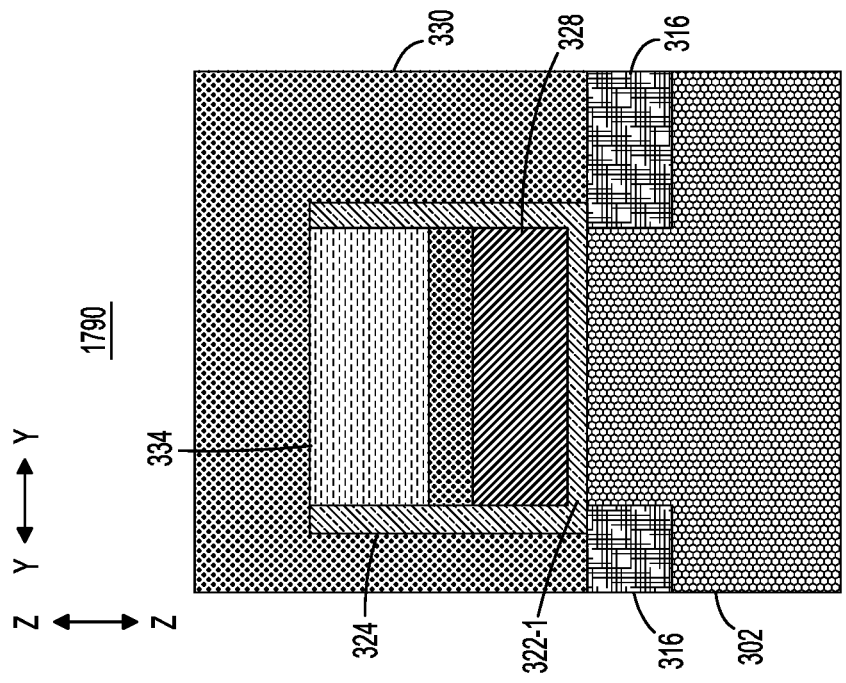
Figure 17D:
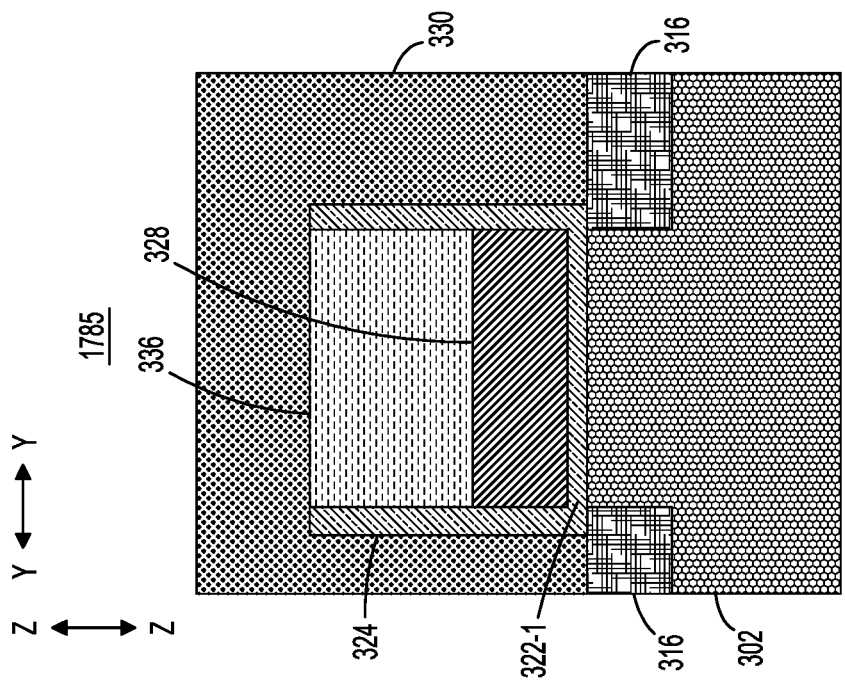

FIG. 17A shows a first side cross-sectional view 1700 of the structure of FIGS. 16A-16E following deposition and etch back of a liner 338. FIGS. 17B, 17D and 17E show respective second, third and fourth side cross-sectional views 1765, 1785 and 1790 of the structure of FIGS. 16A-16E following the deposition and etch back of the liner 338. FIG. 17C shows a top-down view 1775 illustrating where the side cross-sectional views 1700, 1765, 1785 and 1790 of FIGS. 17A, 17B, 17D and 17E are taken. The first side cross-sectional view 1700 of FIG. 17A is taken along the line A-A (e.g., along the gate region 303) in the top-down view 1775 of FIG. 17C, while the third and fourth side cross-sectional views 1785 and 1790 of FIGS. 17D and 17E are taken along the lines D-D and E-E respectively (e.g., in the same direction as A-A, but on opposite sides of the gate region 303). The second side cross-sectional view 1765 of FIG. 17B is taken along the line B-B (e.g., across the gate region 303) in the top-down view 1775 of FIG. 17C.

Material for the liner 338 (e.g., SiN or another suitable material such as SiOCN, SiBCN, etc.) is deposited over the structure, and then etched back such that the material of the liner 338 remains only on sidewalls of the dummy gate 318 and portions of the sacrificial layers 308 and the top nanosheet channel layers 306-2 exposed by the cut of the top channel portions of the nanosheet stack. The liner 338 may have a thickness (in direction Y) in the range of 10-50 nm.

Figure 18E:
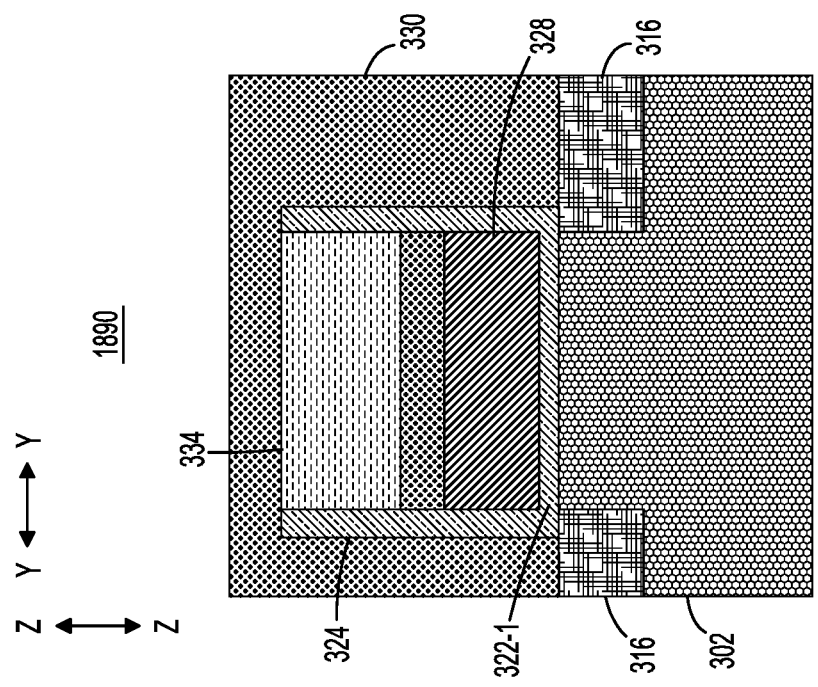
Figure 18D:
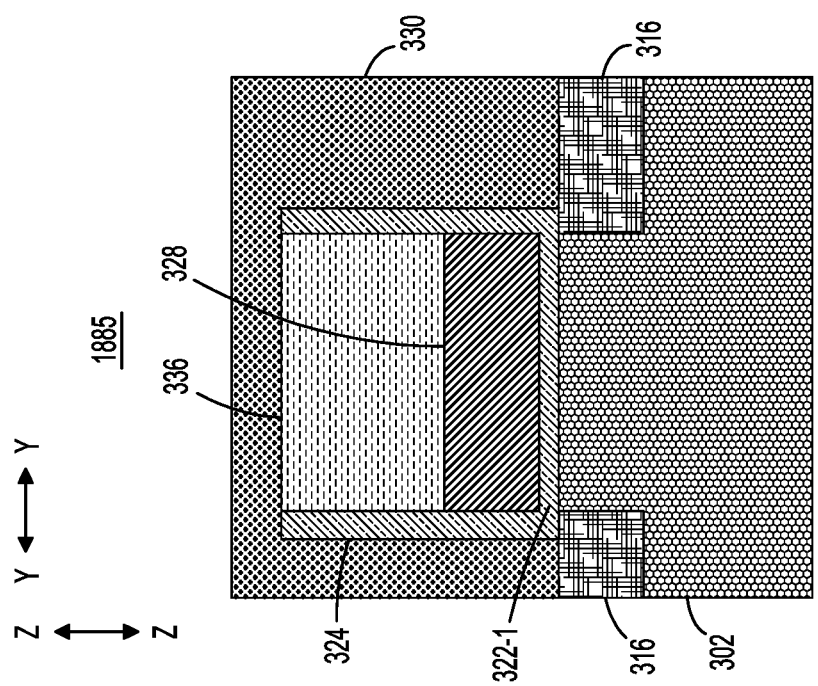

FIG. 18A shows a first side cross-sectional view 1800 of the structure of FIGS. 17A-17E following fill and planarization of additional material for the ILD layer 330. FIGS. 18B, 18D and 18E show respective second, third and fourth side cross-sectional views 1865, 1885 and 1890 of the structure of FIGS. 17A-17E following the fill and planarization of the additional material for the ILD layer 330. FIG. 18C shows a top-down view 1875 illustrating where the side cross-sectional views 1800, 1865, 1885 and 1890 of FIGS. 18A, 18B, 18D and 18E are taken. The first side cross-sectional view 1800 of FIG. 18A is taken along the line A-A (e.g., along the gate region 303) in the top-down view 1875 of FIG. 18C, while the third and fourth side cross-sectional views 1885 and 1890 of FIGS. 18D and 18E are taken along the lines D-D and E-E respectively (e.g., in the same direction as A-A, but on opposite sides of the gate region 303). The second side cross-sectional view 1865 of FIG. 18B is taken along the line B-B (e.g., across the gate region 303) in the top-down view 1875 of FIG. 18C.

The additional material for the ILD layer 330 may be deposited to overfill the structure, followed by planarization (e.g., using CMP or other suitable processing, stopping on the top surface of the dummy gate 318) to result in the structure shown in FIGS. 18A-18E.

Figure 19E:
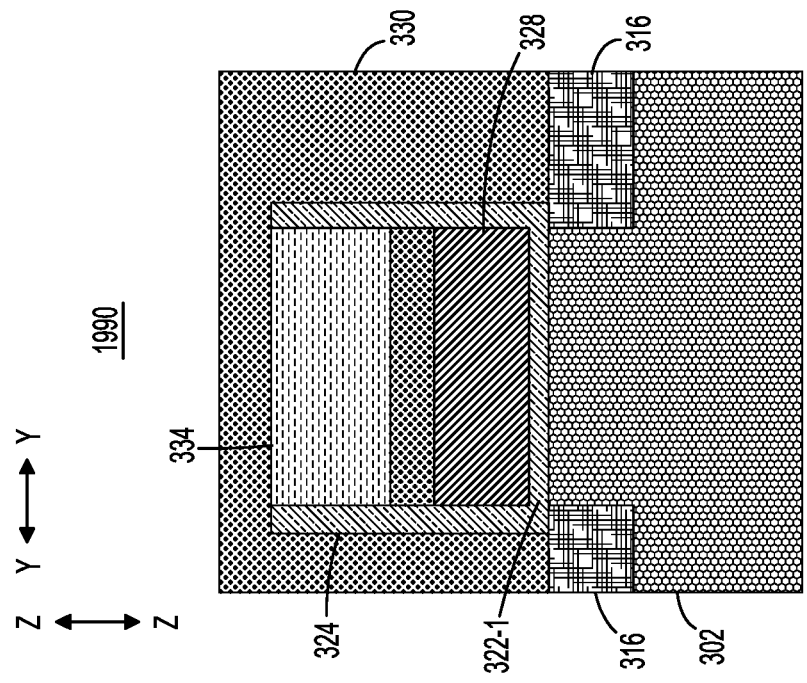
Figure 19D:
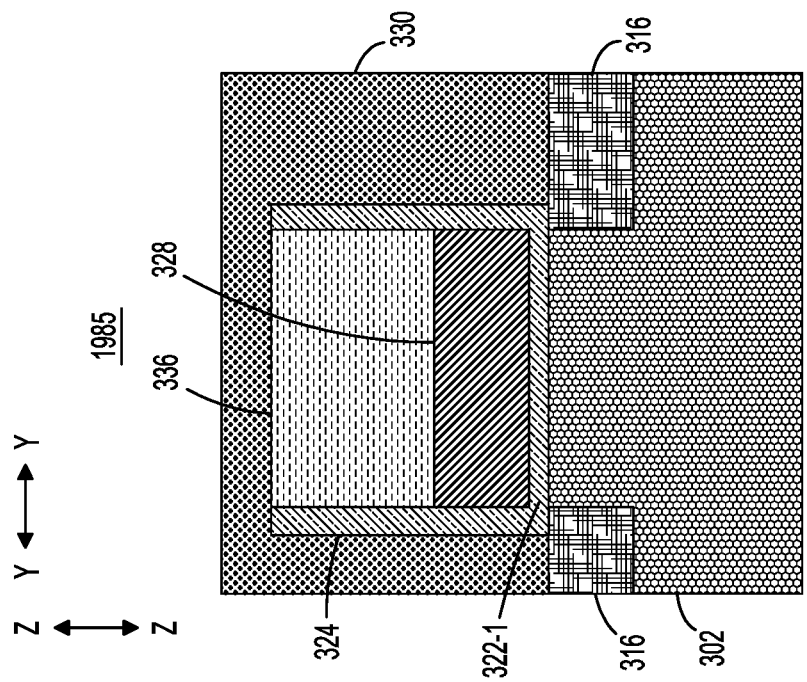

FIG. 19A shows a first side cross-sectional view 1900 of the structure of FIGS. 18A-18E following etch back of the liner 338. The etch back processing removes the liner 338, such that there are gaps between the ILD layer 330 and the dummy gate 318 and the top portion of the nanosheet stack. FIGS. 19B, 19D and 19E show respective second, third and fourth side cross-sectional views 1965, 1985 and 1990 of the structure of FIGS. 18A-18E following the etch back of the liner 338. FIG. 19C shows a top-down view 1975 illustrating where the side cross-sectional views 1900, 1965, 1985 and 1990 of FIGS. 19A, 19B, 19D and 19E are taken. The first side cross-sectional view 1900 of FIG. 19A is taken along the line A-A (e.g., along the gate region 303) in the top-down view 1975 of FIG. 19C, while the third and fourth side cross-sectional views 1985 and 1990 of FIGS. 19D and 19E are taken along the lines D-D and E-E respectively (e.g., in the same direction as A-A, but on opposite sides of the gate region 303). The second side cross-sectional view 1965 of FIG. 19B is taken along the line B-B (e.g., across the gate region 303) in the top-down view 1975 of FIG. 19C.

Figure 20C:
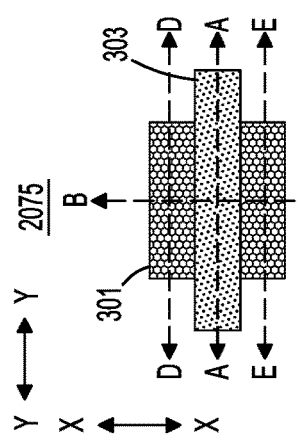
FIGS. 20A-20E show views of the structure of FIG. 19A-19E following removal of the dummy gate and sacrificial layers of the nanosheet stack, according to an embodiment of the invention.
Figure 20B:
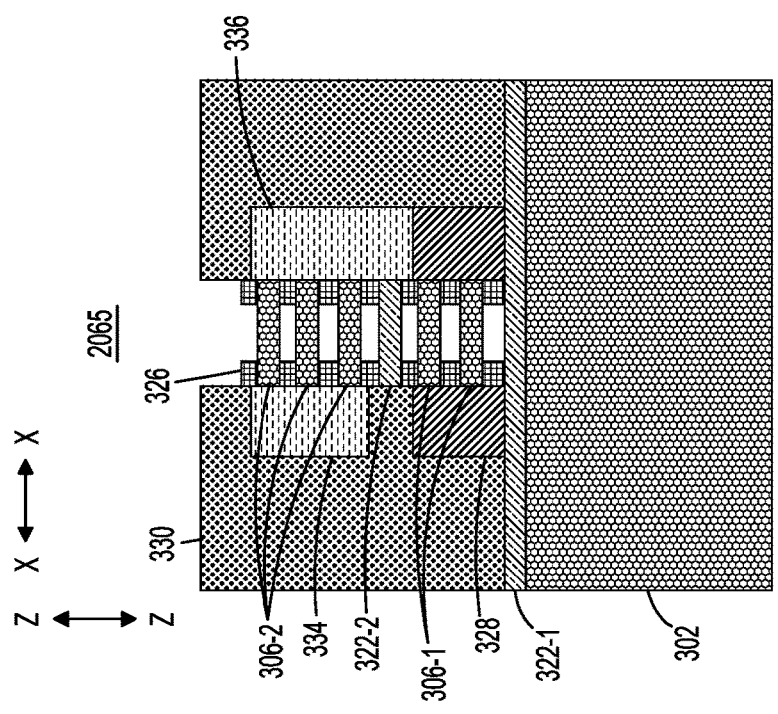
Figure 20A:
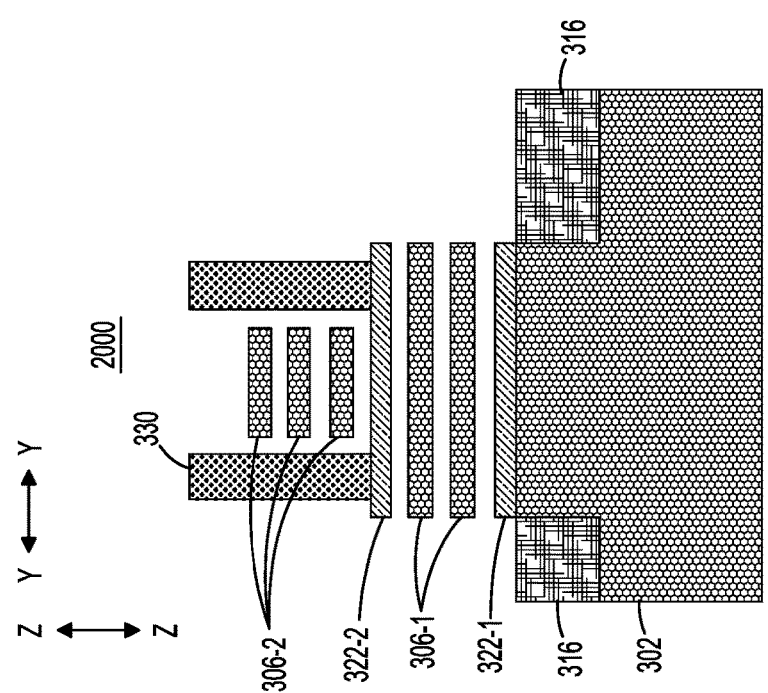
Figure 20E:
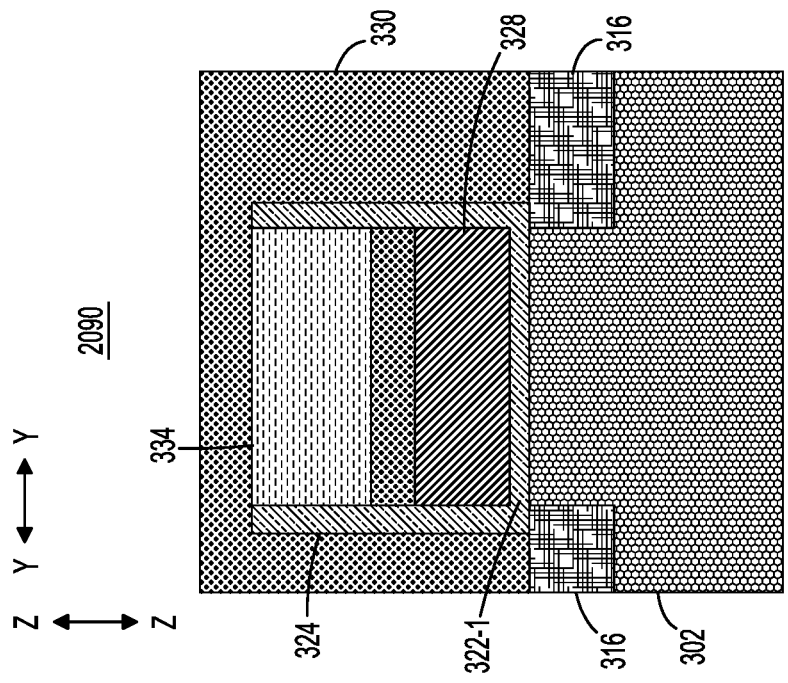
Figure 20D:
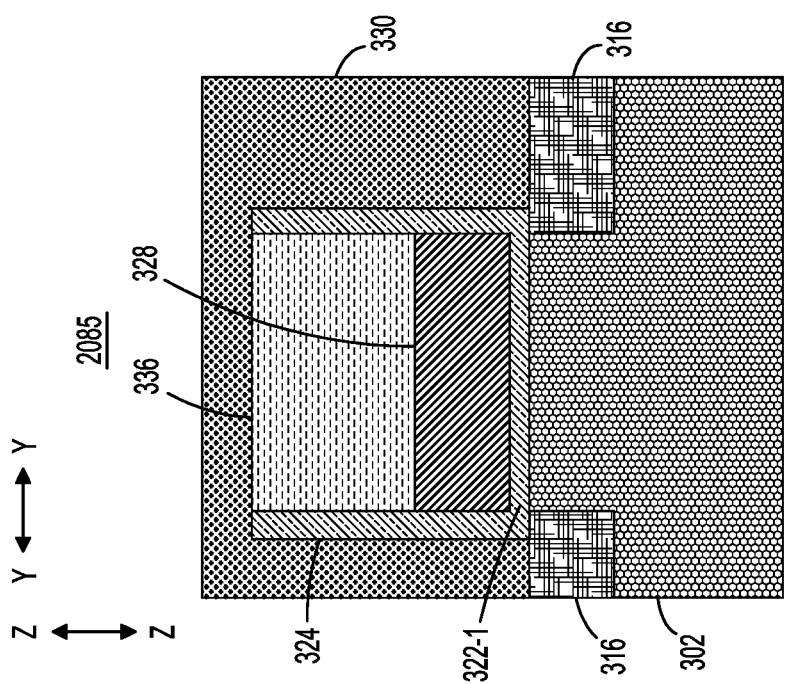

FIG. 20A shows a first side cross-sectional view 2000 of the structure of FIGS. 19A-19E following removal of the dummy gate 318 and the sacrificial layers 308 of the nanosheet stack. The dummy gate 318 and the sacrificial layers 308 may be removed using any suitable etch processing that removes the materials of the dummy gate 318 and the sacrificial layers 308 selective to the material of the top nanosheet channel layers 306-2. The dummy gate 318 may be removed first, followed by removal of the sacrificial layers 308 (e.g., using SiGe release or other suitable processing). FIGS. 20B, 20D and 20E show respective second, third and fourth side cross-sectional views 2065, 2085 and 2090 of the structure of FIGS. 19A-19E following the removal of the dummy gate 318 and the sacrificial layers 308 of the nanosheet stack. FIG. 20C shows a top-down view 2075 illustrating where the side cross-sectional views 2000, 2065, 2085 and 2090 of FIGS. 20A, 20B, 20D and 20E are taken. The first side cross-sectional view 2000 of FIG. 20A is taken along the line A-A (e.g., along the gate region 303) in the top-down view 2075 of FIG. 20C, while the third and fourth side cross-sectional views 2085 and 2090 of FIGS. 20D and 20E are taken along the lines D-D and E-E respectively (e.g., in the same direction as A-A, but on opposite sides of the gate region 303). The second side cross-sectional view 2065 of FIG. 20B is taken along the line B-B (e.g., across the gate region 303) in the top-down view 2075 of FIG. 20C.

Figure 21E:
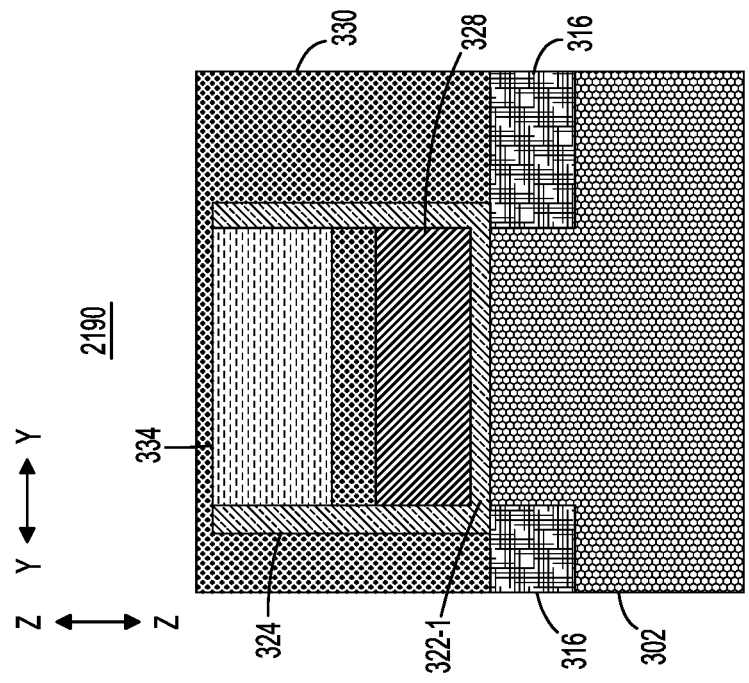
Figure 21D:
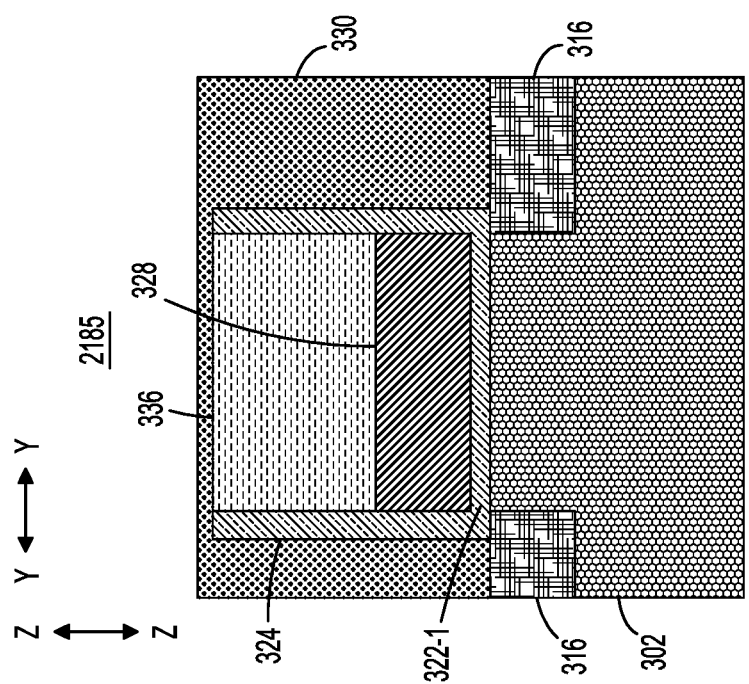

FIG. 21A shows a first side cross-sectional view 2100 of the structure of FIGS. 20A-20E following formation of a gate stack 340. FIGS. 21B, 21D and 21E show respective second, third and fourth side cross-sectional views 2165, 2185 and 2190 of the structure of FIGS. 20A-20E following the formation of the gate stack 340. FIG. 21C shows a top-down view 2175 illustrating where the side cross-sectional views 2100, 2165, 2185 and 2190 of FIGS. 21A, 21B, 21D and 21E are taken. The first side cross-sectional view 2100 of FIG. 21A is taken along the line A-A (e.g., along the gate region 303) in the top-down view 2175 of FIG. 21C, while the third and fourth side cross-sectional views 2185 and 2190 of FIGS. 21D and 21E are taken along the lines D-D and E-E respectively (e.g., in the same direction as A-A, but on opposite sides of the gate region 303). The second side cross-sectional view 2165 of FIG. 21B is taken along the line B-B (e.g., across the gate region 303) in the top-down view 2175 of FIG. 21C.

The gate stack 340 may include a gate dielectric layer and a gate conductor layer. The gate dielectric layer may comprise a high-k dielectric material. Examples of high-k dielectric materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k dielectric material may further include dopants such as lanthanum (La), aluminum (Al), and magnesium (Mg). The gate dielectric layer may have a uniform thickness in the range of 1 nm to 3 nm.

The gate conductor layer may comprise a metal gate or work function metal (WFM). For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for gate conductors as desired.

Figure 22E:
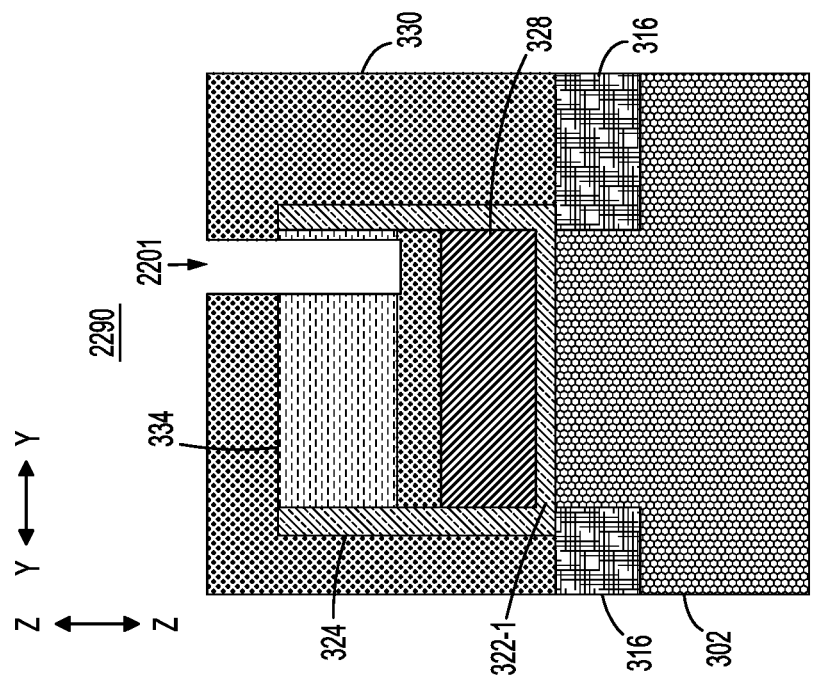
Figure 22D:
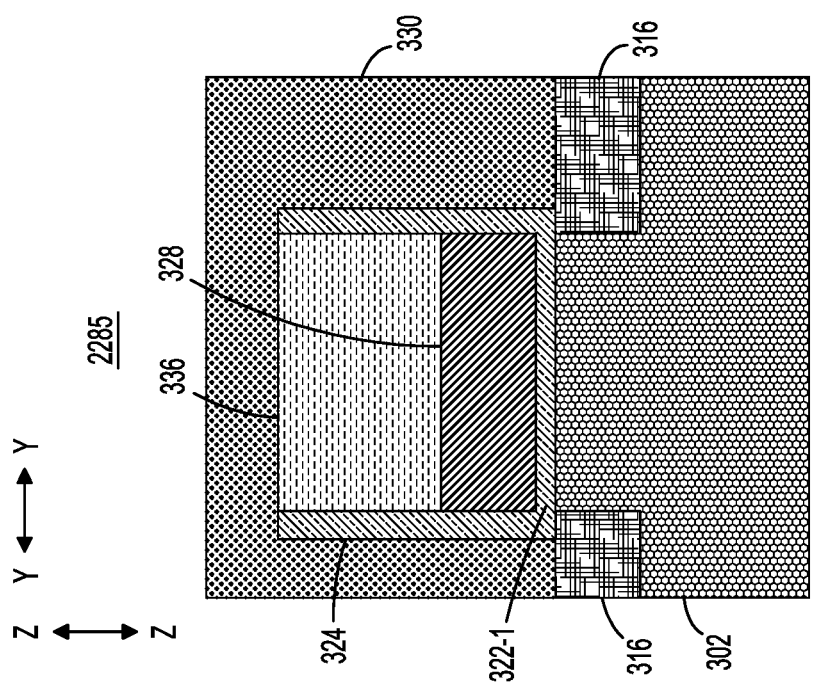
Figure 22F:
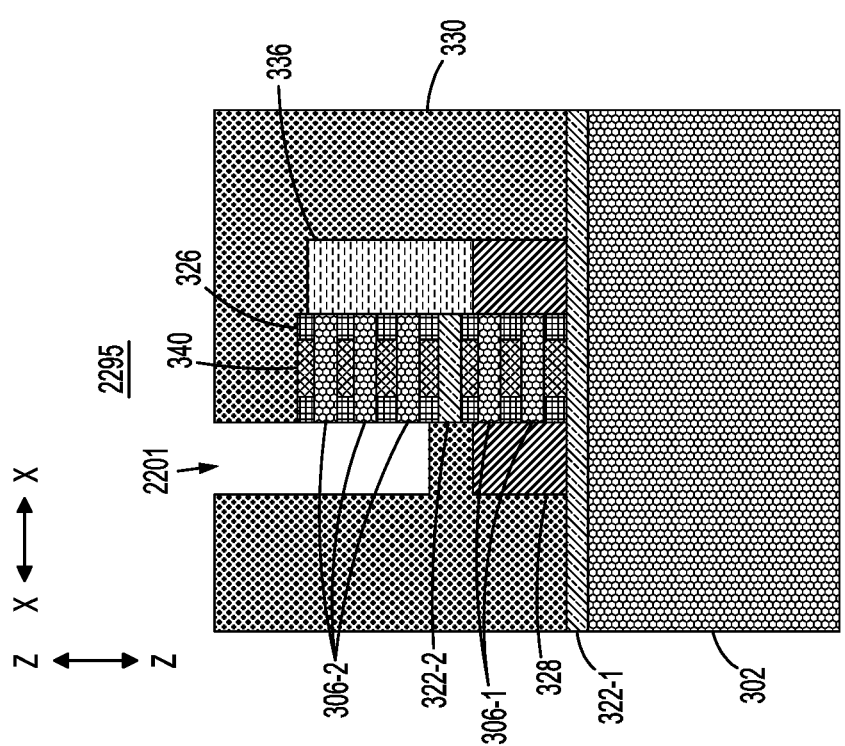

FIG. 22A shows a first side cross-sectional view 2200 of the structure of FIGS. 21A-21E following patterning of an opening 2201 for a contact to the bottom epitaxial layer 328. FIGS. 22B, 22D, 22E and 22F show respective second, third, fourth and fifth side cross-sectional views 2265, 2285, 2290 and 2295 of the structure of FIGS. 21A-21E following the patterning of the opening 2201 for the contact to the bottom epitaxial layer 328. FIG. 22C shows a top-down view 2275 illustrating where the side cross-sectional views 2200, 2265, 2285, 2290 and 2295 of FIGS. 22A, 22B, 22D, 22E and 22F are taken. The first side cross-sectional view 2200 of FIG. 22A is taken along the line A-A (e.g., along the gate region 303) in the top-down view 2275 of FIG. 22C, while the third and fourth side cross-sectional views 2285 and 2290 of FIGS. 22D and 22E are taken along the lines D-D and E-E respectively (e.g., in the same direction as A-A, but on opposite sides of the gate region 303). The second and fifth side cross-sectional views 2265 and 2295 of FIGS. 22B and 22F are taken along the lines B-B and F-F (e.g., across the gate region 303) in the top-down view 2275 of FIG. 22C.

To pattern the opening 2201, additional material for the ILD layer 330 may first be deposited, followed by patterning of a mask that exposes the region where the opening 2201 is formed. The exposed portion of the ILD layer 330 is then etched through, followed by etching of an underlying exposed portion of the top epitaxial layer 334.

Figure 23E:
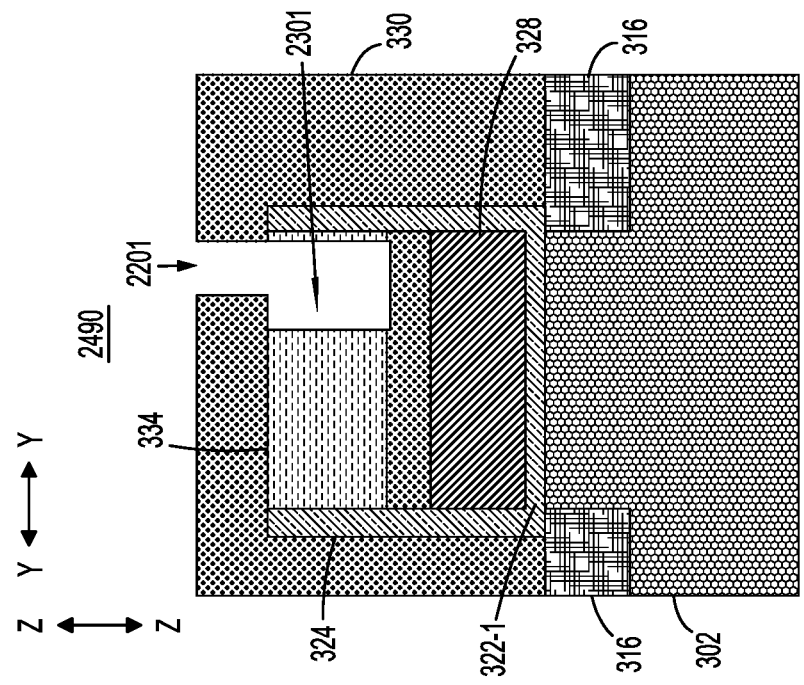
Figure 23D:
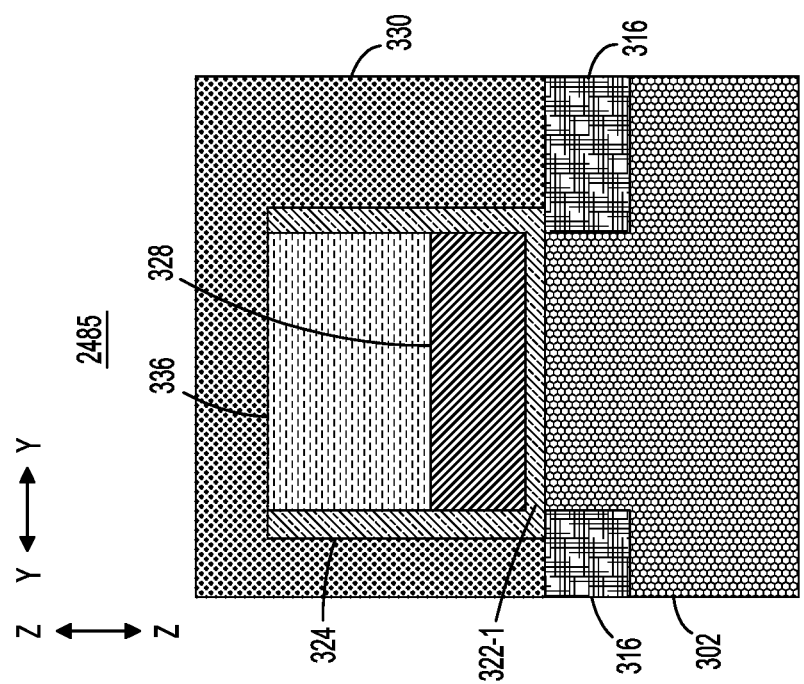
Figure 23F:
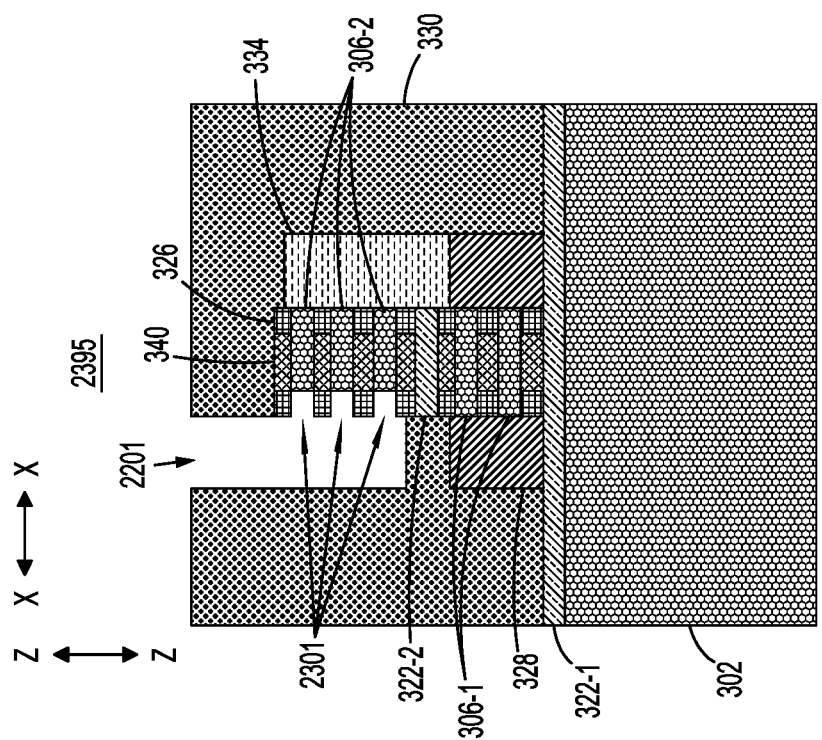

FIG. 23A shows a first side cross-sectional view 2300 of the structure of FIGS. 22A-22F following lateral recess of the opening 2201. FIGS. 23B, 23D, 23E and 23F show respective second, third, fourth and fifth side cross-sectional views 2365, 2385, 2390 and 2395 of the structure of FIGS. 22A-22F following the lateral recess of the opening 2201. FIG. 23C shows a top-down view 2375 illustrating where the side cross-sectional views 2300, 2365, 2385, 2390 and 2395 of FIGS. 23A, 23B, 23D, 23E and 23F are taken. The first side cross-sectional view 2300 of FIG. 23A is taken along the line A-A (e.g., along the gate region 303) in the top-down view 2375 of FIG. 23C, while the third and fourth side cross-sectional views 2385 and 2390 of FIGS. 23D and 23E are taken along the lines D-D and E-E respectively (e.g., in the same direction as A-A, but on opposite sides of the gate region 303). The second and fifth side cross-sectional views 2365 and 2395 of FIGS. 23B and 23F are taken along the lines B-B and F-F (e.g., across the gate region 303) in the top-down view 2375 of FIG. 23C.

The lateral recess of the opening 2201 removes parts of the top epitaxial layer 334 and the top nanosheet channel layers 306-2 which are exposed by the opening 2201. The lateral recess is shown in regions 2301. The laterally recessed regions 2301 may extend to a depth (in direction Y) in the range of 5-30 nm.

Figure 24E:
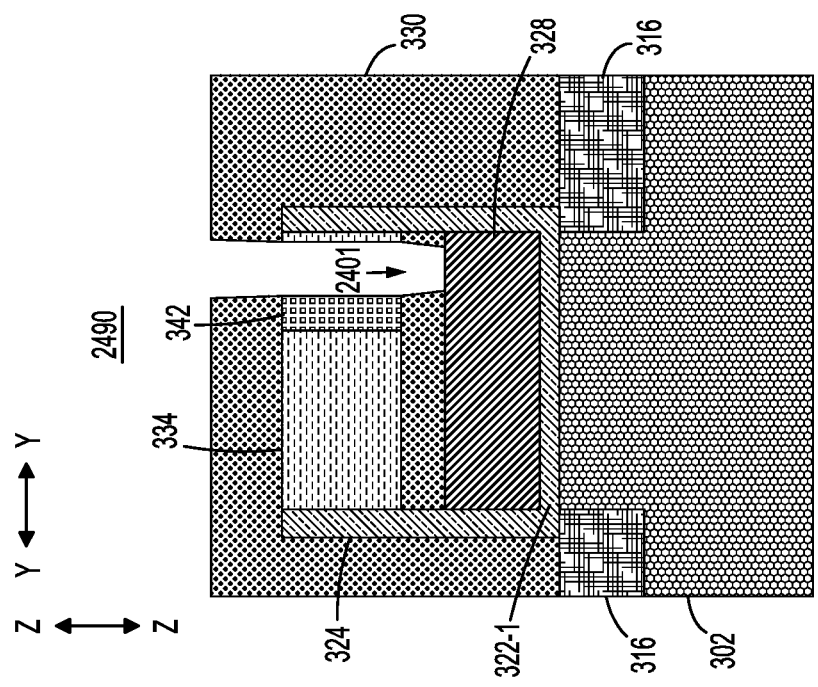
Figure 24D:
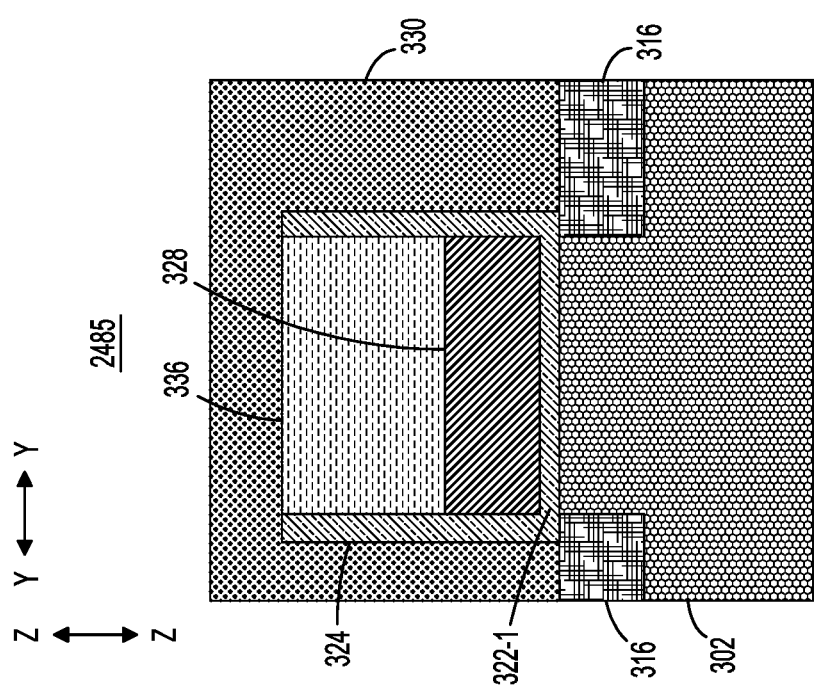
Figure 24F:
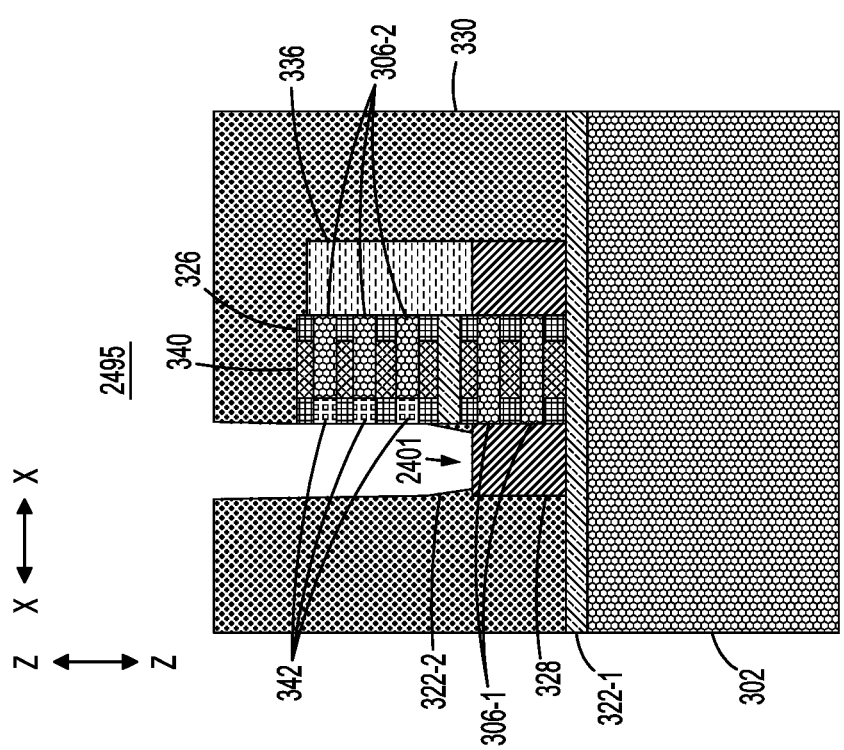

FIG. 24A shows a first side cross-sectional view 2400 of the structure of FIGS. 23A-23F following formation of a dielectric isolation layer 342 in the laterally recessed regions 2301, and following further patterning of an opening 2401 to the bottom epitaxial layer 328. FIGS. 24B, 24D, 24E and 24F show respective second, third, fourth and fifth side cross-sectional views 2465, 2485, 2490 and 2495 of the structure of FIGS. 23A-23F following the formation of the dielectric isolation layer 342 in the laterally recessed regions 2301 and following the further patterning of the opening 2401 to the bottom epitaxial layer 328. FIG. 24C shows a top-down view 2475 illustrating where the side cross-sectional views 2400, 2465, 2485, 2490 and 2495 of FIGS. 24A, 24B, 24D, 24E and 24F are taken. The first side cross-sectional view 2400 of FIG. 24A is taken along the line A-A (e.g., along the gate region 303) in the top-down view 2475 of FIG. 24C, while the third and fourth side cross-sectional views 2485 and 2490 of FIGS. 24D and 24E are taken along the lines D-D and E-E respectively (e.g., in the same direction as A-A, but on opposite sides of the gate region 303). The second and fifth side cross-sectional views 2465 and 2495 of FIGS. 24B and 24F are taken along the lines B-B and F-F (e.g., across the gate region 303) in the top-down view 2475 of FIG. 24C.

The dielectric isolation layer 342 may be formed using isotropic atomic layer deposition (ALD) or other suitable processing. The dielectric isolation layer 342 may be formed of $SiO_2$, SiN, SiBCN, SiOCN or another suitable material. Once the dielectric isolation layer 342 is formed, further etching of the ILD layer 330 is performed to form the opening 2401 which extends down to a top surface of the bottom epitaxial layer 328.

Figures 25D, 25E:
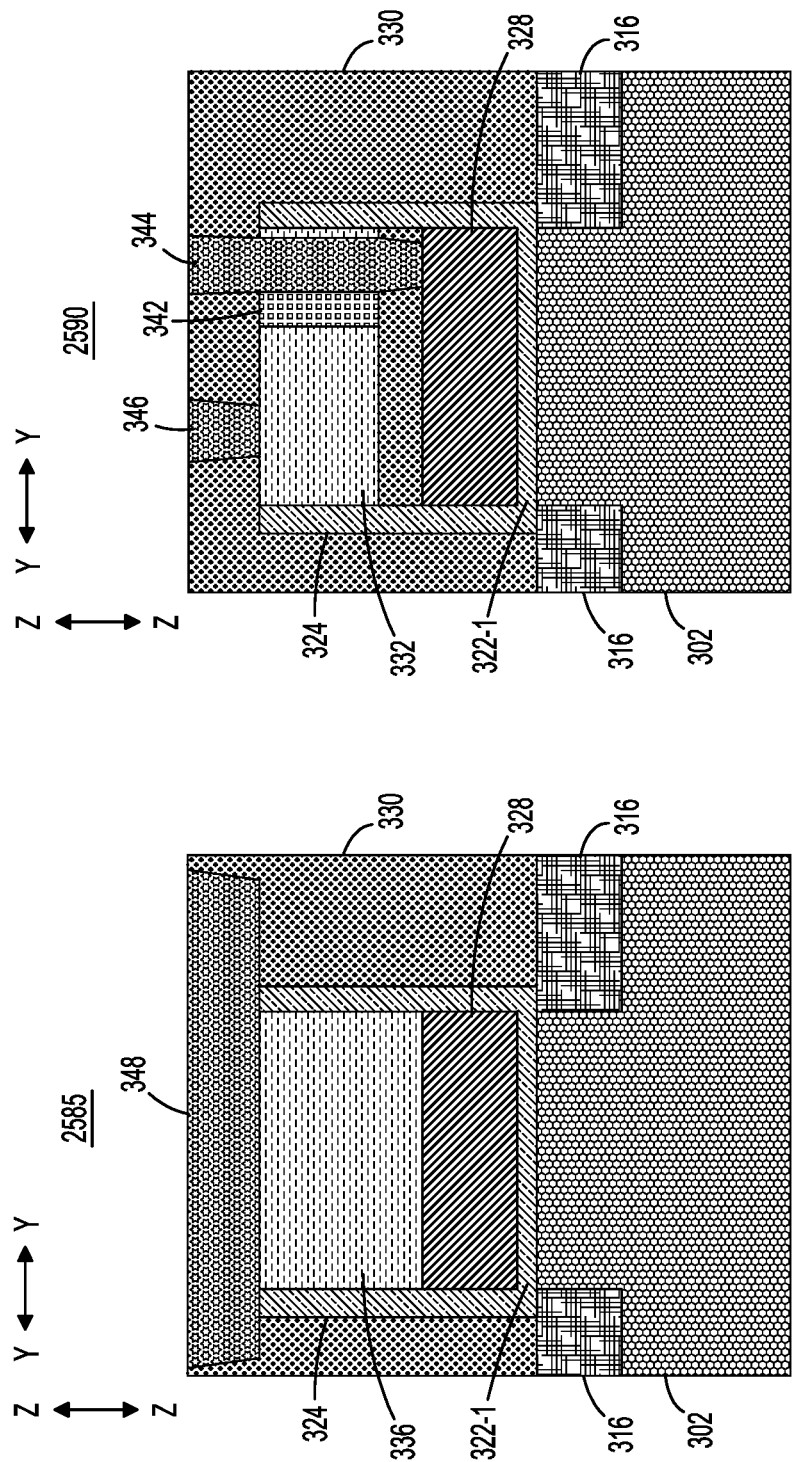
Figure 25F:
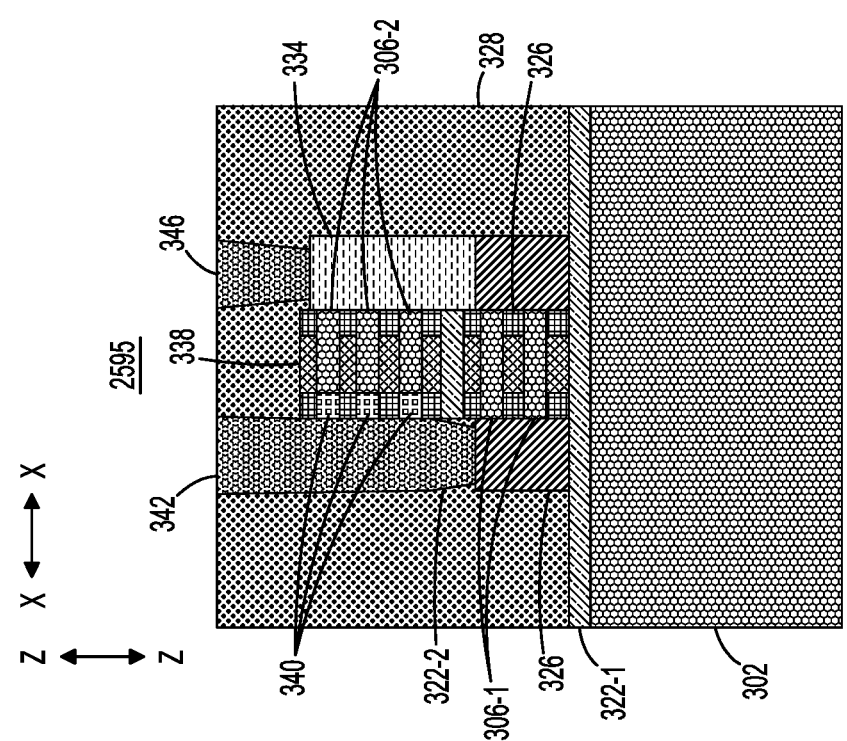

FIG. 25A shows a first side cross-sectional view 2500 of the structure of FIGS. 24A-24F following formation of a bottom epitaxial contact 344, a top epitaxial contact 346, a common epitaxial contact 348, gate contact 350, and gate contact 352. FIGS. 25B, 25D, 25E and 25F show respective second, third, fourth and fifth side cross-sectional views 2565, 2585, 2590 and 2595 of the structure of FIGS. 24A-24F following the formation of the bottom epitaxial contact 344, the top epitaxial contact 346, the common epitaxial contact 348, the gate contact 350 and the gate contact 352. FIG. 25C shows a top-down view 2575 illustrating where the side cross-sectional views 2500, 2565, 2585, 2590 and 2595 of FIGS. 25A, 25B, 25D, 25E and 25F are taken. The first side cross-sectional view 2500 of FIG. 25A is taken along the line A-A (e.g., along the gate region 303) in the top-down view 2575 of FIG. 25C, while the third and fourth side cross-sectional views 2585 and 2590 of FIGS. 25D and 25E are taken along the lines D-D and E-E respectively (e.g., in the same direction as A-A, but on opposite sides of the gate region 303). The second and fifth side cross-sectional views 2565 and 2595 of FIGS. 25B and 25F are taken along the lines B-B and F-F (e.g., across the gate region 303) in the top-down view 2575 of FIG. 25C.

To form the bottom epitaxial contact 344, the top epitaxial contact 346, the common epitaxial contact 348, the gate contact 350 and the gate contact 352, openings are formed in the ILD layer 330. The opening 2401 for the bottom epitaxial contact 344 is formed as described above. Additional openings for the top epitaxial contact 346, the common epitaxial contact 348, the gate contact 350 and the gate contact 352 may be formed by masking portions of the ILD layer 330 and etching to expose portions of the top epitaxial layer 334, the common epitaxial layer 336, and portions of the gate stack 340. A first opening is formed to a first portion of the gate stack 340 surrounding the top nanosheet channel layers 306-2 for the gate contact 350 (e.g., for the upper transistor of the stacked transistors), and a second opening is formed to a second portion of the gate stack 340 which surrounds the bottom nanosheet channel layers 306-1 for the gate contact 352 (e.g., for the lower transistor of the stacked transistors).

Contact material for the bottom epitaxial contact 344, the top epitaxial contact 346, the common epitaxial contact 348, the gate contact 350 and the gate contact 352 is deposited in the openings, and is then planarized (e.g., using CMP or other suitable processing). The contact material may include a silicide layer such as titanium (Ti), nickel (Ni), nickel platinum (NiPt), etc., a metal adhesion layer (e.g., such as TiN) and a low resistance metal such as tungsten (W), ruthenium (Ru), cobalt (Co) or another suitable material.

Each of the bottom epitaxial contact 344, the top epitaxial contact 346, the common epitaxial contact 348, the gate contact 350 and the gate contact 352 may have a width (in direction X) in the range of 10-100 nm. The bottom epitaxial contact 344 and the top epitaxial contact 346 may have a width (in direction Y) in the range of 10-100 nm. The common epitaxial contact 348 may have a width (in direction Y) in the range of 30 nm or larger. The gate contacts 350 and 352 may each have a width (in direction Y) in the range of 10-100 nm.

Figure 26E:
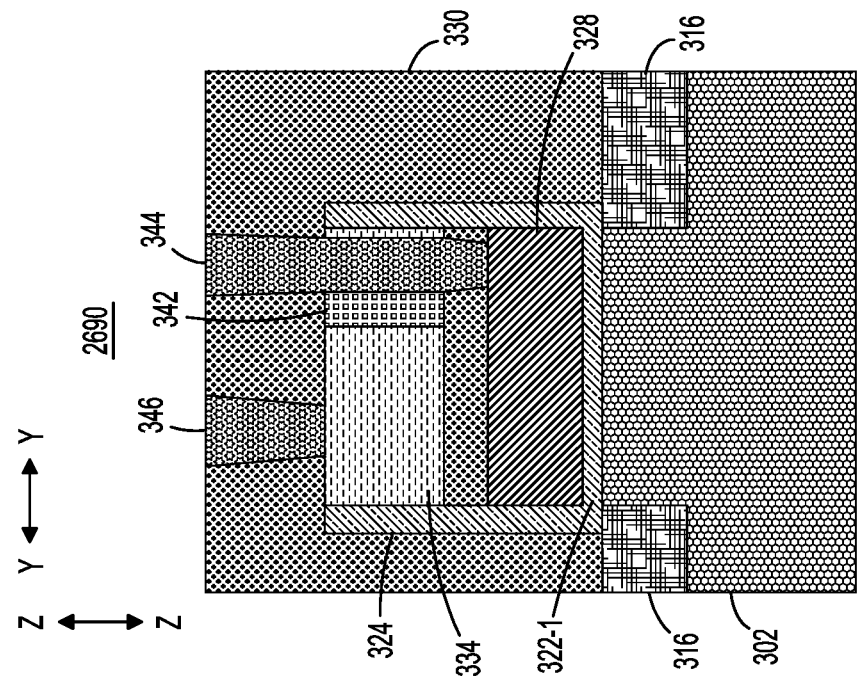
Figure 26D:
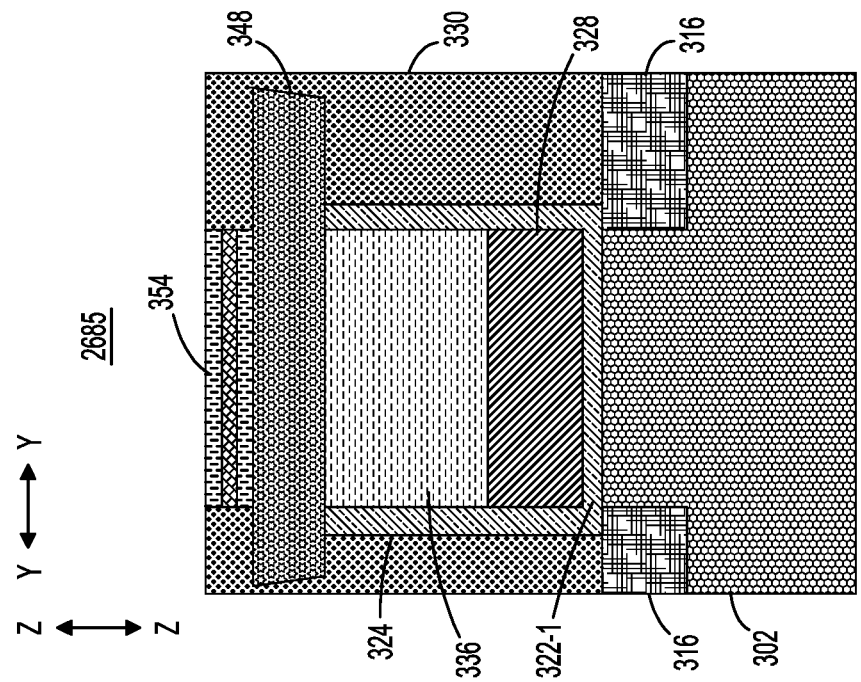
Figure 26F:
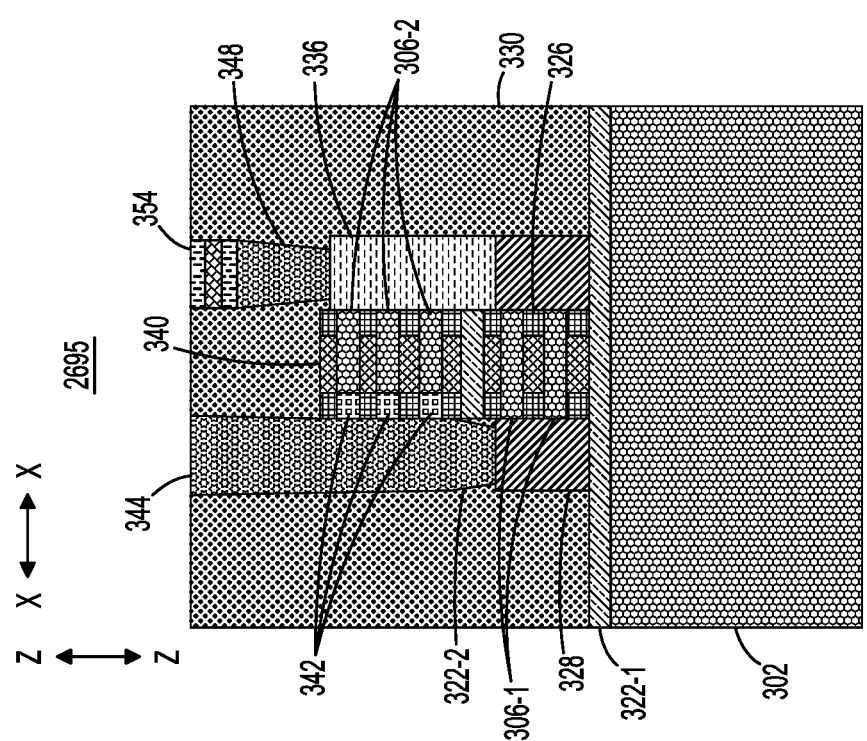

FIG. 26A shows a first side cross-sectional view 2600 of the structure of FIGS. 25A-25F following formation of a ReRAM cell 354 over a portion of the common epitaxial contact 348. FIGS. 26B, 26D, 26E and 26F show respective second, third, fourth and fifth side cross-sectional views 2665, 2685, 2690 and 2695 of the structure of FIGS. 25A-25F following the formation of the ReRAM cell 354 over the portion of the common epitaxial contact 348. FIG. 26C shows a top-down view 2675 illustrating where the side cross-sectional views 2600, 2665, 2685, 2690 and 2695 of FIGS. 26A, 26B, 26D, 26E and 26F are taken. The first side cross-sectional view 2600 of FIG. 26A is taken along the line A-A (e.g., along the gate region 303) in the top-down view 2675 of FIG. 26C, while the third and fourth side cross-sectional views 2685 and 2690 of FIGS. 26D and 26E are taken along the lines D-D and E-E respectively (e.g., in the same direction as A-A, but on opposite sides of the gate region 303). The second and fifth side cross-sectional views 2665 and 2695 of FIGS. 26B and 26F are taken along the lines B-B and F-F (e.g., across the gate region 303) in the top-down view 2675 of FIG. 26C.

The ReRAM cell 354 may include top and bottom electrodes which are separated by a switching medium. Additional material for the ILD layer 330 may be deposited, followed by patterning of an opening for the ReRAM cell 354. The ReRAM cell 354 is then formed. Additional openings may be formed in the ILD layer 330 to expose the bottom epitaxial contact 344, the top epitaxial contact 346, the gate contact 350 and the gate contact 352, with additional contact material being formed in such openings such that the bottom epitaxial contact 344, the top epitaxial contact 346, the gate contact 350 and the gate contact 352 extend from a top of the ILD layer 330 (which is coplanar with the top of the ReRAM cell 354) down to the bottom epitaxial layer 328, the top epitaxial layer 334 and the first and second portions of the gate stack 340.

Figure 27B:
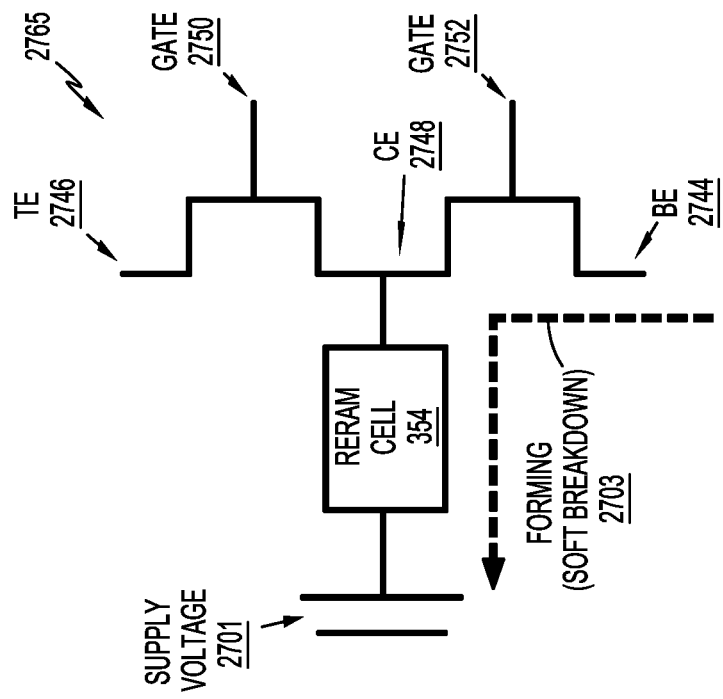
FIG. 27B shows a circuit diagram of the forming operation for the resistive random-access memory cell, according to an embodiment of the invention.
Figure 27A:
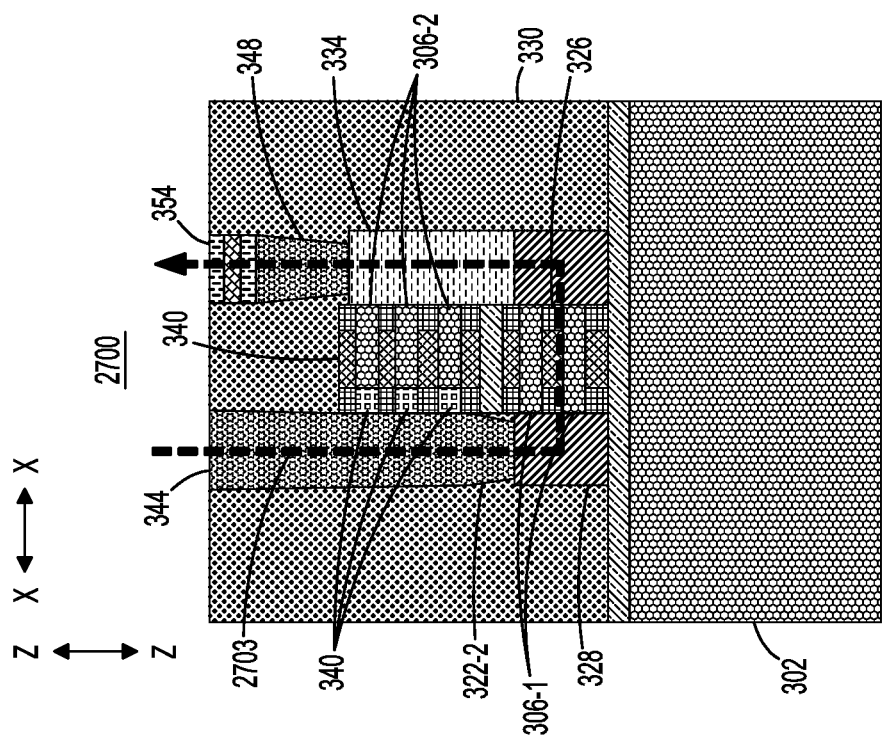
FIG. 27A shows a side cross-sectional view of the structure of FIGS. 26A-26F illustrating a forming operation for the resistive random-access memory cell, according to an embodiment of the invention.

Operation of the ReRAM cell 354 will now be described with respect to FIGS. 27A-27D. FIG. 27A shows a side cross-sectional view 2700 similar to that of FIG. 26F, with a dashed line illustrating flow of current for a forming operation 2703. FIG. 27B shows a corresponding circuit diagram 2765, illustrating the circuit interconnections of the ReRAM cell 354 with respect to a supply voltage 2701, a common electrode (CE) 2748 (e.g., the common epitaxial contact 348), a bottom electrode (BE) 2744 (e.g., the bottom epitaxial contact 344), a top electrode (TE) 2746 (e.g., the top epitaxial contact 346), and gates 2750 and 2752 (e.g., the gate contacts 350 and 352).

FIG. 27C shows a side cross-sectional view 2775 similar to that of FIG. 26B, with a dashed line illustrating flow of current for a memory reading/writing operation 2705. FIG. 27D shows a corresponding circuit diagram 2785, illustrating the circuit interconnections of the ReRAM cell 354 with respect to the supply voltage 2701, the CE 2748 (e.g., the common epitaxial contact 348), the BE 2744 (e.g., the bottom epitaxial contact 344), the TE 2746 (e.g., the top epitaxial contact 346), and the gates 2750 and 2752 (e.g., the gate contacts 350 and 352).

Figure 28:
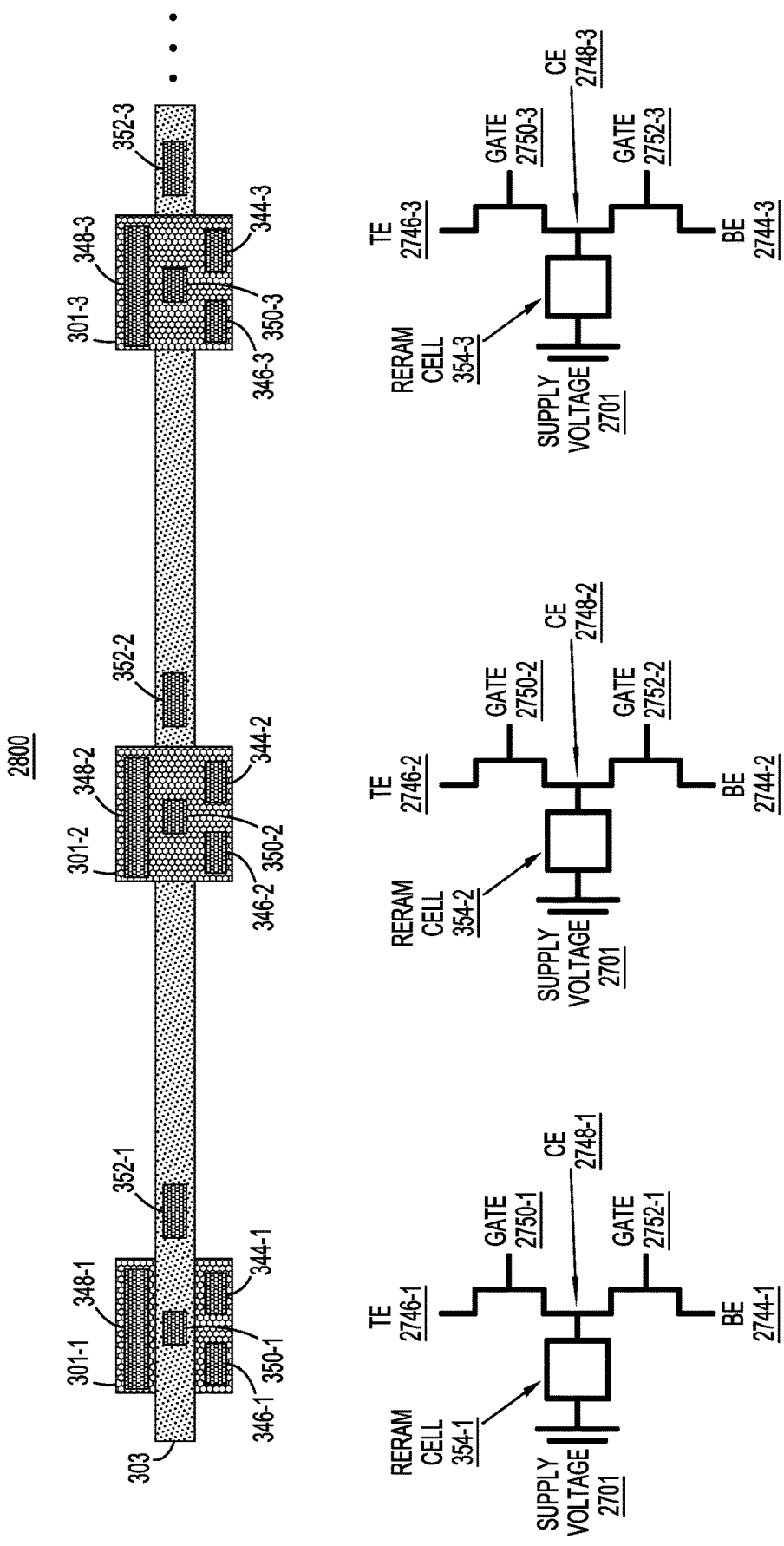
FIG. 28 shows a top-down view and corresponding circuit diagram of an array of resistive random-access memory cell structures with stacked transistors, according to an embodiment of the invention.

FIG. 28 shows a top-down view 2800 and corresponding circuit diagram for an array of ReRAM cell structures with stacked transistors. The top-down view 2800 is similar to the top-down view 2675 of FIG. 26C, but with multiple instances of the bottom epitaxial contact denoted 344-1, 344-2 and 344-3, multiple instances of the top epitaxial contact denoted 346-1, 346-2 and 346-3, multiple instances of the common epitaxial contact denoted 348-1, 348-2 and 348-3, and multiple instances of the gate contacts denoted 350-1, 350-2, 350-3, 352-1, 352-2 and 352-3 formed over respective nanosheet stack active regions 301-1, 301-2 and 301-3. The corresponding circuit diagrams similarly show multiple instances of the ReRAM cells denoted 354-1, 354-2 and 354-3, multiple instances of the BE denoted 2744-1, 2744-2 and 2744-3, multiple instances of the TE denoted 2746-1, 2746-2 and 2746-3, multiple instances of the CE denoted 2748-1, 2748-2 and 2748-3, and multiple instance of the gates denoted 2750-1, 2750-2, 2750-3, 2752-1, 2752-2 and 2752-3. While FIG. 28 shows a ReRAM array layout with three ReRAM cells 354-1, 354-2 and 354-3, a ReRAM array may include any desired number of ReRAM cells.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 29:
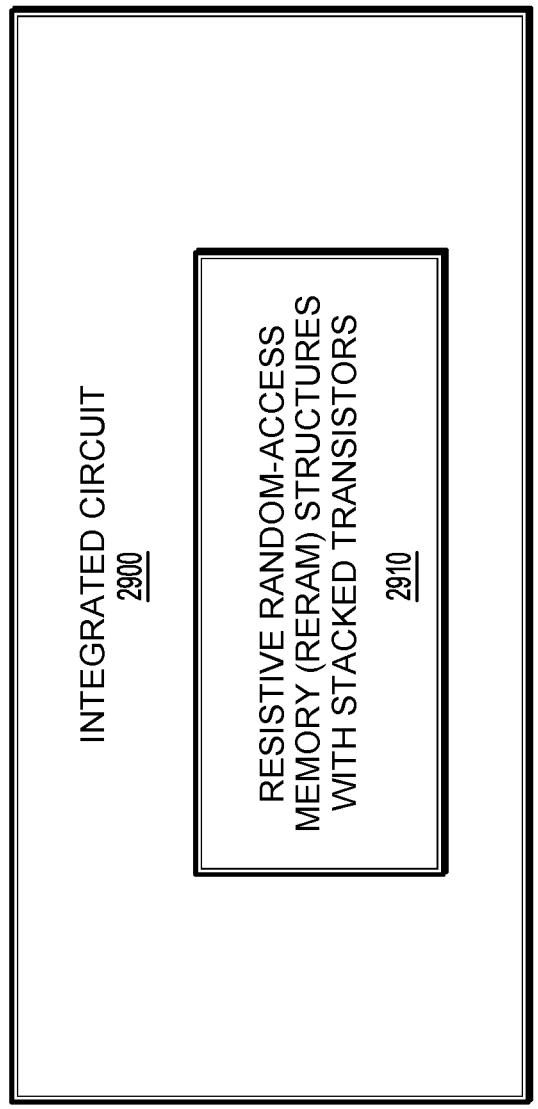
FIG. 29 depicts an integrated circuit comprising one or more resistive random-access memory structures with stack transistors, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 29 shows an example integrated circuit 2900 which includes one or more ReRAM structures 2910 with stacked transistors.

In some embodiments, a semiconductor structure comprises a first transistor, a second transistor vertically stacked over the first transistor, a source/drain region shared between the first transistor and the second transistor, and a RRAM device connected to the shared source/drain region.

The first transistor and the second transistor may comprise nanosheet FETs. First nanosheet channel layers of the first transistor may have a first width and second nanosheet channel layers of the second transistor may have a second width, the second width being narrower than the first width.

The first transistor may have a first threshold voltage and the second transistor may have a second threshold voltage, the second threshold voltage being different than the first threshold voltage. The second threshold voltage may be less than the first threshold voltage.

The first transistor may be used for a forming event of the RRAM device. The second transistor may be used for set and reset operations of the RRAM device.

The shared source/drain region may comprise a common epitaxial layer in contact with the RRAM device. The common epitaxial layer may be disposed on a first side of a nanosheet stack providing a first set of nanosheet channel layers for the first transistor and a second set of nanosheet channel layers for the second transistor. The semiconductor structure may further comprise a bottom epitaxial layer and a top epitaxial layer separated by an interlayer dielectric disposed on a second side of the nanosheet stack.

The first transistor may comprise a first source/drain region and the second transistor may comprise a second source/drain region, the second source/drain region of the second transistor being isolated from the first source/drain region of the first transistor.

In some embodiments, a memory device comprises an array of RRAM devices. At least one of the RRAM devices is disposed over a shared source/drain region of a stacked transistor structure comprising a first transistor and a second transistor vertically stacked over the first transistor. The first and second transistors have different threshold voltages.

A first threshold voltage of the first transistor may be greater than a second threshold voltage of the second transistor.

The first transistor and the second transistor may comprise nanosheet FETs.

The first transistor may be used for a forming event of the RRAM device and the second transistor may be used for set and reset operations of the RRAM device.

The first transistor may comprise a first source/drain region and the second transistor may comprise a second source/drain region, the second source/drain region of the second transistor being isolated from the first source/drain region of the first transistor.

In some embodiments, an integrated circuit comprises a RRAM structure comprising a first transistor, a second transistor vertically stacked over the first transistor, and a RRAM device connected to a shared source/drain region of the first and second transistors.

A first threshold voltage of the first transistor may be greater than a second threshold voltage of the second transistor.

The first transistor and the second transistor may comprise nanosheet FETs.

The first transistor may be used for a forming event of the RRAM device and the second transistor may be used for set and reset operations of the RRAM device.

The first transistor may comprise a first source/drain region and the second transistor may comprise a second source/drain region, the second source/drain region being isolated from the first source/drain region of the first transistor.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first transistor;
a second transistor vertically stacked over the first transistor;
a source/drain region shared between the first transistor and the second transistor; and
a resistive random-access memory device connected to the shared source/drain region.

2. The semiconductor structure of claim 1, wherein the first transistor and the second transistor comprise nanosheet field-effect transistors.

3. The semiconductor structure of claim 2, wherein first nanosheet channel layers of the first transistor have a first width and second nanosheet channel layers of the second transistor have a second width, the second width being narrower than the first width.

4. The semiconductor structure of claim 1, wherein the first transistor has a first threshold voltage and the second transistor has a second threshold voltage, the second threshold voltage being different than the first threshold voltage.

5. The semiconductor structure of claim 4, wherein the second threshold voltage is less than the first threshold voltage.

6. The semiconductor structure of claim 1, wherein the first transistor is used for a forming event of the resistive random-access memory device.

7. The semiconductor structure of claim 1, wherein the second transistor is used for set and reset operations of the resistive random-access memory device.

8. The semiconductor structure of claim 1, wherein the shared source/drain region comprises a common epitaxial layer in contact with the resistive random-access memory device.

9. The semiconductor structure of claim 8, wherein the common epitaxial layer is disposed on a first side of a nanosheet stack providing a first set of nanosheet channel layers for the first transistor and a second set of nanosheet channel layers for the second transistor, and further comprising a bottom epitaxial layer and a top epitaxial layer separated by an interlayer dielectric disposed on a second side of the nanosheet stack.

10. The semiconductor structure of claim 1, wherein the first transistor comprises a first source/drain region and the second transistor comprises a second source/drain region, the second source/drain region of the second transistor being isolated from the first source/drain region of the first transistor.

11. A memory device comprising:
an array of resistive random-access memory devices;
at least one of the resistive random-access memory devices being disposed over a shared source/drain region of a stacked transistor structure comprising a first transistor and a second transistor vertically stacked over the first transistor;
wherein the first and second transistors have different threshold voltages.

12. The memory device of claim 11, wherein a first threshold voltage of the first transistor is greater than a second threshold voltage of the second transistor.

13. The memory device of claim 11, wherein the first transistor and the second transistor comprise nanosheet field-effect transistors.

14. The memory device of claim 11, wherein the first transistor is used for a forming event of said at least one of the resistive random-access memory devices and the second transistor is used for set and reset operations of the resistive random-access memory device.

15. The memory device of claim 11, wherein the first transistor comprises a first source/drain region and the second transistor comprises a second source/drain region, the second source/drain region of the second transistor being isolated from the first source/drain region of the first transistor.

16. An integrated circuit comprising:
a resistive random-access memory structure comprising:
a first transistor;
a second transistor vertically stacked over the first transistor;
a resistive random-access memory device connected to a shared source/drain region of the first and second transistors.

17. The integrated circuit of claim 16, wherein a first threshold voltage of the first transistor is greater than a second threshold voltage of the second transistor.

18. The integrated circuit of claim 16, wherein the first transistor and the second transistor comprise nanosheet field-effect transistors.

19. The integrated circuit of claim 16, wherein the first transistor is used for a forming event of the resistive random-access memory device and the second transistor is used for set and reset operations of the resistive random-access memory device.

20. The integrated circuit of claim 16, wherein the first transistor comprises a first source/drain region and the second transistor comprises a second source/drain region, the second source/drain region of the second transistor being isolated from the first source/drain region of the first transistor.

* * * * *